(12) United States Patent
Mizohata et al.

(10) Patent No.: US 7,169,269 B2
(45) Date of Patent: Jan. 30, 2007

(54) PLATING APPARATUS, PLATING CUP AND CATHODE RING

(75) Inventors: Yasuhiro Mizohata, Kyoto (JP); Hideaki Matsubara, Kyoto (JP); Masahiro Miyagi, Kyoto (JP); Ryuichi Hayama, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 174 days.

(21) Appl. No.: 10/405,016

(22) Filed: Mar. 31, 2003

(65) Prior Publication Data

US 2004/0140199 A1    Jul. 22, 2004

(30) Foreign Application Priority Data

Jan. 21, 2003   (JP)   ............. 2003-012681

(51) Int. Cl.
C25D 5/02 (2006.01)
C25D 17/02 (2006.01)
C25D 17/04 (2006.01)
C25D 7/12 (2006.01)

(52) U.S. Cl. ............ 204/199; 204/242; 204/297.14; 204/297.01

(58) Field of Classification Search ............ 204/199, 204/242
See application file for complete search history.

(56) References Cited

U.S. PATENT DOCUMENTS

| | | | |
|---|---|---|---|
| 4,132,605 A | | 1/1979 | Tench et al. |
| 4,692,346 A | | 9/1987 | McBride et al. |
| 5,227,041 A | * | 7/1993 | Brogden et al. ........ 204/297.05 |
| 5,447,615 A | * | 9/1995 | Ishida ........................ 204/224 R |
| 6,080,291 A | * | 6/2000 | Woodruff et al. ........ 204/297.01 |
| 6,254,760 B1 | | 7/2001 | Shen et al. |
| 6,261,433 B1 | | 7/2001 | Landau ........................... 205/96 |
| 6,267,853 B1 | * | 7/2001 | Dordi et al. ................. 204/232 |
| 6,334,937 B1 | * | 1/2002 | Batz et al. .................... 204/212 |

(Continued)

FOREIGN PATENT DOCUMENTS

CN     1341166 A     3/2002

(Continued)

Primary Examiner—Harry D Wilkins, III
(74) Attorney, Agent, or Firm—Ostrolenk, Faber, Gerb & Soffen, LLP

(57) ABSTRACT

A plating apparatus (10) provided with: a plating vessel (61a to 61d) having a cylindrical side wall (361) for containing a plating liquid; a substrate holding mechanism (74a to 74d) for generally horizontally holding a generally round substrate (W) to be treated; a cathode ring (80) provided in the substrate holding mechanism and having substantially the same inner diameter as the plating vessel for sealing a peripheral edge portion of a lower surface of the substrate, the cathode ring having a cathode (83) to be brought into contact with the substrate held by the substrate holding mechanism; and a rotative driving mechanism (45) for rotating the substrate held by the substrate holding mechanism together with the cathode ring; wherein the plating vessel has an upper edge portion complementary in configuration to a portion of the cathode ring opposed to the plating vessel so that the lower surface of the substrate held by the substrate holding mechanism can approach the plating vessel so as to be substantially flush with the upper edge of the plating vessel without interference between the upper edge portion of the plating vessel and the cathode ring.

24 Claims, 28 Drawing Sheets

U.S. PATENT DOCUMENTS

| | | |
|---|---|---|
| 6,398,926 B1 * | 6/2002 | Mahneke ................ 204/224 R |
| 6,551,488 B1 | 4/2003 | Hey et al. |
| 6,572,753 B2 | 6/2003 | Chalyt et al. |
| 6,612,915 B1 * | 9/2003 | Uzoh et al. ................. 205/206 |
| 2001/0000396 A1 * | 4/2001 | Dordi et al. ................ 204/212 |
| 2001/0024691 A1 | 9/2001 | Kimura et al. |
| 2002/0020627 A1 | 2/2002 | Kunisawa et al. |
| 2002/0027080 A1 | 3/2002 | Yoshioka et al. |
| 2003/0217916 A1 * | 11/2003 | Woodruff et al. ........ 204/275.1 |
| 2004/0055890 A1 * | 3/2004 | Mizohata .................... 205/96 |
| 2004/0069646 A1 | 4/2004 | Kunisawa et al. |
| 2004/0074777 A1 * | 4/2004 | Lubomirsky et al. ....... 205/220 |
| 2004/0118676 A1 * | 6/2004 | Mizohata et al. .......... 204/193 |
| 2004/0140199 A1 * | 7/2004 | Mizohata et al. .......... 204/212 |
| 2005/0082163 A1 | 4/2005 | Yoshioka et al. |
| 2005/0092614 A1 * | 5/2005 | Gallina ................... 204/288.3 |

FOREIGN PATENT DOCUMENTS

| | | |
|---|---|---|
| JP | 62-273444 | 11/1987 |
| JP | 3-247799 | 11/1991 |
| JP | 5-195296 | 8/1993 |
| JP | 5-214594 | 8/1993 |
| JP | 6-10194 | 1/1994 |
| JP | 6-136592 | 5/1994 |
| JP | 6-173092 | 6/1994 |
| JP | 6-248498 | 9/1994 |
| JP | 8-20417 | 3/1996 |
| JP | 10-123026 | 5/1998 |
| JP | 2001-73200 | 3/2001 |
| JP | 2001-264290 | 9/2001 |
| JP | 2002-22622 | 1/2002 |
| JP | 2002-80992 | 3/2002 |
| JP | 2002-513861 | 5/2002 |
| JP | 2002-350395 | 12/2002 |
| JP | 2003-528214 | 9/2003 |
| KR | 2001-0090469 | 10/2001 |

* cited by examiner

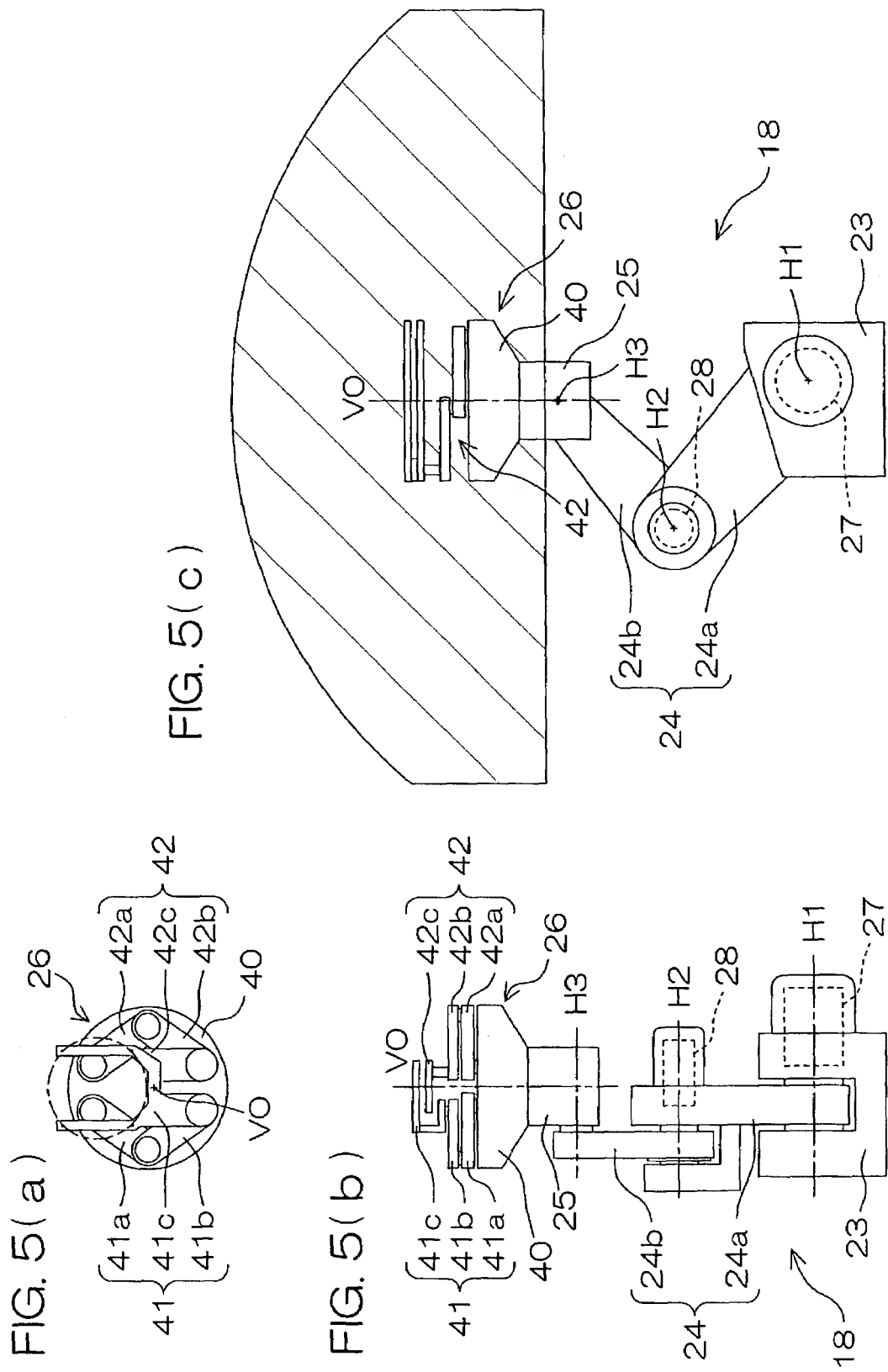

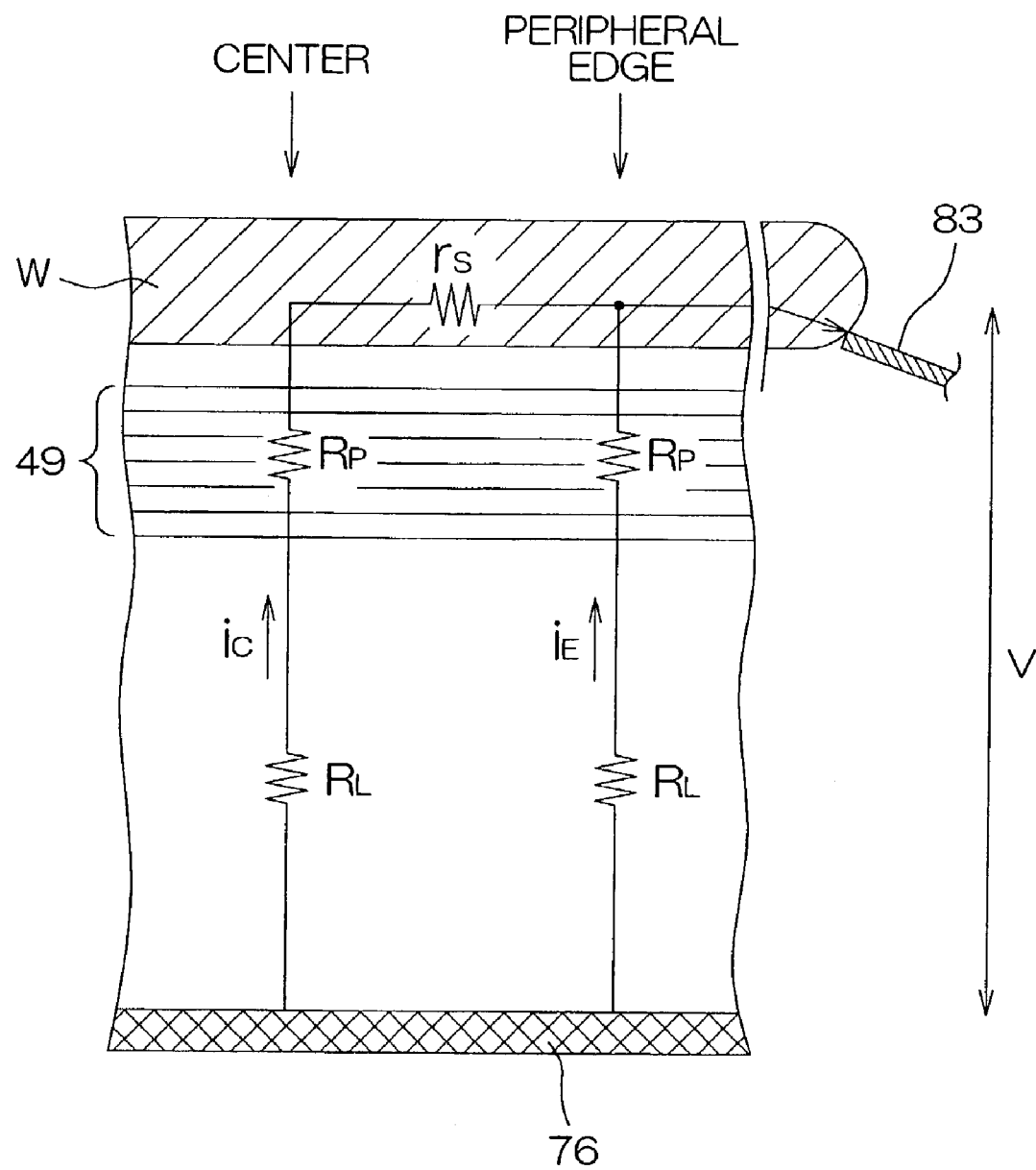

PLATING APPARATUS, PLATING CUP AND CATHODE RING

BACKGROUND OF THE INVENTION

1. Field of the Invention

The present invention relates to a plating apparatus for plating a substrate such as a semiconductor wafer with copper.

2. Description of Related Art

In the production of a semiconductor device, a plating process is often performed for plating one surface of a semiconductor wafer (hereinafter referred to simply as "wafer"). Plating apparatuses for the plating of the wafer are required to perform complicated process steps and to provide a high-quality metal film (for example, having a highly uniform thickness) by the plating. Since the semiconductor wafer is formed with fine holes and grooves, it is necessary to fill the fine holes and grooves with copper by the plating.

An exemplary plating apparatus for the copper plating of the semiconductor wafer is disclosed in U.S. Pat. No. 6,261,433 B1.

However, none of the conventional plating apparatuses are satisfactory in the quality of a film formed by the plating, operability, productivity and the like.

SUMMARY OF THE INVENTION

It is an object of the present invention to provide a plating apparatus which is capable of properly performing a plating process.

It is another object of the present invention to provide a plating apparatus which features easier operation.

It is further another object of the present invention to provide a plating apparatus which features higher productivity.

It is still another object of the present invention to provide a plating cup which ensures that a plating process can properly be performed.

It is further another object of the present invention to provide a cathode ring which ensures that a plating process can properly be performed.

A plating apparatus (10) according to the present invention comprises: a plating vessel (61a to 61d) having a cylindrical side wall (361) for containing a plating liquid; a substrate holding mechanism (74a to 74d) for generally horizontally holding a generally round substrate (W) to be treated; a cathode ring (80) provided in the substrate holding mechanism and having substantially the same inner diameter as the plating vessel for sealing a peripheral edge portion of a lower surface of the substrate, the cathode ring having a cathode (83) to be brought into contact with the substrate held by the substrate holding mechanism; and a rotative driving mechanism (45) for rotating the substrate held by the substrate holding mechanism together with the cathode ring; wherein the plating vessel has an upper edge portion complementary in configuration to a portion of the cathode ring opposed to the plating vessel so that the lower surface of the substrate held by the substrate holding mechanism can approach the plating vessel so as to be substantially flush with an upper edge of the plating vessel without interference between the upper edge portion of the plating vessel and the cathode ring. The components represented by the parenthesized alphanumeric characters are equivalent to those to be described in the following embodiment. However, it should be understood that the present invention be not limited to the embodiment. This definition is also applied to the following description.

With this arrangement, the plating liquid is contained in the plating vessel, and the lower surface of the to-be-treated substrate can be brought into contact with the plating liquid with the substrate being generally horizontally held by the substrate holding mechanism. The substrate may have a diameter greater than the inner diameter of the cathode ring. In this case, the peripheral edge portion of the lower surface of the substrate can be sealed by the cathode ring. Since the inner diameter of the cathode ring is virtually equal to the inner diameter of the plating vessel, a surface area of the substrate exposed from the cathode ring has a round shape having a diameter virtually equal to the inner diameter of the plating vessel, and the exposed surface area of the substrate is brought into contact with the plating liquid in a plating process.

With the lower surface of the substrate kept in contact with the plating liquid, an electrolytic plating process can be performed on the lower surface of the substrate by electrically energizing the substrate via the cathode. At this time, the substrate can be moved relative to the plating liquid by rotating the substrate by means of the rotative driving mechanism, whereby the uniformity of the plating is improved.

The plating liquid may be supplied into the plating vessel, for example, via a pipe connected to the bottom of the plating vessel. In this case, the plating process can be performed, while the plating liquid is continuously supplied into the plating vessel to overflow from the upper edge of the plating vessel. Thus, the surface of the plating liquid is kept raised slightly from the edge of the plating vessel (e.g., by about 2.5 mm). Since the upper edge portion of the plating vessel is complementary in configuration to the portion (lower portion) of the cathode ring opposed to the plating vessel, the substrate held by the substrate holding mechanism can be brought into contact with the plating liquid raised from the edge of the plating vessel without interference between the upper edge portion of the plating vessel and the cathode ring.

Further, the lower surface of the substrate held by the substrate holding mechanism can be brought into substantially flush relation with the upper edge of the plating vessel, so that a distance between the lower surface of the substrate and the upper edge of the plating vessel can be reduced (e.g., to 0.3 mm to 1.0 mm) in the plating process. In this case, the plating liquid continuously supplied into the plating vessel flows in the form of a laminar flow along the lower surface of the substrate to the peripheral edge of the substrate in the vicinity of the lower surface of the substrate, and then flows out of the plating vessel through a gap defined between the upper edge of the plating vessel and the lower surface of the substrate.

Even if air bubbles are trapped between the substrate and the plating liquid, the air bubbles flow together with the plating liquid out of the plating vessel. The laminar flow of the plating liquid flowing along the lower surface of the substrate to the peripheral edge of the substrate and the absence of the air bubbles on the lower surface of the substrate make it possible to form a uniform film by the plating. That is, this plating apparatus can advantageously perform the plating process.

The inventive plating apparatus may further comprise a first adjustment mechanism (230, 231, 233, 235, 238A, 238B) for generally aligning the center axis of the plating vessel with the rotation axis of the cathode ring.

With this arrangement, the center axis of the plating vessel can virtually be aligned with the rotation axis of the cathode ring by the first adjustment mechanism. Where the rotation axis and center axis of the cathode ring coincide with each other, the interference between the plating vessel and the cathode ring can be prevented even if the cathode ring is slightly spaced from the upper edge of the plating vessel. This state is maintained even when the substrate is rotated by the rotative driving mechanism.

In the inventive plating apparatus, the upper edge of the plating vessel is present within substantially the same plane. The apparatus may further comprise a second adjustment mechanism (238A, 238B) for positioning the upper edge of the plating vessel within a generally horizontal plane.

With this arrangement, the upper edge of the plating vessel can be positioned within the generally horizontal plane by the second adjustment mechanism. Therefore, the substrate generally horizontally held by the substrate holding mechanism can be spaced a substantially constant distance from the upper edge of the plating vessel in adjacent relation. Thus, the substrate can circumferentially be spaced a sufficiently small distance from the upper edge of the plating vessel in non-contact adjacent relation.

With the upper edge of the plating vessel positioned within the generally horizontal plane, the plating liquid continuously supplied into the plating vessel from the pipe connected to the bottom of the plating vessel overflows circumferentially uniformly from the upper edge of the plating vessel. Thus, the exposed area of the lower surface of the substrate can entirely be brought into contact with the plating liquid.

The inventive plating apparatus may further comprise a retracting mechanism (222a, 44a) having a pivot shaft (223) generally horizontally disposed at a lower height than the bottom of the plating vessel and coupled to the substrate holding mechanism, the retracting mechanism (222a, 44a) being capable of pivoting the substrate holding mechanism about the pivot shaft to move the substrate holding mechanism between an upper position above the plating vessel and a retracted position apart from the upper position.

With this arrangement, the substrate holding mechanism can be located at the upper position above the plating vessel in the plating process, and retracted from the upper position to the retracted position in maintenance of the apparatus by the retracting mechanism.

The inventive plating apparatus may further comprise a cathode cleaning liquid supplying mechanism (81) for supplying a cathode cleaning liquid to the cathode of the cathode ring for cleaning the cathode in the plating process.

The cathode is generally prevented from contacting the plating liquid when the peripheral edge portion of the substrate kept in contact with the cathode is sealed by the cathode ring. Where the sealing by the cathode ring is insufficient, however, the plating liquid is likely to reach the cathode. Further, even if the sealing by the cathode ring is proper, the plating liquid remaining on the exposed surface of the substrate is likely to be sucked into the gap between the substrate and the cathode ring to contact the cathode when the cathode ring is disengaged from the substrate after the completion of the plating process.

With the aforesaid arrangement, the cathode leaning liquid can be supplied to the cathode by the cathode cleaning liquid supplying mechanism to rinse away the plating liquid adhering on the cathode. Thus, the cathode can be kept clean to properly electrically energize the substrate for the electrolytic plating.

Another plating apparatus (10) according to the present invention comprises: a plating vessel (61a to 61d) for containing a plating liquid for performing a plating process on a substrate (W) to be treated; a substrate holding mechanism (74a to 74d) to be disposed above the plating vessel for generally horizontally holding the substrate to bring the substrate into contact with the plating liquid contained in the plating vessel; and a retracting mechanism (222a, 44a) having a pivot shaft (223) generally horizontally disposed at a lower height than the bottom of the plating vessel and coupled to the substrate holding mechanism, the retracting mechanism being capable of pivoting the substrate holding mechanism about the pivot shaft to move the substrate holding mechanism between an upper position above the plating vessel and a retracted position apart from the upper position.

According to the present invention, the substrate held by the substrate holding mechanism can be brought into contact with the plating liquid contained in the plating vessel for the plating thereof. Further, the substrate holding mechanism can be located at the upper position above the plating vessel in the plating process, and retracted from the upper position to the retracted position in maintenance of the apparatus by the retracting mechanism.

In the inventive plating apparatus, the plating vessel may have a cylindrical side wall (361), and the substrate holding mechanism may include a cathode ring (80) having substantially the same inner diameter as the plating vessel for sealing a peripheral edge portion of a lower surface of the to-be-treated substrate, the cathode ring being rotatable about a rotation axis thereof, the cathode ring including a cathode (83) to be brought into contact with the substrate held by the substrate holding mechanism. The plating apparatus may further comprise a first adjustment mechanism (230, 231, 233, 235, 238A, 238B) for aligning the center axis of the plating vessel with the rotation axis of the cathode ring.

With this arrangement, the peripheral edge portion of the lower surface of the substrate held by the substrate holding mechanism is covered with the cathode ring, and an inward round area of the lower surface of the substrate is exposed from the cathode ring. With the exposed area of the lower surface of the substrate kept in contact with the plating liquid contained in the plating vessel, the substrate is electrically energized by the cathode of the cathode ring for electrolytic plating.

Where the rotation axis and center axis of the cathode ring coincide with each other, the plating vessel and the cathode ring can be kept in circumferentially adjacent relation without interference therebetween by aligning the center axis of the plating vessel with the rotation axis of the cathode ring by the first adjustment mechanism.

In the inventive plating apparatus, the plating vessel has an upper edge present within substantially the same plane. The apparatus may further comprise a second adjustment mechanism (238A, 238B) for positioning the upper edge of the plating vessel within a generally horizontal plane.

With this arrangement, the upper edge of the plating vessel can be positioned within the generally horizontal plane by the second adjustment mechanism. Therefore, the substrate generally horizontally held by the substrate holding mechanism can be brought into non-contact adjacent relation to the upper edge of the plating vessel, whereby the surface area of the substrate exposed from the cathode ring can be brought into contact with the plating liquid contained (filled) in the plating vessel.

In the inventive plating apparatus, the plating vessel may have a cylindrical side wall (361), and the substrate holding mechanism may include a cathode ring (80) having substantially the same inner diameter as the plating vessel for sealing a peripheral edge portion of a lower surface of the to-be-treated substrate, the cathode ring being rotatable about a rotation axis thereof, the cathode ring including a cathode (83) to be brought into contact with the to-be-treated substrate. The apparatus may further comprise a cathode cleaning liquid supplying mechanism (81) for supplying a cathode cleaning liquid to the cathode for cleaning the cathode in the plating process.

With this arrangement, the electrolytic plating process can be performed on the substrate by electrically energizing the substrate by the cathode. The cathode ring generally prevents the cathode from contacting the plating liquid in the plating process. However, if the plating liquid happens to reach the cathode for some reason, the cathode can be cleaned by the cathode cleaning liquid supplying mechanism. Thus, the cathode can be kept clean, and properly brought into contact with the substrate for the electrolytic plating.

Further another plating apparatus (10) according to the present invention comprises: a plating vessel (61a to 61d) for containing a plating liquid; an anode (76) disposed in the plating vessel; a mesh member (49) of a resin disposed at a higher height than the anode in the plating vessel; and a substrate holding mechanism (74a to 74d) for holding a to-be-treated substrate (W) so as to locate the substrate at a plating position in contact with the plating liquid filled in the plating vessel, wherein a distance between the substrate located at the plating position and the mesh member is 0.5 mm to 30 mm.

According to the present invention, an electrolytic plating process can be performed on the substrate kept in contact with the plating liquid by electrically energizing the plating liquid through the anode. At this time, the mesh member is present between the anode and the substrate. Since the mesh member is composed of the resin, the electrical resistance of the plating liquid in a region between the anode and the substrate in the plating vessel is increased due to the presence of the mesh member.

The plating apparatus may further comprise a cathode to be brought into contact with a peripheral edge portion of the substrate. In an electrical conduction path extending from the anode through the plating liquid to the cathode kept in contact with the peripheral edge portion of the substrate, a path passing through the center of the substrate has substantially the same electrical resistance as a path passing through the peripheral edge portion of the substrate but not through the center of the substrate. This is because the electrical resistance of the plating liquid contained in the plating vessel is increased by the mesh member and, hence, the electrical resistance between the center of the substrate and the peripheral edge portion of the substrate (cathode) is much smaller than the electrical resistance of the path extending from the anode to the substrate.

A film growth rate in the plating process is virtually proportional to the amperage of the electric current flowing across the interface between the substrate and the plating liquid. Where the path passing through the center of the substrate has substantially the same electrical resistance as the path passing through the peripheral edge portion of the substrate but not through the center of the substrate as described above, the electric current generally uniformly flows between the plating liquid and the substrate at different points on the substrate. Thus, the film growth rate in the plating process is generally uniform over the substrate. Therefore, the film formed by the plating has a generally uniform thickness.

The mesh member preferably covers almost the entire plating vessel as viewed in plan. Thus, the plating liquid in the plating vessel has a uniform electrical resistance as measured vertically at different points within a horizontal plane.

Where the plating liquid is supplied into the plating vessel through a pipe connected to the bottom of the plating vessel, the plating liquid flows upward from a lower side in the plating vessel. At this time, contaminants in the plating liquid can be removed by the mesh member. The plating liquid flowing upward from the lower side is rectified into a generally uniform upward flow by the mesh member.

The plating apparatus may further comprise a rotative driving mechanism for rotating the substrate held by the substrate holding mechanism. Since the substrate located at the plating position and the mesh member are spaced only 0.5 mm to 30 mm from each other in adjacent relation, the plating liquid is drawn by the substrate in a limited region when the substrate is rotated in contact with the plating liquid. This suppresses the eddy flow of the plating liquid which is unwanted for the plating. Thus, the film formed by the plating has a uniform thickness.

The distance between the substrate located at the plating position and the mesh member is preferably 0.5 mm to 20 mm.

The mesh member may include a plurality of mesh embers which are vertically stacked one on another. The stacked mesh members have an increased total thickness as measured vertically. This enhances the effect of increasing the electrical resistance between the anode and the substrate, the effect of removing the contaminants and the effect of rectifying the plating liquid. The plating liquid flows in the form of a laminar flow along the lower surface of the substrate to the peripheral edge of the substrate in the vicinity of the lower surface of the substrate.

A plating cup (56a to 56d) according to the present invention comprises: a plating vessel (61a to 61d) for containing a plating liquid; a shower head (75) for diffusively introducing the plating liquid into the plating vessel from a plating liquid introduction port (54) provided in the bottom of the plating vessel; a mesh anode (76) disposed at a higher height than the shower head in the plating vessel; and a mesh member (49) of a resin disposed at a higher height than the anode in the plating vessel.

According to the present invention, the plating liquid can diffusively be introduced in various directions (at various angles) into the plating vessel by the shower head. Since the plating liquid is introduced into the plating vessel from the plating liquid introduction port provided in the bottom of the plating vessel, the plating liquid flows upward from a lower side in the form of an upward flow in the plating vessel. Since the anode is of a mesh shaped, the plating liquid can pass upwardly through the anode.

The plating liquid flows further upward to pass upwardly through the mesh member disposed at a height higher than the anode. At this time, the plating liquid is rectified into a uniform upward flow.

With the use of the plating cup, a plating process can be performed on a to-be-treated substrate, while the plating liquid is introduced from the plating liquid introduction port to overflow from the upper edge of the plating vessel with the substrate kept in contact with the surface of the plating liquid. Since the plating liquid is supplied in the form of a uniform upward flow to the surface of the substrate, the substrate can uniformly be plated.

Contaminants in the plating liquid can be removed by the mesh member. Thanks to the aforesaid effects, the plating process can advantageously be performed with the use of the plating cup.

In the inventive plating cup, the mesh member may include a plurality of mesh members which are stacked one on another.

The stacked mesh members have an increased total thickness as measured vertically. This enhances the plating liquid rectifying effect and the contaminant removing effect.

Still another plating apparatus (10) according to the present invention comprises: a cathode (83) to be brought into contact with a substrate (W) to be treated; and a cathode cleaning liquid supplying mechanism (81) for supplying a cathode cleaning liquid to the cathode for cleaning the cathode.

According to the present invention, an electrolytic plating process can be performed on the substrate by electrically energizing the substrate by the cathode. If the cathode is contaminated with the plating liquid, the cathode can be cleaned by the cathode cleaning liquid supplying mechanism. Thus, the cathode can be kept clean, so that the electrolytic plating process can be performed with the cathode properly kept in contact with the substrate.

The inventive plating apparatus may further comprise a conductivity meter (212) disposed downstream of the cathode in a flow channel of the cathode cleaning liquid supplied by the cathode cleaning liquid supplying mechanism for measuring the electrical conductivity of the cathode cleaning liquid.

With this arrangement, the electrical conductivity of the cathode cleaning liquid flowing in the vicinity of the cathode can be measured by the conductivity meter, which is disposed downstream of the cathode in the cathode cleaning liquid flow channel.

The plating apparatus may generally be constructed so as not to permit the plating liquid to intrude into the cathode cleaning liquid flow channel. The plating process can be performed by supplying the cathode cleaning liquid to the cathode while measuring the electrical conductivity of the cathode cleaning liquid flowing in the vicinity of the cathode by means of the conductivity meter. The cathode cleaning liquid and the plating liquid differ in electrical conductivity. Therefore, if the plating liquid is mixed in the cathode cleaning liquid, the electrical conductivity of the cathode cleaning liquid measured by the conductivity meter is changed. This makes it possible to detect the intrusion of the plating liquid into the cathode cleaning liquid flow channel, thereby avoiding such an event that the plating process is continuously performed with the cathode left contaminated with the plating liquid.

The cathode cleaning liquid may be, for example, deionized water. In this case, the electrical conductivity measured by the conductivity meter is drastically increased by even a very small amount of the plating liquid mixed in the cathode cleaning liquid.

The inventive plating apparatus may further comprise a cathode cleaning liquid collection vessel (210) for collecting the cathode cleaning liquid supplied by the cathode cleaning liquid supplying mechanism.

With this arrangement, the cathode cleaning liquid can be collected separately from the plating liquid used in the plating vessel by providing the cathode cleaning liquid collection vessel dedicated to the collection of the cathode cleaning liquid.

Further another plating apparatus (10) according to the present invention is adapted to perform a plating process on a to-be-treated substrate (W) with the use of a plating liquid, and comprises: a liquid supplying mechanism (81) for supplying liquid to a restriction region (80f) where intrusion of the plating liquid is prevented in the plating apparatus, the restriction region having a liquid inlet and a liquid outlet; and a conductivity meter (212) for measuring the electrical conductivity of the liquid flowing out of the outlet of the restriction region.

The plating liquid may usually be prevented from intruding into the restriction region. According to the present invention, if the plating liquid happens to intrude into the restriction region for some reason, the plating liquid flows together with the liquid supplied by the liquid supplying mechanism to reach the conductivity meter. Where the liquid supplied by the liquid supplying mechanism and the plating liquid differ in electrical conductivity, the intrusion of the plating liquid into the restriction region where the intrusion of the plating liquid is usually prevented can be detected on the basis of the electrical conductivity measured by the conductivity meter.

The restriction region may be the inside of a through-hole or a planar region having a surface on which the liquid flows.

In the inventive plating apparatus, the liquid supplying mechanism maybe capable of supplying the liquid in the plating process.

With this arrangement, the intrusion of the plating liquid into the restriction region can be detected in the plating process. If the plating process cannot properly be performed when the plating liquid intrudes into the restriction region, the plating process can be interrupted.

The inventive plating apparatus may further comprise a liquid collection vessel (210) for collecting the liquid supplied by the liquid supplying mechanism.

With this arrangement, the liquid can be collected separately from the plating liquid by providing the liquid collection vessel dedicated to the collection of the liquid supplied by the liquid supplying mechanism.

Still another plating apparatus (10) according to the present invention comprises: a plating vessel (61a to 61d) for containing a plating liquid for performing a plating process on a substrate (W) to be treated; a cathode (83) to be brought into contact with the substrate in the plating process; a recovery vessel (62a to 62d) disposed around the plating vessel for recovering the plating liquid overflowing from the plating vessel; and a cathode cleaning liquid collection vessel (210) disposed around the recovery vessel for collecting a cathode cleaning liquid for cleaning the cathode.

According to the present invention, the plating process can be performed, while the plating liquid is supplied into the plating vessel to overflow from the plating vessel into the recovery vessel with the to-be-treated substrate kept in contact with the surface of the plating liquid filled in the plating vessel. In this case, the plating liquid is raised from the upper edge of the plating vessel, so that the to-be-treated substrate can easily be brought into contact with the surface of the plating liquid. An electrolytic plating process can be performed by electrically energizing the substrate with the substrate kept in contact with the cathode.

The cathode cleaning liquid used for the cleaning of the cathode can be collected separately from the plating liquid used in the plating vessel by the cathode cleaning liquid collection vessel provided separately from the recovery vessel. Thus, the cathode cleaning liquid can be prevented from being mixed in the plating liquid, so that the plating liquid is suitable for reuse. In this case, the plating process can be performed on the substrate, for example, while the plating liquid is circulated through the plating vessel and the recovery vessel.

The inventive plating apparatus may further comprise a conductivity meter (212) disposed downstream of the cathode in a flow channel of the cathode cleaning liquid used for the cleaning of the cathode for measuring the electrical conductivity of the cathode cleaning liquid.

With this arrangement, the electrical conductivity of the cathode cleaning liquid flowing in the vicinity of the cathode can be measured by the conductivity meter, which is disposed downstream of the cathode in the cathode cleaning liquid flow channel.

The plating apparatus may generally be constructed so as not to permit the plating liquid to intrude into the cathode cleaning liquid flow channel. Since the cathode is disposed in the cathode cleaning liquid flow channel, the plating liquid is usually kept out of contact with the cathode.

The plating process can be performed by supplying the cathode cleaning liquid to the cathode while measuring the electrical conductivity of the cathode cleaning liquid flowing in the vicinity of the cathode by means of the conductivity meter. The cathode cleaning liquid and the plating liquid differ in electrical conductivity. Therefore, if the plating liquid is mixed in the cathode cleaning liquid, the electrical conductivity of the cathode cleaning liquid measured by the conductivity meter is changed. This makes it possible to detect the intrusion of the plating liquid into the cathode cleaning liquid flow channel, thereby avoiding such an event that the plating process is continuously performed with the cathode left contaminated with the plating liquid.

The inventive plating apparatus may further comprise a cathode cleaning liquid supplying mechanism (81) for supplying the cathode cleaning liquid to the cathode for the cleaning of the cathode.

With this arrangement, the cathode cleaning liquid can automatically be supplied to the cathode by the cathode cleaning liquid supplying mechanism. This facilitates the operation of the plating apparatus.

Further another plating apparatus according to the present invention comprises: an anode (76) for electrically energizing a plating liquid; a cathode (83) for electrically energizing a substrate (W) to be treated; and a plating power source (82) for applying a voltage between the anode and the cathode; wherein an electrical conduction path between the anode and the plating power source and an electrical conduction path between the cathode and the plating power source are isolated from the ground.

According to the present invention, an electrolytic plating process can be performed on the to-be-treated substrate by applying the voltage between the anode and the cathode by the plating power source with the anode and the cathode kept in contact with the plating liquid and the substrate, respectively, and with the substrate kept in contact with the plating liquid. Thus, a target metal contained in the form of cations (e.g., copper ions) in the plating liquid can be deposited on the substrate.

Since the electrical conduction path between the anode and the plating power source and the electrical conduction path between the cathode and the plating power source are not connected to the ground, an electric current is prevented from flowing through unintended portions in the plating apparatus, and a noise is prevented from interfering with electric currents flowing between the anode and the plating power source and between the cathode and the plating power source.

The inventive plating apparatus may further comprise: a substrate holding mechanism (74a to 74d) for holding the to-be-treated substrate (W), the substrate holding mechanism including a rotary shaft (77); a rotative driving mechanism (45) for rotating the substrate held by the substrate holding mechanism about the rotary shaft; and an electrical conduction line (198) provided in the rotary shaft and rotatable together with the rotary shaft by a rotation force of the rotative driving mechanism, the electrical conduction line being electrically connected to the cathode and electrically isolated from the rotary shaft; wherein the cathode is provided in the substrate holding mechanism and adapted to be brought into contact with the substrate held by the substrate holding mechanism.

With this arrangement, the substrate can be moved relative to the plating liquid by rotating the substrate by the rotative driving mechanism while keeping the substrate held by the substrate holding mechanism in contact with the plating liquid. Thus, the substrate can uniformly be plated.

The rotary shaft may be composed of an electrically conductive material such as a metal. Since the electrical conduction line is electrically isolated from the rotary shaft, an electric current flowing through the electrical conduction line does not flow through the rotary shaft and other electrically conductive members contacting the rotary shaft even if the rotary shaft is electrically conductive. Further, no noise interferes with the electric current flowing through the electrical conduction line via the rotary shaft. Therefore, a predetermined amperage of electric current is allowed to flow through the to-be-treated substrate via the cathode.

The inventive plating apparatus may further comprise: a cathode ring (80) provided with the cathode and adapted to be brought into contact with a peripheral edge portion of the to-be-treated substrate; a spin base (78) which supports the cathode ring; and an insulative member (78i) provided between the cathode ring and the spin base.

With this arrangement, the electrical conduction path between the cathode and the plating power source can be isolated from the spin base by the insulative member even if the spin base is composed of an electrically conductive member such as a metal. Therefore, the electric current flowing through the electrical conduction path between the cathode and the plating power source does not flow through the spin base and other electrically conductive members contacting the spin base. Further, no noise interferes with the electric current flowing through the electrical conduction line between the cathode and the plating power source via the spin base. Therefore, a predetermined amperage of electric current is allowed to flow through the to-be-treated substrate via the cathode.

The inventive plating apparatus may further comprise a rotary connector (197) for electrically connecting the cathode and the plating power source via a liquid metal.

With this arrangement, the electrical connection between the plating power source on the side of a stationary system and the cathode can be maintained by the rotary connector, even if the cathode is rotated together with the substrate holding mechanism.

The liquid metal may be, for example, mercury (Hg).

Still another plating apparatus (10) according to the present invention comprises: a substrate holding mechanism (74a to 74d) for holding a substrate (W) to be treated; a cathode (83) to be brought into contact with the substrate held by the substrate holding mechanism; a first rotary shaft (77) having a first electrical conduction line (198) electrically connected to the cathode, and coupled to the substrate holding mechanism; a rotative driving mechanism (45) for rotating the substrate held by the substrate holding mechanism about the first rotary shaft; a second rotary shaft (194) having a second electrical conduction line (194); a rotation force transmission mechanism (193, 195, 196) for transmitting a rotative driving force between the first rotary shaft and the second rotary shaft and establishing an electrical conduction path between the first and second electrical conduction lines; and a rotary connector (197) attached to one end of the second rotary shaft and electrically connected to the second electrical conduction line.

According to the present invention, an electrical conduction path is established as extending from the rotary connector to the cathode through the second electrical conduction line, the rotation force transmission mechanism and the first electrical conduction line. Thus, an electrical conduction path can be established between the plating power source connected to the rotary connector on the side of a stationary system and the cathode.

The rotation speed of the second rotary shaft can be reduced as compared with the rotation speed of the first rotary shaft by the rotation force transmission mechanism. Thus, the rotary connector can be rotated at a lower rotation speed for reduction of a load exerted on the rotary connector, whereby the service life of the rotary connector can be extended. The rotative driving mechanism may be coupled to the first rotary shaft or to the second rotary shaft.

The rotary connector may be of a slidable type (e.g., a slip ring), but is preferably of a non-slidable type. Where the rotary connector is of a non-slidable type, a noise is less likely to interfere with an electric current flowing between the plating power source connected to the rotary connector on the side of the stationary system and the cathode.

The rotation force transmission mechanism may comprise: a first pulley attached to the first rotary shaft and at least partly electrically conductive; a second pulley attached to the second rotary shaft and at least partly electrically conductive; and a belt stretched between the first and second pulleys and at least partly electrically conductive.

Further another plating apparatus (10) according to the present invention comprises: a treatment fluid supplying member (203, 81*b*) having a fluid channel (81*c*) formed therein for supplying a treatment fluid to a substrate (W) to be treated; and a rotary joint (191) being disposed in the treatment fluid supplying member, and including a rotor (244), a stator (243) and a sliding portion defined between the rotor and the stator, the rotary joint having a main channel (270) to constitute a part of the fluid channel and a leak channel (271) branched from the main channel, the sliding portion being disposed in the leak channel.

According to the present invention, the treatment fluid can be supplied to the to-be-treated substrate from a treatment fluid supply source located on the side of a stationary system via the rotary joint even if the to-be-treated substrate is rotated together with a part of the treatment fluid supplying member. Since the main channel of the rotary joint constitutes a part of the fluid channel, the treatment fluid flows through the main channel.

At this time, the internal pressure of the leak channel is reduced as compared with the internal pressure of the main channel, whereby a part of the treatment fluid flowing through the main channel flows into the leak channel. Since the sliding portion is disposed in the leak channel, particles generated around the sliding portion are expelled out of the rotary joint via the leak channel. Thus, the particles generated around the sliding portion are prevented from being supplied to the to-be-treated substrate.

The inventive plating apparatus may further comprise a substrate holding mechanism (74*a* to 74*d*) having a support shaft (81*b*) to be disposed generally vertically for holding the to-be-treated substrate, wherein the fluid channel is provided in the support shaft and the rotary joint is attached to one end of the support shaft.

With this arrangement, the to-be-treated substrate held by the substrate holding mechanism can be rotated by rotating the substrate holding mechanism about the support shaft disposed generally vertically. At this time, the treatment fluid can be supplied from the treatment liquid supply source located on the side of the stationary system to the fluid channel provided in the support shaft via the rotary joint attached to the one end (upper end) of the support shaft.

A cathode ring (80) according to the present invention has a cathode (83) to be brought into contact with a peripheral edge portion of a substrate (W) to be treated, and comprises: a first electrically conductive member (80*c*) provided in the cathode ring for electrically connecting to a plating power source (82); a second electrically conductive member (80*d*) provided in the cathode ring and electrically connected to the cathode; and a third electrically conductive member (80*e*) provided between the first electrically conductive member and the second electrically conductive member, the third electrically conductive member being resilient and kept in resilient contact with the first and second electrically conductive members for electrical connection between the first electrically conductive member and the second electrically conductive member.

According to the present invention, the electrical connection between the first electrically conductive member and the second electrically conductive member can be maintained by keeping the third electrically conductive member in resilient contact with the first and second electrically conductive members, even if the cathode ring is warped. Thus, an electric current is allowed to flow between the plating power source and the cathode. Therefore, the plating process can properly be performed on the substrate with the use of the cathode ring.

The third electrically conductive member may be, for example, a coil spring.

Another cathode ring (80) according to the present invention comprises: a ring-shaped support member (80*b*, 80*u*); a cathode (83) provided in the support member and adapted to be brought into contact with a peripheral edge portion of a substrate (W) to be treated; an electrically conductive member (80*d*, 80*e*, 80*c*) provided in the support member and establishing an electrical conduction path between the cathode and a plating power source (82); and a seal member (80*r*) provided between the support member and the electrically conductive member for providing a seal between the support member and the electrically conductive member for prevention of intrusion of a plating liquid into the support member.

According to the present invention, the electrical conduction path is established as extending from the plating power source to the cathode through the electrically conductive member. Thus, an electrolytic plating process can be performed on the substrate by electrically energizing the substrate in contact with the cathode by the plating power source.

Further, the seal member prevents the intrusion of the plating liquid into the support member to keep the inside of the support member clean.

Further another cathode ring (80) according to the present invention comprises: a cathode (83) to be brought into contact with a peripheral edge portion of a substrate (W) to be treated; and a positioning member (78*j*, 79*j*) for fixing the cathode ring in a predetermined position with respect to a spin base (78) which is adapted to rotate while supporting the cathode ring.

According to the present invention, the cathode ring can easily be fixed in the predetermined position with respect to the spin base by the positioning member. The predetermined position herein means a position at which the center axis of the cathode ring generally coincides with the rotation axis of the spin base. Thus, the cathode ring can properly be rotated together with the spin base.

Still another cathode ring (80) according to the present invention comprises: a cathode (83) to be brought into contact with a peripheral edge portion of a substrate (W) to be treated; and an abutment portion (80*a*) for holding the substrate in abutment against the substrate, the abutment portion being composed of a rigid material and having a sealing surface (80*s*) for sealing the peripheral edge portion of the substrate.

According to the present invention, an area of the substrate to be brought into contact with a plating liquid can be limited by sealing the peripheral edge portion of the substrate by the sealing surface.

Since the abutment portion is composed of the rigid material, the size of the abutment portion and its periphery can be reduced. That is, where the abutment portion is not composed of the rigid material, an abutment portion supporting member should be provided separately from the abutment portion as extending from a side opposite from the substrate, so that the size of the abutment portion and its periphery is increased thereby to reduce the area of the substrate to be brought into contact with the plating liquid. Further, when the substrate abutting against the abutment portion is kept in contact with the plating liquid which is filled in a plating vessel and overflows from the edge of the plating vessel, the plating liquid is liable to be stagnated by the abutment portion supporting member, leading to a problem of deterioration in the uniformity of the plating.

According to the present invention, there is no need to provide the abutment portion supporting member separately from the abutment portion, making it possible to overcome the aforesaid problem.

Examples of the rigid material include rigid vinyl chloride resins, rigid fluororesins and polyimide resins. The sealing surface is preferably a polished surface. Thus, the sealing surface can be brought into more intimate contact with the to-be-treated surface of the substrate.

Still another plating apparatus (10) according to the present invention is adapted to perform a plating process on a to-be-treated surface of a generally round semiconductor wafer (W) having a plurality of fine holes or grooves formed in the surface thereof and a barrier layer and a seed layer sequentially provided on the surface as covering the holes or grooves, and comprises: a cassette stage (16) for receiving thereon a cassette (C) capable of accommodating the semiconductor wafer to be treated, the cassette stage including a cassette guide (51) for limiting a cassette loading position on the cassette stage and a cassette detection sensor (52) for detecting the presence or absence of the cassette at a predetermined position on the cassette stage; a plurality of plating units (20*a* to 20*d*) each including a cathode ring (80) having a cathode (83) to be brought into contact with the semiconductor wafer and rotatable together with the semiconductor wafer kept in contact with the cathode, and a plating vessel (61*a* to 61*d*) capable of containing a plating liquid and having an anode (76) disposed therein; a plurality of cleaning units (22*a*, 22*b*) each including a cup (101) having a drain port (105*a*) and adapted to clean the semiconductor wafer therein, a wafer holding member (102) for holding the semiconductor wafer in the cup, a wafer rotating mechanism (103) for rotating the semiconductor wafer held by the wafer holding member, and a cleaning liquid supply nozzle (102*d*, 107) for supplying a cleaning liquid including a post-treatment agent to the surface of the semiconductor wafer held by the wafer holding member, the cup being connected to an air exhaustion mechanism for exhausting air from the cup; a wafer transport mechanism (TR) for transporting the semiconductor wafer subjected to the plating process in any of the plating units to any of the cleaning units, the wafer transport mechanism including an extendible arm (41, 42) capable of generally horizontally holding the semiconductor wafer, a vertical movement mechanism (24) for moving up and down the arm, and a horizontal rotating mechanism (25) for rotating the semiconductor wafer held by the arm within a generally horizontal plane; a post-treatment agent supplying section (4) including a post-treatment agent tank (290) which contains the post-treatment agent to be used in the cleaning units, a tank enclosure (291) which houses therein the post-treatment agent tank, and a vat (292) for receiving therein the post-treatment agent which leaks out of the post-treatment agent tank, the tank enclosure being connected to an air outlet pipe (297) for exhausting air from the tank enclosure; a minor constituent analyzing section (3) including an analyzing cup (336) for containing the plating liquid for analyzing a specific minor constituent of the plating liquid to be used in the plating units, and a rotary platinum electrode (308) disposed in the analyzing cup; an enclosure (30) which houses therein a wafer treating section (12) including the plating units, the cleaning units and the wafer transport mechanism, the enclosure including a barrier wall for isolating the inside thereof from an external environment, a frame (37) which supports the wafer treating section, and a filter (31) provided in an upper portion thereof, the enclosure having a loading/unloading port (Wh) for loading and unloading the semiconductor wafer or the cassette capable of accommodating the semiconductor wafer, a deionized water pipe introduction port (32*h*) through which a deionized water pipe (32) is introduced into the enclosure, a compressed air pipe introduction port (33*h*) through which a compressed air pipe (33) is introduced into the enclosure, an air outlet opening provided in the bottom of the enclosure for exhausting air from the enclosure, and an air outlet pipe connection port (34*h*, 35*h*) connected to an air outlet pipe (34, 35) for exhausting air from the enclosure, the enclosure being constructed so that air introduced into the enclosure through the filter is exhausted from the enclosure through the air outlet opening and the air outlet pipe connected to the air outlet pipe connection port; and a system controller (155) for controlling the entire plating apparatus, the system controller including a plurality of printed circuit boards (155P), a central processing unit (155C), a storage device (155M) having a semiconductor storage medium and a magnetic storage medium and storing therein a plating apparatus control program at least partly described in a high-level language, a serial port (280, 281), a keyboard (157) having alphabet inputting keys and numeral inputting keys, and a display (156).

According to the present invention, the plating process and the cleaning process can be performed by the plating units and the cleaning units, respectively, in the single plating apparatus.

The cassette placed on the cassette stage can accommodate an untreated semiconductor wafer (hereinafter referred to simply as "wafer") as well as a wafer subjected to the plating process and the cleaning process.

The cassette can easily be placed in the predetermined position on the cassette stage by the cassette guide. Thus, the arm of the wafer transport mechanism can access the cassette placed on the cassette stage on the basis of cassette position information preliminarily stored in the storage device of the system controller for loading/unloading of the wafer. Since the presence or absence of the cassette on the cassette stage can be detected by the cassette detection sensor, it is possible to avoid such an event that the arm of the wafer transport mechanism accesses the cassette stage on the assumption that the cassette is placed on the cassette stage on which actually no cassette is placed.

In the plating unit, the wafer kept in contact with he cathode is brought into contact with the plating liquid contained in the plating cup, and the cathode and the anode are electrically energized, whereby a metal film (e.g., a copper film) can be formed on the wafer by electrolytic plating.

In the cleaning unit, contaminants adhering on the surface of the wafer can be removed, for example, by the post-treatment agent for cleaning the wafer. At this time, the wafer can uniformly be cleaned by supplying the cleaning liquid toward the wafer from the cleaning liquid supply nozzle while rotating the wafer held by the wafer holding member by means of the wafer rotating mechanism. Mist of the cleaning liquid and the like generated during the cleaning of the wafer can be expelled out of the plating apparatus by the air exhaustion mechanism connected to the cup.

The cleaning liquid may include deionized water besides the post-treatment agent. In this case, the cleaning liquid supply nozzle may include a post-treatment agent supply nozzle and a deionized water supply nozzle.

The wafer transport mechanism is capable of transporting the wafer from the plating unit to the cleaning unit, so that the plating process and the cleaning process can successively be performed on the wafer. The wafer transport mechanism may be capable of transporting the wafer between the cassette placed on the cassette stage and the plating unit or the cleaning unit. In this case, the untreated wafer can be transported from the cassette, for example, to the plating unit and to the cleaning unit in sequence by the wafer transport mechanism so as to be automatically subjected to the plating process and the cleaning process in sequence and then accommodated again in the cassette under the control of the system controller.

When only a small amount of the post-treatment agent remains in the post-treatment agent tank in the post-treatment agent supplying section, the post-treatment agent tank may be replaced with another post-treatment agent tank containing a sufficient amount of the post-treatment agent. Since the post-treatment agent tank is housed in the tank enclosure, the post-treatment agent is unlikely to be scattered out of the tank enclosure even if the post-treatment agent is splashed during the replacement of the post-treatment agent tank. Further, the air outlet pipe is connected to the tank enclosure, so that vapor or mist of the post-treatment agent generated in the tank enclosure can be expelled out of the plating apparatus.

The volume of the vat is preferably equal to or greater than the volume of the post-treatment agent tank (where a plurality of post-treatment agent tanks are provided, the total volume of the plurality of post-treatment agent tanks). Even if the post-treatment agent entirely leaks out of the post-treatment tank, the post-treatment agent can be received in the vat.

In the minor constituent analyzing section, a CVS (cyclic voltammetric stripping) analysis or a CPVS (cyclic pulse voltammetric stripping) analysis can be performed on the plating liquid contained in the analyzing cup with the use of the rotary platinum electrode. Where the plating liquid contains a plating accelerating additive (hereinafter referred to simply as "accelerator") and a plating retarding additive (hereinafter referred to simply as "retarder") as minor constituents thereof, the accelerator and the retarder can quantitatively be analyzed through the CVS analysis or the CPVS analysis.

Where the concentration of the accelerator or the retarder is lower than a lower limit of a predetermined concentration range as the result of the analysis, a replenishment liquid containing the accelerator or the retarder is added in a proper amount to the plating liquid so as to adjust the concentration of the accelerator or the retarder in the predetermined concentration range. Thus, the plating process can properly be performed on the wafer with the use of the plating liquid having a properly adjusted accelerator or retarder concentration.

Since the wafer treating section is housed in the enclosure, the plating process, the cleaning process and a like process can be performed in a clean atmosphere isolated from the external environment. By exhausting air from the enclosure through the air outlet pipe, the internal pressure of the enclosure can be reduced to a negative pressure, and external air from which contaminants are removed by the filter can be introduced into the enclosure.

The external air may be forced into the enclosure through the filter by fans and let out from the air outlet opening. Thus, down-flow of clean air occurs in the enclosure.

Deionized water can be supplied into the wafer treating section through the deionized water pipe introduced into the enclosure through the deionized water pipe introduction port provided in the enclosure. The deionized water may be used, for example, for the cleaning process in the cleaning units. Some of driving mechanisms employed in the plating units and the cleaning units may pneumatically be driven. Compressed air for driving these driving mechanisms can be supplied to the driving mechanisms through the compressed air pipe introduced into the enclosure through the compressed air pipe introduction port provided in the enclosure.

The operation of the plating apparatus can be controlled on the basis of the plating apparatus control program stored in the storage device of the system controller, for example, to automatically sequentially perform the plating process and the cleaning process on the untreated wafer. The display may be capable of displaying the status of the plating apparatus (wafer treating status). The keyboard may permit the operator to input wafer treating conditions and the like. Thus, the plating apparatus ensures easy operation and high productivity.

In the inventive plating apparatus, the plating vessel may have an upper edge portion complementary in configuration to a portion of the cathode ring opposed to the plating vessel, so that a lower surface of the to-be-treated semiconductor wafer kept in contact with the cathode can approach the plating vessel so as to be substantially flush with the upper edge of the plating vessel without interference between the upper edge portion of the plating vessel and the cathode ring.

With this arrangement, the wafer kept in contact with the cathode can be brought into contact with the plating liquid filled in the plating vessel and raised from the edge of the plating vessel without interference between the upper edge portion of the plating vessel and the cathode ring, because the upper edge portion of the plating vessel is complementary in configuration to the portion (lower portion) of the cathode ring opposed to the plating vessel.

Since the lower surface of the wafer kept in contact with the cathode can be brought into substantially flush relation with the upper edge of the plating vessel, a distance between the lower surface of the wafer and the upper edge of the plating vessel can be reduced (e.g., to 0.3 mm to 1.0 mm) in the plating process. In this case, the plating liquid continuously supplied into the plating vessel flows in the form of a laminar flow along the lower surface of the wafer to the peripheral edge of the wafer in the vicinity of the lower surface of the wafer, and then flows out of the plating vessel from a gap defined between the upper edge of the plating vessel and the lower surface of the wafer.

Even if air bubbles are trapped between the wafer and the plating liquid, the air bubbles flow together with the plating liquid out of the plating vessel. The laminar flow of the plating liquid flowing along the lower surface of the wafer to the peripheral edge of the wafer and the absence of the air bubbles on the lower surface of the wafer make it possible to uniformly form a film by the plating.

The inventive plating apparatus may further comprise: a wafer holding mechanism (74a to 74d) to be disposed above the plating vessel for holding the to-be-treated semiconductor wafer to bring the semiconductor wafer into contact with the plating liquid contained in the plating vessel; and a retracting mechanism (222a, 44a) having a pivot shaft (223) generally horizontally disposed at a lower height than the bottom of the plating vessel and coupled to the wafer holding mechanism, the retracting mechanism being capable of pivoting the wafer holding mechanism about the pivot shaft to move the wafer holding mechanism between an upper position above the plating vessel and a retracted position apart from the upper position.

With this arrangement, the wafer holding mechanism can be located at the upper position above the plating vessel in the plating process and retracted from the upper position to the retracted position in maintenance of the apparatus by the retracting mechanism.

The cathode ring may constitute a part of the wafer holding mechanism.

The inventive plating apparatus may further comprise: a mesh member (49) of a resin disposed at a higher height than the anode in the plating vessel; and a wafer holding mechanism (74a to 74d) for holding the to-be-treated semiconductor wafer to locate the semiconductor wafer at a plating position at which the semiconductor wafer is kept in contact with the plating liquid filled in the plating vessel; wherein a distance between the semiconductor wafer located at the plating position and the mesh member is 0.5 mm to 30 mm.

With this arrangement, the mesh member is present between the anode and the wafer held by the wafer holding mechanism in the plating process, so that the electrical resistance between the anode and the wafer is greater than the electrical resistance of the to-be-treated surface of the wafer. Thus, an electric current uniformly flows across an interface between the wafer and the plating liquid at different points on the wafer. Therefore, the film formed by the plating has a substantially uniform thickness.

Where the plating liquid can be introduced into the plating vessel through a pipe connected to the bottom of the plating vessel, the plating liquid flows upward from a lower side in the plating vessel. At this time, contaminants in the plating liquid can be removed by the mesh member. Further, the plating liquid flowing upward from the lower side of the plating vessel is rectified into a virtually uniform upward flow by the mesh member.

Since the wafer located at the plating position and the mesh member are spaced only 0.5 mm to 30 mm from each other in adjacent relation, the plating liquid is drawn by the wafer in a narrowly limited region when the wafer is rotated in contact with the plating liquid. This suppresses the eddy flow of the plating liquid which is unwanted for the plating. Thus, the film formed by the plating has a uniform thickness.

The inventive plating apparatus may further comprise: a shower head (75) for diffusively introducing the plating liquid into the plating vessel from a plating liquid introduction port (54) provided in the bottom of the plating vessel; and a mesh member (49) of a resin disposed at a higher height than the shower head in the plating vessel; wherein the anode has a mesh shape and is located at a height between the shower head and the mesh member.

With this arrangement, the plating liquid can diffusively be introduced in various directions (at various angles) into the plating vessel by the shower head. The plating liquid is introduced into the plating vessel from the plating liquid introduction port provided in the bottom of the plating vessel, so that the plating liquid flows upward from a lower side in the form of an upward flow in the plating vessel. Since the anode is of a mesh shape, the plating liquid can pass upwardly through the anode.

The plating liquid flows further upward to pass upwardly through the mesh member disposed at a higher height than the anode. At this time, the plating liquid is rectified into a uniform upward flow. Therefore, the uniformity of the film formed by the plating can be improved by keeping the wafer in contact with the rectified plating liquid in the plating process.

The inventive plating apparatus may further comprise a cathode cleaning liquid supplying mechanism (81) for supplying a cathode cleaning liquid to the cathode for cleaning the cathode in the plating process.

With this arrangement, the cathode cleaning liquid can be supplied to the cathode for the cleaning of the cathode, so that the plating process can be performed with the cathode kept clean.

The inventive plating apparatus may further comprise: a liquid supplying mechanism (81) for supplying liquid to a restriction region (80f) where intrusion of the plating liquid is prevented in the plating apparatus, the restriction region having a liquid inlet and a liquid outlet; and a conductivity meter (212) for measuring the electrical conductivity of the liquid flowing out of the outlet of the restriction region.

The plating liquid may usually be prevented from intruding into the restriction region. With this arrangement, if the plating liquid happens to intrude into the restriction region for some reason, the plating liquid flows together with the liquid supplied by the liquid supplying mechanism to reach the conductivity meter. Where the liquid supplied by the liquid supplying mechanism and the plating liquid differ in electrical conductivity, the intrusion of the plating liquid into the restriction region where the intrusion of the plating liquid is usually prevented can be detected on the basis of the electrical conductivity measured by the conductivity meter.

The restriction region may be a region of the cathode ring where the intrusion of the plating liquid is prevented. Alternatively, the restriction region may be the inside of a through-hole having an outlet and an inlet or a planar region having a surface on which the liquid flows.

The inventive plating apparatus may further comprise: a recovery vessel (62a to 62d) disposed around the plating vessel for recovering the plating liquid overflowing from the plating vessel; and a cathode cleaning liquid collection vessel (210) disposed around the recovery vessel for collecting the cathode cleaning liquid used for cleaning the cathode kept in contact with the to-be-treated semiconductor wafer in the plating process.

With this arrangement, the plating liquid and the cathode cleaning liquid can separately be collected by the recovery vessel and the cathode cleaning liquid collection vessel.

The inventive plating apparatus may further comprise a plating power source (82) for applying a voltage between the anode and the cathode, wherein an electrical conduction path between the anode and the plating power source and an electrical conduction path between the cathode and the plating power source are isolated from the ground.

With this arrangement, the electrical conduction path between the anode and the plating power source and the electrical conduction path between the cathode and the plating power source are not connected to the ground, whereby an electric current is prevented from flowing through unintended portions in the plating apparatus, and a noise is prevented from interfering with electric currents flowing between the anode and the plating power source and between the cathode and the plating power source.

In the inventive plating apparatus, the plating units may each further comprise: a wafer holding mechanism (74a to 74d) for holding the to-be-treated semiconductor wafer; a first rotary shaft (77) having a first electrical conduction line (198) electrically connected to the cathode, and coupled to the wafer holding mechanism; a rotative driving mechanism (45) for rotating the semiconductor wafer held by the wafer holding mechanism about the first rotary shaft; a second rotary shaft L(194) having a second electrical conduction line (194); a rotation force transmission mechanism (193, 195, 196) for transmitting a rotative driving force between the first rotary shaft and the second rotary shaft and establishing an electrical conduction path between the first and second electrical conduction lines; and a rotary connector (197) attached to one end of the second rotary shaft and electrically connected to the second electrical conduction line.

With this arrangement, an electrical conduction path is established as extending from the rotary connector to the cathode through the second electrical conduction line, the rotation force transmission mechanism and the first electrical conduction line. Thus, an electrical conduction path can be established between the plating power source connected to the rotary connector on the side of a stationary system and the cathode.

The rotation speed of the second rotary shaft can be reduced as compared with the rotation speed of the first rotary shaft by the rotation force transmission mechanism. Thus, the rotary connector can be rotated at a lower rotation speed for reduction of a load exerted on the rotary connector, whereby the service life of the rotary connector can be extended.

In the inventive plating apparatus, the plating units may each further comprise: a treatment fluid supplying member (203, 81b) having a fluid channel (81c) formed therein for supplying a treatment fluid to the to-be-treated wafer; and a rotary joint (191) being disposed in the treatment fluid supplying member, and including a rotor (244), a stator (243) and a sliding portion defined between the rotor and the stator, the rotary joint having a main channel (270) to constitute a part of the fluid channel and a leak channel (271) branched from the main channel, the sliding portion being disposed in the leak channel.

With this arrangement, the treatment fluid can be supplied to the to-be-treated wafer from a treatment fluid supply source located on the side of the stationary system via the rotary joint even if the to-be-treated wafer is rotated together with a part of the treatment fluid supplying member. Since the sliding portion is disposed in the leak channel, particles generated around the sliding portion can be expelled out of the rotary joint through the leak channel. Thus, the particles generated around the sliding portion are prevented from being supplied to the to-be-treated wafer.

In the inventive plating apparatus, the cathode ring may comprise: a first electrically conductive member (80c) provided in the cathode ring and electrically connected to a plating power source (82); a second electrically conductive member (80d) provided in the cathode ring and electrically connected to the cathode; and a third electrically conductive member (80e) provided between the first electrically conductive member and the second electrically conductive member, the third electrically conductive member being resilient and kept in resilient contact with the first and second electrically conductive members for electrical connection between the first electrically conductive member and the second electrically conductive member.

With this arrangement, the electrical connection between the first electrically conductive member and the second electrically conductive member can be maintained by keeping the third electrically conductive member in resilient contact with the first and second electrically conductive members, even if the cathode ring is warped. Thus, an electric current is allowed to flow between the plating power source and the cathode.

In the inventive plating apparatus, the cathode may be adapted to be brought into contact with a peripheral edge portion of the semiconductor wafer, and the cathode ring may comprise: a ring-shaped support member (80b, 80u) which supports the cathode; an electrically conductive member (80d, 80e, 80c) provided in the support member and establishing an electrical conduction path between the cathode and a plating power source (82); and a seal member (80r) provided between the support member and the electrically conductive member for providing a seal for prevention of intrusion of the plating liquid into the support member.

With this arrangement, the electrical conduction path is established as extending from the plating power source to the cathode through the electrically conductive member. Thus, the electrolytic plating process can be performed on the wafer by electrically energizing the wafer kept in contact with the cathode by the plating power source.

Further, the seal member prevents the intrusion of the plating liquid into the support member to keep the inside of the support member clean.

In the inventive plating apparatus, the plating units may each further comprise a spin base (78) which supports the cathode ring, and the cathode ring may further comprise a positioning member (78j, 79j) for fixing the cathode ring in a predetermined position with respect to the spin base.

With this arrangement, the cathode ring can easily be fixed in the predetermined position with respect to the spin base by the positioning member. The predetermined position herein means a position at which the center axis of the cathode ring generally coincides with the rotation axis of the spin base. Thus, the cathode ring can properly be rotated together with the spin base.

In the inventive plating apparatus, the cathode may be adapted to be brought into contact with the peripheral edge portion of the semiconductor wafer, and the cathode ring may further comprise an abutment portion (80a) for holding the semiconductor wafer in abutment against the semiconductor wafer, the abutment portion being composed of a rigid material and having a sealing surface (80s) for sealing the peripheral edge portion of the semiconductor wafer.

With this arrangement, an area of the wafer to be brought into contact with the plating liquid can be limited by sealing the peripheral edge portion of the wafer by the sealing surface.

Since the abutment portion is composed of the rigid material, the size of the abutment portion and its periphery can be reduced.

The foregoing and other objects, features and effects of the present invention will become more apparent from the following description of the preferred embodiments with reference to the attached drawings.

BRIEF DESCRIPTION OF THE DRAWINGS

FIG. 5(a) is a schematic plan view for explaining the construction of a robot body provided in the wafer treating section;

FIG. 5(b) is a schematic side view for explaining the construction of the robot body provided in the wafer treating section;

FIG. 5(c) is a schematic front view for explaining the construction of the robot body provided in the wafer treating section;

FIG. 15 is a schematic diagram illustrating an electrical equivalent circuit in a plating vessel;

DESCRIPTION OF THE PREFERRED EMBODIMENTS

Figure 1:
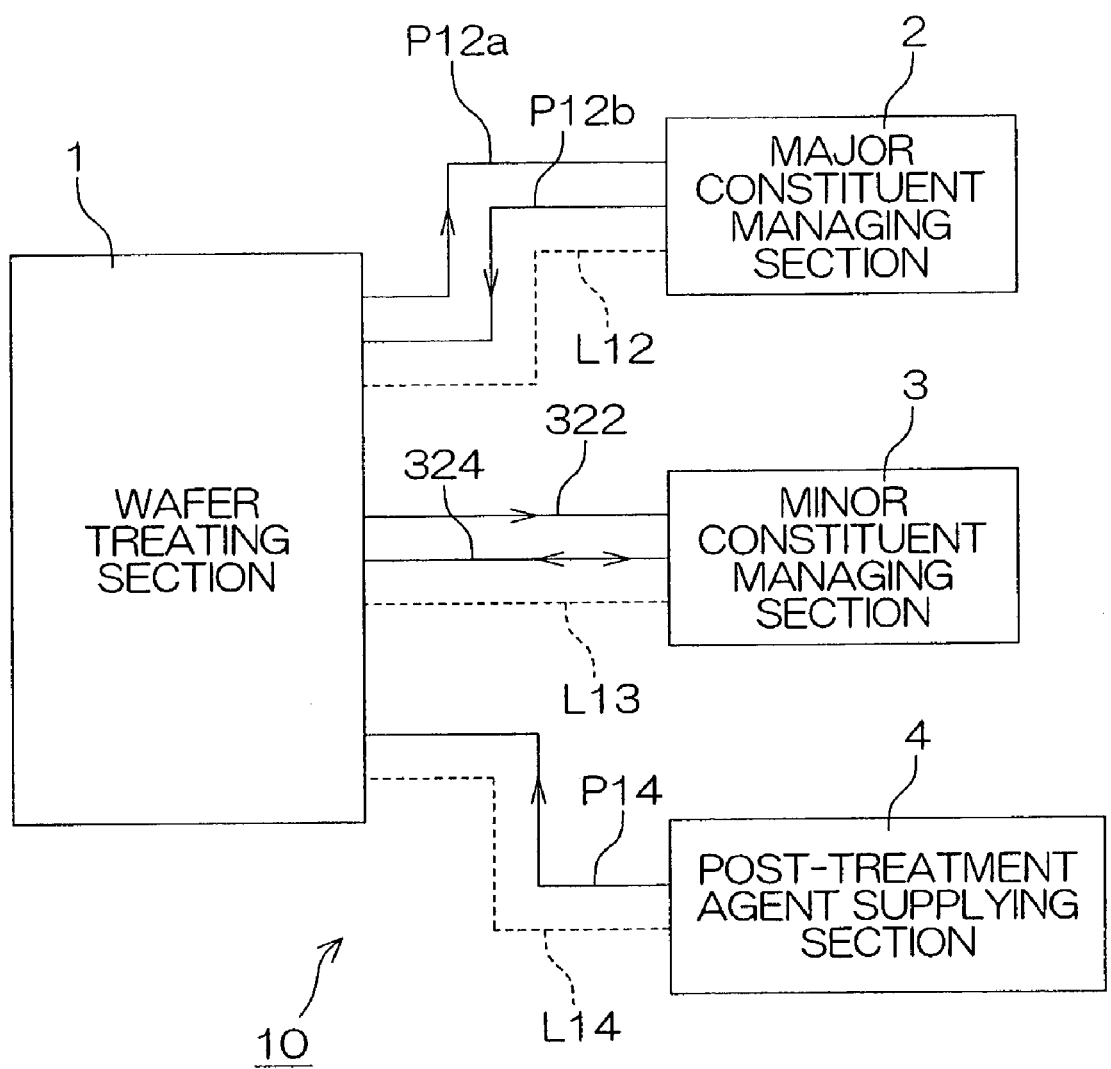
FIG. 1 is a block diagram illustrating the construction of a plating apparatus according to one embodiment of the present invention.

FIG. 1 is a block diagram illustrating the construction of a plating apparatus 10 according to one embodiment of the present invention.

The plating apparatus 10 includes a wafer treating section 1 for plating a surface of a semiconductor wafer (hereinafter referred to simply as "wafer") with the use of a plating liquid and etching (bevel-etching) a peripheral edge of the wafer after the plating, a major constituent managing section 2 having a copper supply source for supplying copper ions to the plating liquid for management of the concentrations of major constituents of the plating liquid, a minor constituent managing section 3 for managing minor constituents of the plating liquid, and a post-treatment agent supplying section 4 for supplying a post-treatment agent to the wafer treating section 1 for post-treatment of the wafer after the plating. The plating apparatus 10 is disposed in a clean room.

The plating liquid for use in the wafer treating section 1 contains sulfuric acid (supporting electrolyte), copper ions (target metal), iron (oxidizing/reducing agent) and water as major constituents thereof. The plating liquid further contains chlorine, a plating accelerating additive (brightener) and a plating retarding additive (suppresser) as minor constituents thereof.

Two plating liquid transport pipes P12a, P12b extend between the wafer treating section 1 and the major constituent managing section 2 for transporting the plating liquid between these sections in opposite directions. Similarly, a sampling pipe 322 and a replenishment pipe 324 extend between the wafer treating section 1 and the minor constituent managing section 3 for transporting the plating liquid between these sections in opposite directions. Further, a post-treatment agent pipe P14 extends between the wafer treating section 1 and the post-treatment agent supplying section 4 for supplying the post-treatment agent from the post-treatment agent supplying section 4 to the wafer treating section 1.

The wafer treating section 1 includes a system controller for controlling the entire plating apparatus 10. The wafer treating section 1 is connected to the major constituent managing section 2, the minor constituent managing section 3 and the post-treatment agent supplying section 4 via signal lines L12, L13 and L14, respectively. The operations of the major constituent managing section 2, the minor constituent managing section 3 and the post-treatment agent supplying section 4 are controlled by the system controller provided in the wafer treating section 1.

The plating liquid being used in the wafer treating section 1 is transported (sampled) into the minor constituent managing section 3 through the sampling pipe 322. The minor constituent managing section 3 has an analyzing cup in which at least one of the minor constituents of the plating liquid transported from the wafer treating section 1 can be analyzed through a CVS (cyclic voltammetric stripping) analysis.

The minor constituent managing section 3 includes a minor constituent management controller, which is capable of calculating the amounts of the minor constituents to be added to the plating liquid in the wafer treating section 1 so as to adjust the concentrations of the minor constituents of the plating liquid on the basis of the results of the CVS analysis. Under the control of the minor constituent management controller, the minor constituents are supplied in the amounts thus calculated to the plating liquid in the wafer treating section 1 through the replenishment pipe 324.

The post-treatment agent supplying section 4 includes an agent tank containing the post-treatment agent, and an agent supply mechanism for supplying the post-treatment agent from the agent tank to the wafer treating section 1. Examples of the post-treatment agent include an etching liquid to be used for the bevel etching and a cleaning liquid.

Figure 2:
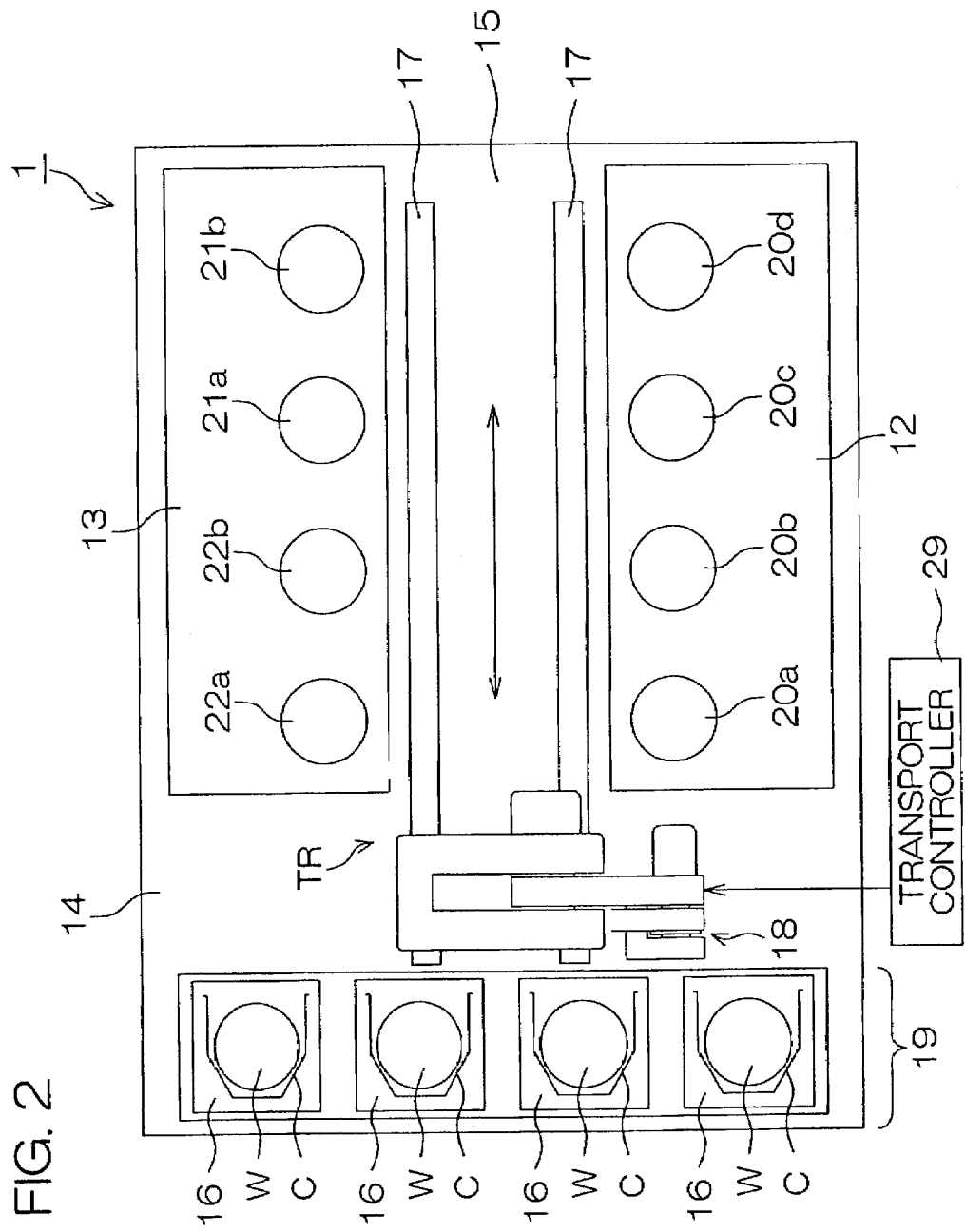
FIG. 2 is a schematic plan view of a wafer treating section.

FIG. 2 is a schematic plan view of the wafer treating section 1.

The wafer treating section 1 is adapted to perform a plating process for forming a thin copper film on the surface of the wafer W, then perform an etching process for etching the peripheral edge of the wafer W, and perform a cleaning process for cleaning the entire surfaces of the wafer W.

A wafer loading/unloading section 19 is disposed along a first transport path 14 extending linearly horizontally. In the wafer loading/unloading section 19, a plurality of cassette stages 16 (four cassette stages in this embodiment) which are each adapted to receive thereon one cassette C capable of accommodating a wafer W are arranged along the first transport path 14. The wafer W is of a generally round shape, and has a multiplicity of fine holes or grooves formed in the to-be-treated (to-be-plated) surface thereof and a barrier layer and a copper seed layer formed on the surface thereof.

A second linear transport path 15 is provided horizontally and perpendicularly to the first transport path 14. In this embodiment, the second transport path 15 extends from a middle portion of the first transport path 14. A plating section 12 including four plating units 20a to 20d arranged along the second transport path 15 is provided on one side of the second transport path 15. The plating units 20a to 20d are each adapted to plate the surface of the wafer W with copper.

A post-treatment section 13 including two bevel etching units 21a, 21b and two cleaning units (spin cleaning units) 22a, 22b arranged along the second transport path 15 is provided on the other side of the second transport path 15. The bevel etching units 21a, 21b are each adapted to etch the peripheral edge of the wafer W, while the cleaning units 22a, 22b are each adapted to clean opposite sides of the wafer W.

The first transport path 14 and the second transport path 15 constitute a T-shaped transport path, and a single transport robot TR is provided on the T-shaped transport path. The transport robot TR includes transport guide rails 17 disposed along the second transport path 15, and a robot body 18 movable along the transport guide rails 17. The operation of the transport robot TR is controlled by a transport controller 29.

The robot body 18 is capable of transporting the wafer W along the first transport path 14 and along the second transport path 15. Therefore, the robot body 18 can access any of the cassettes C placed on the cassette stages 16 to load and unload a wafer W, and access any of the plating units 20a to 20d, the bevel etching units 21a, 21b and the cleaning unit 22a, 22b to load and unload the wafer W.

A basic wafer transport route and a basic process sequence are as follows. First, an untreated wafer W is unloaded from one of the cassettes C, then transported to the front of one of the plating units 20a to 20d, and loaded into the plating unit 20a to 20d by the robot body 18 so as to be subjected to the plating process. In turn, the wafer W subjected to the plating process is unloaded from the plating unit 20a to 20d, and loaded into one of the bevel etching units 21a, 21b so as to be subjected to the bevel etching process.

Subsequently, the wafer W subjected to the bevel etching process is unloaded from the bevel etching unit 21a, 21b, then transported along the second transport path 15, and loaded into one of the cleaning units 22a, 22b by the robot body 18 so as to be subjected to the cleaning process.

Further, the wafer W subjected to the cleaning process is unloaded from the cleaning unit 22a, 22b and then transported along the second transport path 15 toward the first transport path 14 by the robot body 18. Upon reaching the first transport path 14, the robot body 18 starts moving along the first transport path 14 toward a cassette C placed on one of the cassette stages 16, and loads the wafer W on the cassette C.

Figure 3:
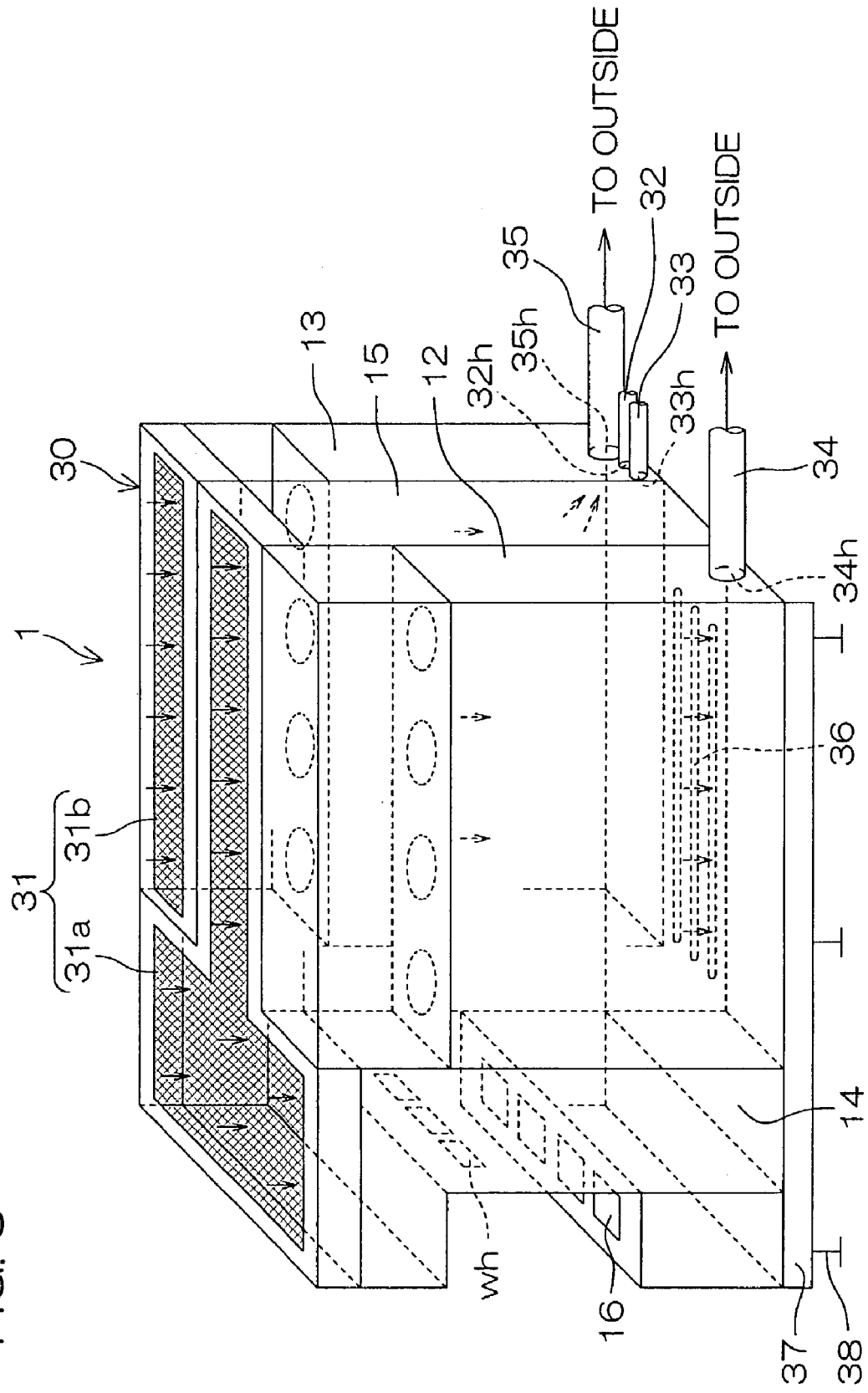
FIG. 3 is a schematic perspective view illustrating the construction of an enclosure of the wafer treating section.

FIG. 3 is a schematic perspective view illustrating the construction of an enclosure 30 of the wafer treating section 1.

The enclosure 30 has a generally rectangular box-like outer shape defined by a plurality of barrier walls (boundary walls) for isolating the inside thereof from the external environment. In the enclosure 30, partition walls are provided between the second transport path 15 and the plating section 12 and between the second transport path 15 and the post-treatment section 13. The space of the second transport path 15 is isolated from the space of the plating section 12 and from the space of the post-treatment section 13 by the partition walls, except when the wafer W is loaded and unloaded with respect to these sections.

A filter 31 for filtering off contaminants in air is provided in a top barrier wall of the enclosure 30. The filter 31 includes a first filter 31a disposed above the cassette stages 16, the first transport path 14 and the second transport path 15, and a second filter 31b disposed above the post-treatment section 13. Fans not shown are provided above the first filter 31a for forcibly introducing external air into the enclosure 30.

The cassette stage 16 is separated from the first transport path 14 by a barrier wall. This barrier wall has wafer loading/unloading ports Wh, through which the cassettes C placed on the cassette stages 16 are accessed from the first transport path 14 for the loading and unloading of the wafer W.

A plurality of slit-like openings 36 are provided in a portion of the enclosure 30 below the second transport path 15 as extending longitudinally of the second transport path 15. Since the space of the second transport path 15 is isolated by the enclosure 30 and the internal partitions, the space of the second transport path 15 is kept at a positive pressure when air is forcibly introduced into the enclosure 30 through the first filter 31a. Therefore, internal air is exhausted from the enclosure 30 through the openings 36. Thus, air flows from the upper side toward the lower side (the down-flow of air occurs) in the space of the second transport path 15.

Since no reagent is used in the space of the second transport path 15, the air flowing through this space is not contaminated. Therefore, the air flowing through the space of the second transport path 15 is exhausted through the openings 36 around the enclosure 30.

Air outlet ports 34h, 35h are respectively provided in a lower portion of a barrier wall defining the plating section 12 and a lower portion of a barrier wall defining the post-treatment section 13 on a side of the enclosure 36 opposite from the cassette stages 16. The air outlet port 34h is connected to one end of an air outlet duct 34, while the air outlet port 35h is connected to one end of an air outlet duct 35. The other ends of the air outlet ducts 34, 35 are connected to an in-plant exhauster system line. Thus, air possibly exposed to the plating liquid and the post-treatment agent in the plating section 12 and the post-treatment section 13 can forcibly be exhausted outside the clean room.

By forcibly exhausting the air from the post-treatment section 13 through the air outlet port 35h, the internal pressure of the post-treatment section 13 is kept at a negative pressure, so that external air is sucked into the post-treatment section 13 through the second filter 31b. Thus, air flows downward in the space of the post-treatment section 13.

A deionized water pipe introduction port 32h and a compressed air pipe introduction port 33h are provided in the vicinity of the air outlet port 35h in the barrier wall formed with the air outlet port 35h. A deionized water pipe 32 and a compressed air pipe 33 for supplying deionized water and compressed air for use in the wafer treating section 1 are introduced into the wafer treating section 1 through the deionized water pipe introduction port 32h and the compressed air introduction port 33h, respectively.

A frame 37 formed by combining iron structural parts is attached to a lower peripheral edge of the enclosure 30 to support the entire wafer treating section 1. A plurality of jack bolts 38 are attached to the frame 37 as properly spaced longitudinally of the structural parts of the frame 37. The frame 37 is supported by the jack bolts 38 so as to be spaced a predetermined distance from the floor of the clean room in which the wafer treating section 1 is disposed.

Figure 4:
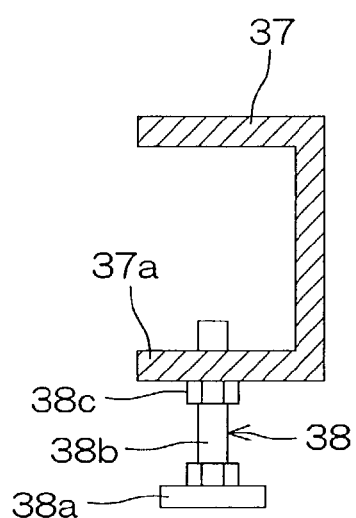
FIG. 4 is a schematic sectional view illustrating a jack bolt and a frame attached to the enclosure.

FIG. 4 is a schematic sectional view illustrating the jack bolt 38 and the frame 37.

The structural parts of the frame 37 each have a laterally open U-shaped cross section, and include two generally horizontal and parallel plate portions. A lower one of the plate portions serves as a support plate 37a which has an internal thread portion. The jack bolt 38 includes a bolt portion 38b having an external thread portion provided on its circumference, a generally round base disk 38a fixed generally perpendicularly to a lower end of the bolt portion 38b, and a lock nut 38c fitted around the bolt portion 38b.

The bolt portion 38b is engaged with the internal thread portion of the support plate 37a and extends generally vertically through the support plate 37a. The lock nut 38c is tightened toward the support plate 37a from the lower side of the support plate 37a. A distance between the base disk 38a and the support plate 37a, i.e., the height of the frame 37 from the floor of the clean room, is adjustable by variably positioning the support plate 37a with respect to the length of the bolt portion 38b.

For the adjustment of the height of the frame 37, the lock nut 38c is loosened (the lock nut 38c is rotated with respect to the bolt portion 38b so as to be moved apart from the support plate 37a), and then the base disk 38a is rotated in a proper direction. Thus, the bolt portion 38b is rotated together with the base disk 38a, so that the position of the support plate 37a with respect to the length of the bolt portion 38b is changed for the adjustment of the height of the frame 37 from the floor of the clean room. After the adjustment, the lock nut 38c is tightened toward the support plate 37a, whereby the bolt portion 38b is locked with respect to the support plate 37a.

The plurality of jack bolts 38 attached to the frame 37 have the same construction as shown in FIG. 4. Therefore, the leveling adjustment of the wafer treating section 1 can be achieved by attaching at least three jack bolts 38 to the frame 37 in a non-aligned manner and adjusting the positions of the support plates 37a with respect to the lengths of the bolt portions 38b.

FIGS. 5(a), 5(b) and 5(c) are a schematic plan view, a schematic side view and a schematic front view, respectively, for explaining the construction of the robot body 18.

The robot body 18 includes a base 23, a vertical articulated arm 24 attached to the base 23, a pivotal driving mechanism 25 attached to the vertical articulated arm 24, and a substrate holder 26 to be driven pivotally about a vertical pivot axis V0 by the pivotal driving mechanism 25 (only the substrate holder 26 is shown in FIG. 5(a)).

The substrate holder 26 includes a body 40 having a flat top, and a pair of retractable arms 41, 42 provided on the flat top of the body 40. A retractable driving mechanism (not shown) for horizontally advancing and retracting the pair of retractable arms 41, 42 is incorporated in the body 40.

The retractable arms 41 and 42 respectively include first arm portions 41a and 42a, second arm portions 41b and 42b, and substrate holder hands (effecters) 41c and 42c. The body 40 has a generally round shape as seen in plan, and the first arm portions 41a, 42a are attached to a peripheral edge portion of the body 40 pivotally about vertical pivot axes thereof. The first arm portions 41a, 42a are driven pivotally about the pivot axes by the retractable driving mechanism provided in the body 40.

The retractable arms 41, 42 each constitute a so-called scholar robot, which is operative so that the second arm portion 41b, 42b is pivoted about a vertical pivot axis thereof in synchronization with the pivoting of the first arm portion 41a, 42a. Thus, the first arm portion 41a, 42a and the second arm portion 41b, 42b of the retractable arm 41, 42 are stretched and unstretched so as to advance and retract the substrate holder hand 41c, 42c.

When the retractable arms 41, 42 are in an unstretched state, the substrate holder hands 41c, 42c are kept in vertically overlapped relation (FIG. 5(a)). Therefore, the substrate holder hand 41c of the retractable arm 41 has a bent shape for prevention of interference with the substrate holder hand 42c of the retractable arm 42 (FIG. 5(b)).

The vertical articulated arm 24 includes a first arm 24a and a second arm 24b. The first arm 24a is attached to the base 23 so that the first arm 24a is pivotal about a horizontal pivot axis H1 at one end thereof. The second arm 24b is attached to the other end of the first arm 24a pivotally about a horizontal pivot axis H2 at one end thereof. The pivotal driving mechanism 25 is attached to the other end of the second arm 24b pivotally about a horizontal pivot axis H3. The pivot axes H1, H2 and H3 are parallel to each other.

A motor 27 for pivoting the first arm 24a is provided in the base 23, and a motor 28 for pivotally driving the second arm 24b is provided in a coupling between the first arm 24a and the second arm 24b. The motor 28 is rotatable in synchronization with the motor 27. A driving force transmission mechanism (not shown) for transmitting a driving force from the motor 28 to the pivotal driving mechanism 25 is incorporated in the second arm 24b. Thus, the pivotal driving mechanism 25 can constantly hold the substrate holder 26 in the same attitude (e.g., in such an attitude as to hold the wafer W horizontally), even if the first arm 24a and the second arm 24b are pivoted.

A motor (not shown) is incorporated in the pivotal driving mechanism 25. The pivotal driving mechanism 25 receives a driving force from this motor to pivotally drive the substrate holder 26 about the vertical pivot axis V0.

With this arrangement, the transport robot TR can move the substrate holder hands 41c, 42c horizontally and vertically within a range hatched in FIG. 5(c).

When the robot body 18 accesses the cassette C placed on the cassette stage 16 (see FIG. 2), the robot body 18 is moved to ends of the transport guide rails 17 on the side of the first transport path 14 by the transport controller 29. In this state, the substrate holder 26 is brought into opposed relation to the cassette C on the cassette stage 16 by the operation of the vertical articulated arm 24. That is, the substrate holder 26 can be moved along the first transport path 14, while the base 23 is kept located on the transport guide rails 17.

Then, the retractable arm 41, 42 is brought into opposed relation to the cassette C by the operation of the pivotal driving mechanism 25, and caused to access the cassette C by the retractable driving mechanism not shown for loading and unloading the wafer W with respect to the cassette C. When the wafer W is transferred between the cassette C and the retractable arm 41, 42, the substrate holder 26 is slightly moved up or down by the operation of the vertical articulated arm 24.

When the robot body 18 accesses any of the plating units 20a to 20d, the bevel etching units 21a, 21b and the cleaning units 22a, 22b (see FIG. 2), the robot body 18 is moved to the front of the corresponding unit on the transport guide rails 17 by a movement mechanism not shown. In this state, the substrate holder 26 is moved up or down to the height of a substrate loading/unloading port of the unit by the operation of the vertical articulated arm 24, and the retractable arm 41, 42 is brought into opposed relation to the unit by pivoting the substrate holder 26 by means of the pivotal driving mechanism 25.

In this state, the retractable arm 41, 42 is caused to access the unit by the retractable driving mechanism for the loading and unloading of the wafer W. When the wafer W is transferred between the unit and the retractable arm 41, 42, the substrate holder 26 is slightly moved up or down by the operation of the vertical articulated arm 24.

With this arrangement, the cassette C, the plating units 20a to 20d, the bevel etching units 21a, 21b and the cleaning units 22a, 22b can be accessed by the single robot body 18 for the loading and unloading of the wafer W.

The wafer W subjected to the plating process in the plating unit 20a to 20d (hereinafter referred to as "entire-surface-plated wafer") has a copper film formed on the entire surface thereof including the peripheral edge thereof by the plating, before the wafer W is subjected to the bevel etching process in the bevel etching unit 21a, 21b. Therefore, the substrate holder hand 41c, 42c which holds the entire-surface-plated wafer is contaminated with copper. Hence, it is preferred that one of the substrate holder hands 41c, 42c is dedicated to holding the entire-surface-plated wafer. Thus, the contamination with copper is prevented from spreading via the substrate holder hand 41c or 42c.

Figure 6A:
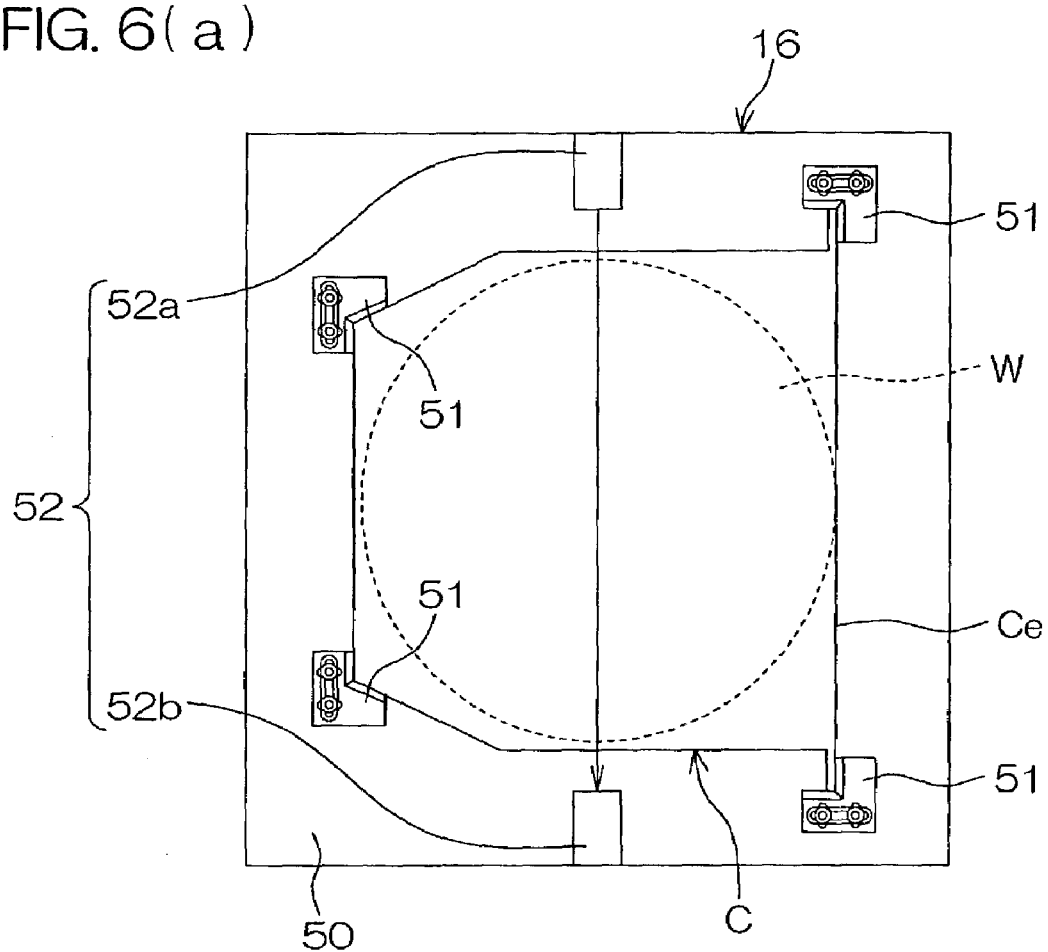
FIG. 6(a) is a schematic plan view of a cassette stage on which a cassette is placed.
Figure 6B:
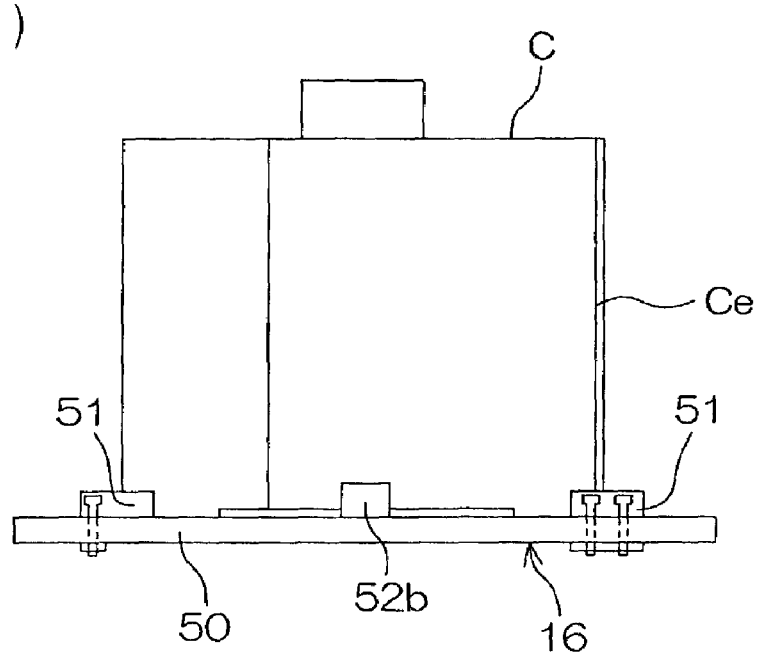
FIG. 6(b) is a schematic side view of the cassette stage on which the cassette is placed.

FIGS. 6(a) and 6(b) are a schematic plan view and a schematic side view, respectively, of the cassette stage 16 on which the cassette C is placed.

The cassette stage 16 includes a planar cassette base 50 for receiving thereon the cassette C. The cassette base 50 has a generally square shape as seen in plan. The cassette C has a generally square shape having a smaller size than the cassette base 50 as seen in plan, and has a wafer loading/unloading opening Ce provided on one lateral side thereof.

The cassette base 50 has cassette guides 51 provided on one surface (upper surface) thereof in association with four corners of the cassette C as seen in plan. Therefore, the cassette C can be located in position on the cassette base 50 with its corners in contact with the cassette guides 51. With the cassette C located in position on the cassette base 50, the wafer loading/unloading opening Ce faces toward the first transport path 14 (see FIG. 2).

A light emitting element 52a and a light receiving element 52b are respectively provided at generally middle points on opposite edges of the cassette base 50 (excluding an edge having the wafer loading/unloading opening Ce) on the surface of the cassette base 50. The light emitting element 52a and the light receiving element 52b constitute a transmissive photosensor 52. When no cassette C is present on the cassette base 50, light emitted from the light emitting element 52a is received by the light receiving element 52b. When the cassette C is present on the cassette base 50, the light emitted from the light emitting element 52a is blocked by the cassette C and does not reach the light receiving element 52b. Thus, a judgment can be made on the presence or absence of the cassette C on the cassette base 50.

Figure 7:
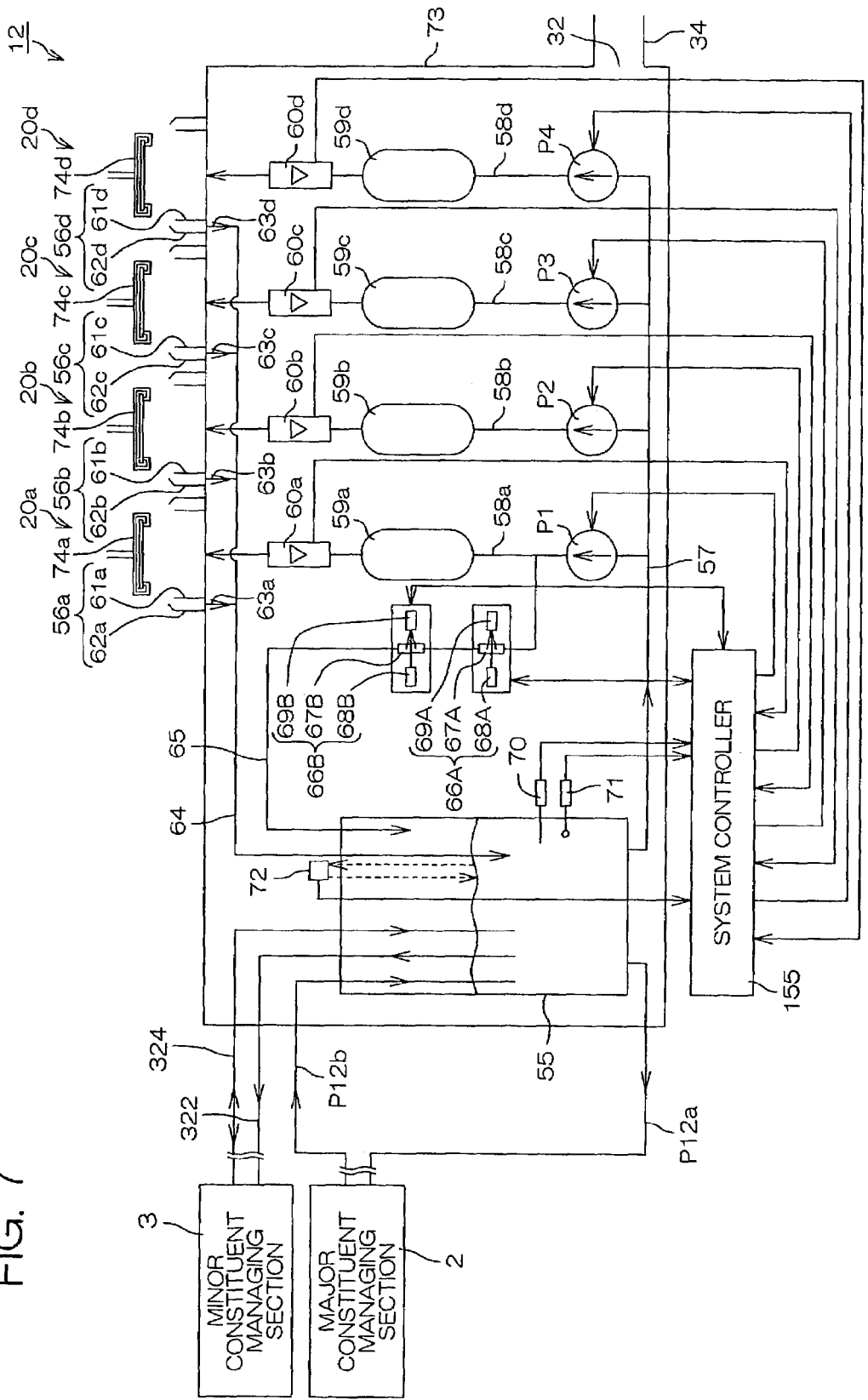
FIG. 7 is a schematic front view illustrating the construction of a plating section.

FIG. 7 is a schematic front view illustrating the construction of the plating section 12.

The plating section 12 includes a plurality of plating units (the four plating units 20a to 20d in this embodiment) for the plating of the wafer W, and a plating liquid container 55 for containing the plating liquid. The plating units 20a to 20d respectively include plating cups 56a to 56d for containing the plating liquid, and wafer holding/rotating mechanisms (treatment heads) 74a to 74d to be located above the plating cups 56a to 56d.

The plating liquid container 55 is capable of containing the plating liquid in a much greater amount than the plating cups 56a to 56d (e.g., 20 times the total volume of the plating cups 56a to 56d). Since a great amount of the plating liquid can be stored in the plating liquid container 55, the total amount of the plating liquid to be used in the plating section 12 can be increased. Thus, variations in the composition of the plating liquid can be reduced during the plating process.

The plating liquid transport pipe P12a for transporting the plating liquid to the major constituent managing section 2 is connected to the bottom of the plating liquid container 55 in communication with the plating liquid container 55. The plating liquid transport pipe P12b for introducing the plating liquid transported from the major constituent managing section 2 into the plating liquid container 55, the sampling pipe 322 for transporting the plating liquid to the minor constituent managing section 3, and the replenishment pipe 324 for transporting the plating liquid between the minor constituent managing section 3 and the plating liquid container 55 in opposite directions are introduced into the plating liquid container 55 from the top of the plating liquid container 55. The plating liquid transport pipe P12b, the sampling pipe 322 and the replenishment pipe 324 extend to a depth at which open ends thereof are submerged in the plating liquid in the plating liquid container 55.

The plating cups 56a to 56d are located at a higher position than the plating liquid container 55. A liquid supply pipe 57 extends from the bottom of the plating liquid container 55, and is branched into four branch liquid supply pipes 58a to 58d. The branch liquid supply pipes 58a to 58d extend upward to be respectively connected to bottom center portions of the plating cups 56a to 56d in communication with the plating cups 56a to 56d.

Pumps P1 to P4, filters 59a to 59d and flow meters 60a to 60d are provided in this order from a lower side to an upper side in the respective branch liquid supply pipes 58a to 58d. The pumps P1 to P4 are respectively capable of pumping the plating liquid from the plating liquid container 55 to the plating cups 56a to 56d. The operations of the pumps P1 to P4 are controlled by the system controller 155. The filters 59a to 59d are capable of removing particles (contaminants) from the plating liquid. Signals indicative of the flow rates of the plating liquid is outputted from the flow meters 60a to 60d, and inputted to the system controller 155.

The plating cups 56a to 56d respectively include cylindrical plating vessels (liquid containing portions) 61a to 61d provided inwardly thereof, and recovery vessels 62a to 62d surrounding the plating vessels 61a to 61d. The branch liquid supply pipes 58a to 58d are connected in communication with the plating vessels 61a to 61d. Branch return pipes 63a to 63d extend from bottom portions of the recovery vessels 62a to 62d. The branch return pipes 63a to 63d are connected in communication with a return pipe 64, which extends into the plating liquid container 55.

With the aforesaid arrangement, the plating liquid is supplied, for example, to the plating vessel 61a from the plating liquid container 55 through the liquid supply pipe 57 and the branch liquid supply pipe 58a by operating the pump P1. The plating liquid overflows from the top of the plating vessel 61a, and is fed back into the plating liquid container 55 from the recovery vessel 62a through the branch return pipe 63a and the return pipe 64 by gravity. That is, the plating liquid is circulated through the plating liquid container 55 and the plating cup 56a.

Similarly, the plating liquid is circulated through the plating liquid container 55 and the plating cup 56b, 56c or 56d by operating the pump P2, P3 or P4. When the plating process is performed in any of the plating units 20a to 20d, the plating liquid is circulated through the plating cup 56a to 56d of the corresponding plating unit 20a to 20d and the plating liquid container 55. Thus, the plating liquid container 55 is shared by the four plating units 20a to 20d.

One end of a bypass pipe 65 is connected to the branch liquid supply pipe 58a between the pump P1 and the filter 59a. The other end of the bypass pipe 65 is introduced into the plating liquid container 55. Absorptiometers 66A, 66B for measuring absorbances of the plating liquid at specific wavelengths of light are provided in the bypass pipe 65. The absorptiometer 66A is provided for determining the concentration of copper in the plating liquid, while the absorptiometer 66B is provided for determining the concentration of iron in the plating liquid.

When the pump P1 is operated to circulate the plating liquid through the plating liquid container 55 and the plating cup 56a, a part of the plating liquid flowing through the branch liquid supply pipe 58a flows into the bypass pipe 65 due to a pressure loss by the filter 59a. That is, the plating liquid can be introduced into the bypass pipe 65 without provision of a dedicated pump in the bypass pipe 65.

The absorptiometers 66A, 66B each include a cell 67A, 67B composed of a transparent material, and a light emitting section 68A, 68B and a light receiving section 69A, 69B disposed in opposed relation with the cell 67A, 67B interposed therebetween. The light emitting sections 68A and 68B are respectively capable of emitting light beams having specific wavelengths corresponding to absorption spectra of copper and iron (e.g., 780 nm for copper). The light receiving sections 69A and 69B are respectively capable of measuring the intensities of the light beams emitted from the light emitting sections 68A and 68B and transmitted through the plating liquid in the cells 67A and 67B. The absorbances of the plating liquid are determined on the basis of the light intensities. Signals indicative of the absorbances are outputted from the absorptiometers 66A, 66B, and inputted to the system controller 155.

A temperature sensor 70 and an electromagnetic conductivity meter 71 are attached to a side wall of the plating liquid container 55. The temperature sensor 70 and the electromagnetic conductivity meter 71 are located at a height lower than the surface level of the plating liquid contained in the plating liquid container 55. Detectors of the temperature sensor 70 and the electromagnetic conductivity meter 71 project into the plating liquid container 55, and are respectively adapted to measure the temperature and electrical conductivity of the plating liquid. Output signals of the temperature sensor 70 and the electromagnetic conductivity meter 71 are inputted to the system controller 155.

The concentrations of copper and iron in the plating liquid can be determined by measuring the absorbances of the plating liquid at the specific wavelengths of light. An explanation will be given to how to determine the copper concentration on the basis of the absorbance of the plating liquid.

Figure 8:
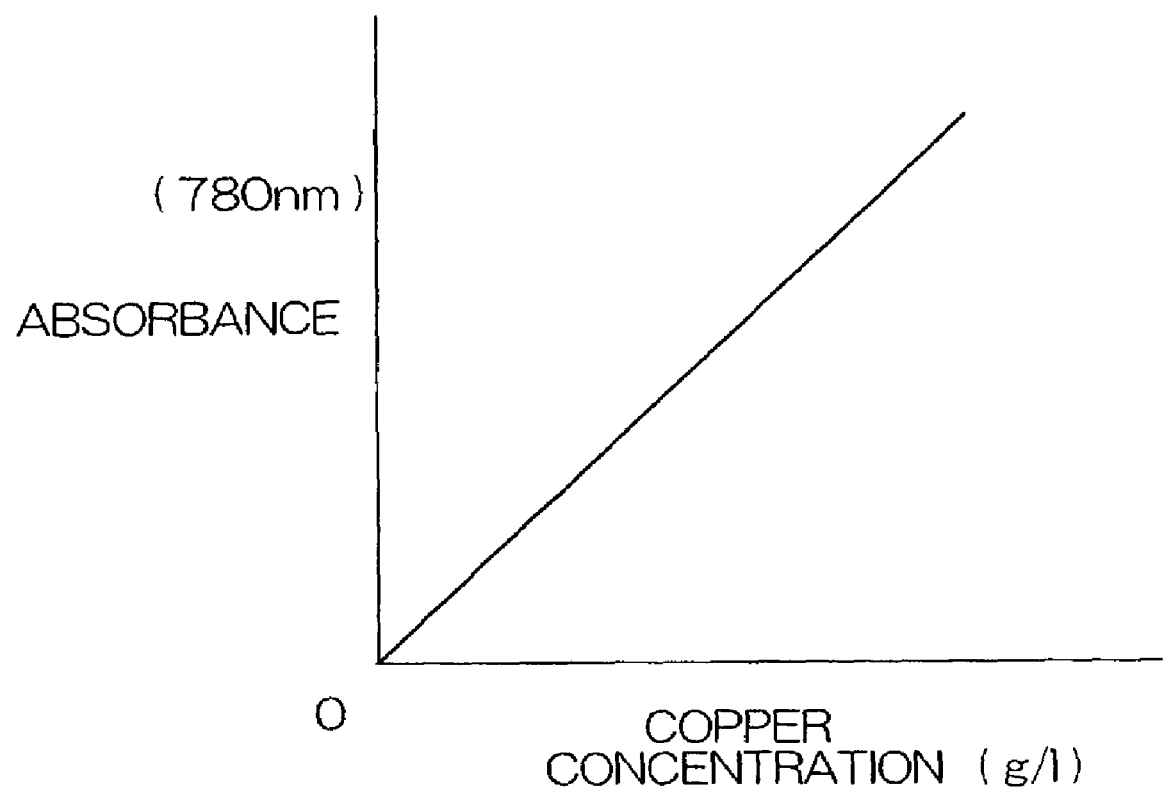
FIG. 8 is a diagram illustrating a relationship between the concentrations of copper in plating liquid samples and measured absorbances.

For the determination of the copper concentration of the plating liquid, a relationship between the copper concentration and the absorbance is preliminarily determined. First, plural plating liquid samples having different copper concentrations are prepared. Copper sulfate is added as a copper source for the preparation of the plating liquid samples. The plating liquid samples each have substantially the same composition as the plating liquid actually used for the plating process, except that the copper concentrations thereof are different. The absorbances of the plating liquid samples are measured by the absorptiometer 66A. Thus, the relationship between the copper concentration and the absorbance (copper calibration line) is determined on the basis of the known copper concentrations and the measured absorbances of the plating liquid samples as shown in FIG. 8.

For the determination of an unknown copper concentration of the plating liquid, the absorbance of the plating liquid is measured by the absorptiometer 66A. Then, the copper concentration is determined on the basis of the measured absorbance and the copper calibration line.

Similarly, a relationship between the iron concentration and the absorbance (iron calibration line) is preliminarily determined on the basis of known iron concentrations and measured absorbances of plating liquid samples, and the concentration of iron in the plating liquid is determined on the basis of the absorbance of the plating liquid measured by the absorptiometer 66B and the iron calibration line.

The system controller 155 includes a storage device storing therein data of the copper calibration line and the iron calibration line. The system controller 155 is capable of determining the copper concentration on the basis of the output signal of the absorptiometer 66A and the data of the copper calibration line, and determining the iron concentration on the basis of the output signal of the absorptiometer 66B and the data of the iron calibration line.

An ultrasonic level meter 72 is provided above the plating liquid container 55. The ultrasonic level meter 72 is capable of detecting the surface level of the plating liquid in the plating liquid container 55. An output signal of the ultrasonic level meter 72 is inputted to the system controller 155. A capacitive level meter may be employed instead of the ultrasonic level meter 72.

The plating liquid container 55, the liquid supply pipe 57, the branch liquid supply pipes 58*a* to 58*d*, the branch return pipes 63*a* to 63*d* and the return pipe 64 are disposed in a pipe chamber 73 virtually air-tightly enclosed by the enclosure 30 and partition walls of the wafer treating section 1. The pipe chamber 73 has the air outlet port 34*h*, which is connected to the air outlet duct 34. The other end of the air outlet duct 34 is connected to the in-plant exhauster system line. The internal pressure of the pipe chamber 73 is reduced to a negative pressure by air exhaustion through the exhauster system line, so that air possibly exposed to the plating liquid and the like in the plating section 12 can forcibly be exhausted out of the clean room.

Figure 9:
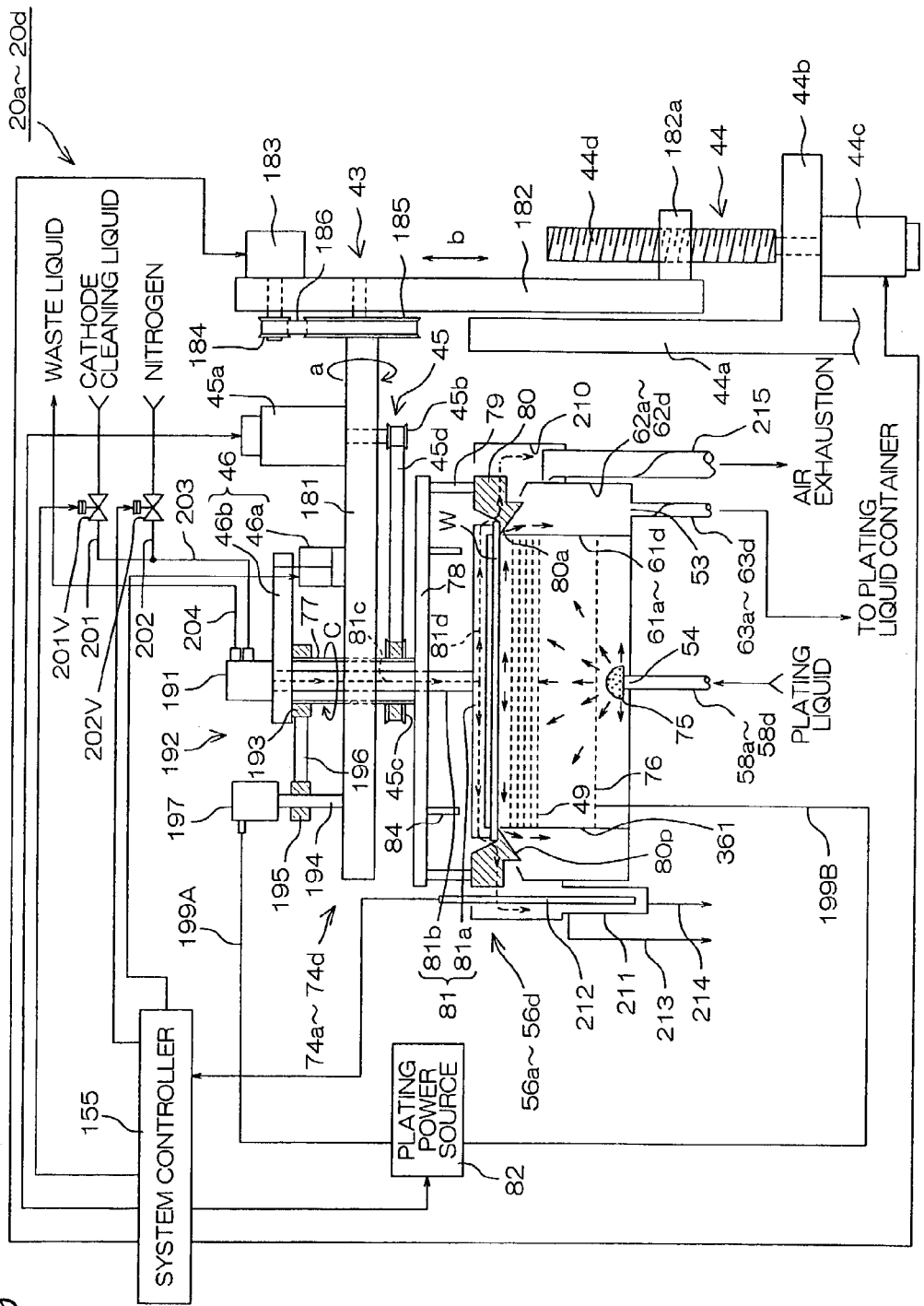
FIG. 9 is a schematic sectional view illustrating the construction of a plating unit.

FIG. 9 is a schematic sectional view illustrating the common construction of the plating units 20*a* to 20*d* as observed in the plating process. The wafer holding/rotating mechanisms 74*a* to 74*d* are each supported by a column-shaped inversion base 181 extending generally horizontally. An inversion driving section 43 is connected to one end of the inversion base 181.

The inversion driving section 43 includes a column-shaped vertical base 182 extending vertically, a rotary actuator 183 attached to the vertical base 182 and having a rotation shaft perpendicular to the vertical base 182 and parallel to the inversion base 181, and a toothed pulley 184 attached to the rotation shaft of the rotary actuator 183, a toothed pulley 185 attached to a shaft extending parallel to the shaft of the rotary actuator 183 and supported rotatably by the vertical base 182, and a timing belt 186 stretched between the toothed pulley 184 and the toothed pulley 185 for transmitting a rotation force of the rotary actuator 183.

The rotary actuator 183 may be, for example, pneumatically driven. The inversion base 181 is attached to the vicinity of the shaft of the toothed pulley 185 perpendicularly to the toothed pulley 185. The inversion base 181 and the wafer holding/rotating mechanism 74*a* to 74*d* supported by the inversion base 181 can be pivoted (inverted) about the horizontal shaft as indicated by an arrow a in FIG. 9 by a pivotal driving force of the rotary actuator 183. Thus, the wafer W held by the wafer holding/rotating mechanism 74*a* to 74*d* can face upward or downward toward the plating cup 56*a* to 56*d*.

The vertical base 182 is coupled to a lift mechanism 44. The lift mechanism 44 includes a column-shaped guide 44*a* extending generally vertically, a support member 44*b* extending from the guide 44*a* perpendicularly to the length of the guide 44*a*, a first motor 44*c* attached to the support member 44*b* and having a rotation shaft extending generally vertically, and a ball thread 44*d* coaxially attached to the rotation shaft of the first motor 44*c*. The first motor 44*c* is located below the ball thread 44*d*. The first motor 44*c* may be, for example, a servo motor.

A support member 182*a* having an internal thread portion is provided in threading engagement with the ball thread 44*d* in the vicinity of a lower end of the vertical base 182. The guide 44*a* vertically guides the vertical base 182 while preventing the vertical base 182 from rotating about the axis of the ball thread 44*d*.

With this arrangement, the vertical base 182 can be moved vertically by rotating the first motor 44*c*. Therefore, the inversion base 181 coupled to the vertical base 182 and the wafer holding/rotating mechanism 74*a* to 74*d* supported by the inversion base 181 can vertically be moved up and down (in directions indicated by arrows b in FIG. 9).

The wafer holding/rotating mechanism 74*a* to 74*d* includes a rotary pipe 77 and a disk-shaped spin base 78 attached to one end of the rotary pipe 77 perpendicularly to the rotary pipe 77.

Figure 10:
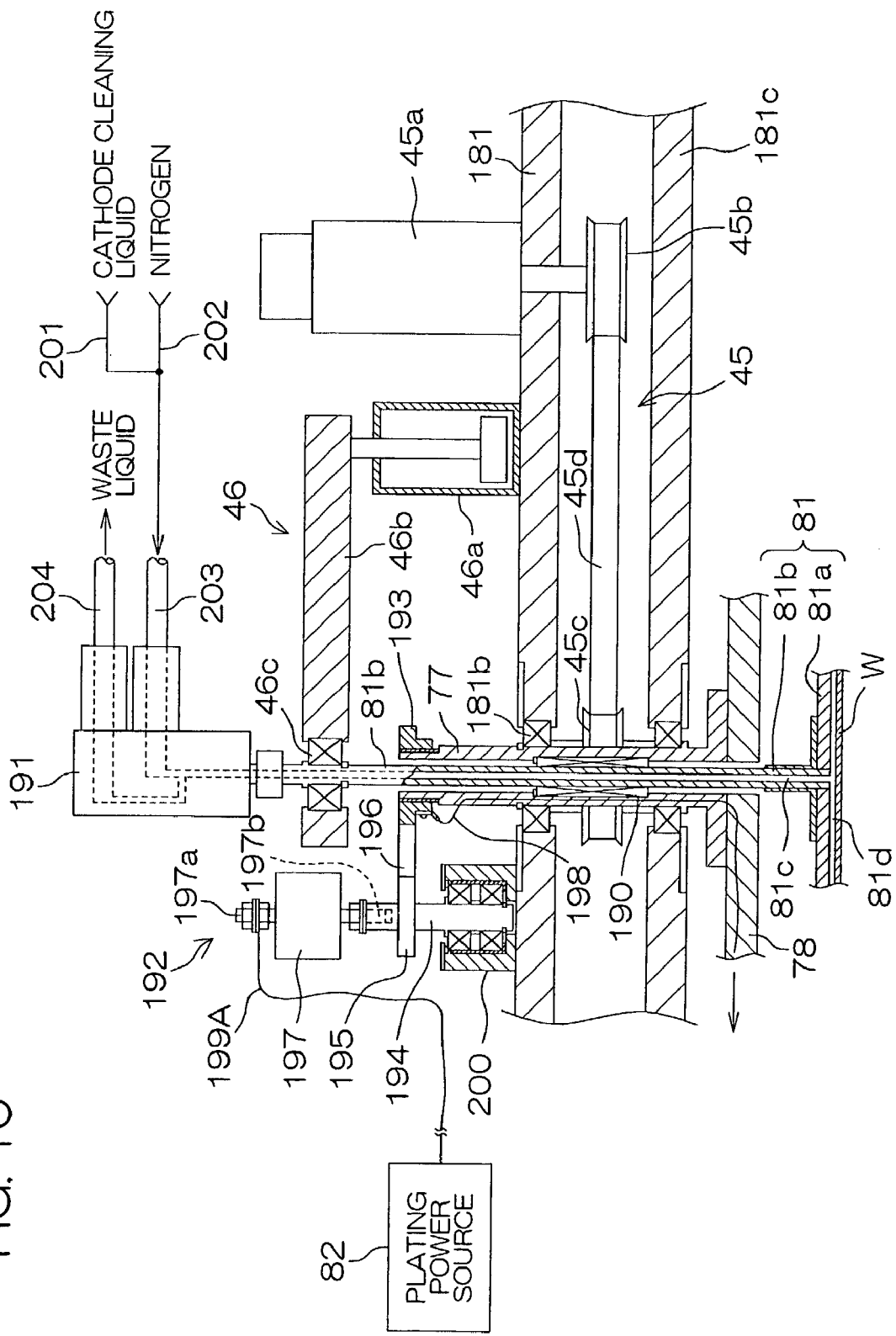
FIG. 10 is a schematic sectional view illustrating a portion around a rotary pipe on a greater scale.

FIG. 10 is a schematic sectional view illustrating a portion around the rotary pipe 77 on a greater scale. Referring to FIGS. 9 and 10, the rotary pipe 77 is supported rotatably about its axis by the inversion base 181 via a bearing 181*b*.

A plurality of wafer transfer pins 84 are provided on a surface of the spin base 78 opposite from the rotary pipe 77 between the center and the peripheral edge of the spin base 78. A plurality of support posts (e.g., four support posts) 79 are provided in a peripheral edge portion on the surface of the spin base 78 opposite from the rotary pipe 77. An annular cathode ring 80 is attached to distal ends of the support posts 79. The support posts 79 have a greater length than the wafer transfer pins 84.

The cathode ring 80 has an abutment portion 80*a* projecting toward the center of the cathode ring 80. The abutment portion 80*a* has an inner diameter slightly smaller than the diameter of the wafer W. The cathode ring 80 further has a projection 80*p* projecting opposite from the support posts 79.

A susceptor 81 is provided coaxially with the rotary pipe 77. The susceptor 81 includes a support shaft 81*b* extending through the rotary pipe 77, and a disk-shaped wafer back side press plate 81*a* attached to an end of the support shaft 81*b* (on the side of the cathode ring 80) perpendicularly to the support shaft 81*b*. The support shaft 81*b* is supported coaxially with the rotary pipe 77 by a ball spline 190, while being permitted to move axially of the rotary pipe 77.

The wafer back side press plate 81*a* is surrounded by the plurality of support posts 79. The wafer back side press plate 81*a* has a slightly smaller diameter than the wafer W. An end portion of the support shaft 81*b* opposite from the wafer back side press plate 81*a* projects out of the rotary pipe 77.

The susceptor 81 is coupled to a susceptor movement mechanism 46. The susceptor movement mechanism 46 includes an air cylinder 46*a* attached to the inversion base 181 and having a piston extending parallel to the support shaft 81*b*, and a transmission member 46*b* which couples the piston of the air cylinder 46*a* to the support shaft 81*b*. The transmission member 46*b* is fixed to the end portion of the support shaft 81*b* projecting out of the rotary pipe 77 opposite from the wafer back side press plate 81*a*. The susceptor 81 can be moved along the center axis of the rotary pipe 77 by driving the air cylinder 46*a*.

The wafer back side press plate 81*a* is formed with holes in association with the wafer transfer pins 84. Thus, the wafer transfer pins 84 are inserted into the holes of the wafer back side press plate 81*a* as the susceptor 81 is moved with respect to the rotary pipe 77. With the aforesaid arrangement, the wafer W can be held by the abutment portion 80*a* of the cathode ring 80 and the wafer back side press plate 81*a*.

A rotative driving mechanism 45 for rotating the rotary pipe 77 about its axis is coupled to the rotary pipe 77. The rotative driving mechanism 45 includes a second motor 45*a* provided on the inversion base 181 and having a rotation shaft parallel to the axis of the rotary pipe 77, a toothed pulley 45*b* fixed to the rotation shaft of the second motor 45*a*, a toothed pulley 45*c* provided around the rotary pipe 77, and a timing belt 45*d* stretched between the toothed pulley 45*b* and the toothed pulley 45*c* for transmitting a rotation force of the second motor 45*a*. The toothed pulleys 45*b*, 45*c* and the timing belt 45*d* are housed in a cover 181*c* (not shown in FIG. 9) attached to the inversion base 181.

The rotary pipe 77 can be rotated about its axis (in a direction indicated by an arrow c in FIG. 9) by a rotative driving force of the second motor 45*a*. The second motor 45*a* may be, for example, a servo motor. The rotation of the rotary pipe 77 is transmitted to the support shaft 81*b* through the ball spline 190, so that the rotary pipe 77 and the susceptor 81 are rotated together. Thus, the wafer W held by the abutment portion 80*a* of the cathode ring 80 and the wafer back side press plate 81*a* can be rotated.

In the plating process, the wafer holding/rotating mechanism 74*a* to 74*d* is moved down by the lift mechanism 44 with the wafer W thus held as facing downward, and a lower surface of the wafer W is brought into contact with the plating liquid filled in the plating vessel 61*a* to 61*d*.

A rotary joint 191 is attached to the end of the support shaft 81*b* opposite from the wafer back side press plate 81*a*. One end of a supply pipe 203 and one end of a leak pipe 204 are connected to the rotary joint 191. The other end of the supply pipe 203 is branched into a cathode cleaning liquid pipe 201 and a nitrogen gas pipe 202.

The cathode cleaning liquid pipe 201 is connected to a cathode cleaning liquid supply source, and the nitrogen gas pipe 202 is connected to a nitrogen gas supply source. A valve 201V is provided in the cathode cleaning liquid pipe 201, so that a cathode cleaning liquid can be supplied into the rotary joint 191 by opening the valve 201V. The cathode cleaning liquid may be, for example, deionized water. In this case, the cathode cleaning liquid (deionized water) can be supplied into the cathode cleaning liquid pipe 201 through the deionized water pipe 32 (see FIG. 3) which is introduced into the enclosure 30 through the deionized water supply pipe introduction port 32*h* of the enclosure 30.

A valve 202V is provided in the nitrogen gas pipe 202, so that nitrogen gas can be supplied into the rotary joint 191 by opening the valve 202V.

A single fluid channel 81*c* extends through the support shaft 81*b* along the center axis of the support shaft 81*b*. A plurality of fluid channels 81*d* are provided in the wafer back side press plate 81*a* in communication with the fluid channel 81*c* as extending from the center to the peripheral edge of the wafer back side press plate 81*a*. The fluid channels 81*d* open in the peripheral edge of the wafer back side press plate 81*a*.

Even during the rotation of the susceptor 81, a treatment fluid such as the cathode cleaning liquid or nitrogen gas can be supplied into the fluid channels 81*c*, 81*d* from the cathode cleaning liquid supply source or the nitrogen gas supply source on the side of a stationary system through the rotary joint 191.

A part of the cathode cleaning liquid supplied from the supply pipe 203 is drained through the leak pipe 204. Thus, particles generated by slidable members in the rotary joint 191 are washed away into the leak pipe 204 by the cathode cleaning liquid so as to be prevented from flowing into the fluid channels 81*c*, 81*d*.

Figure 11:
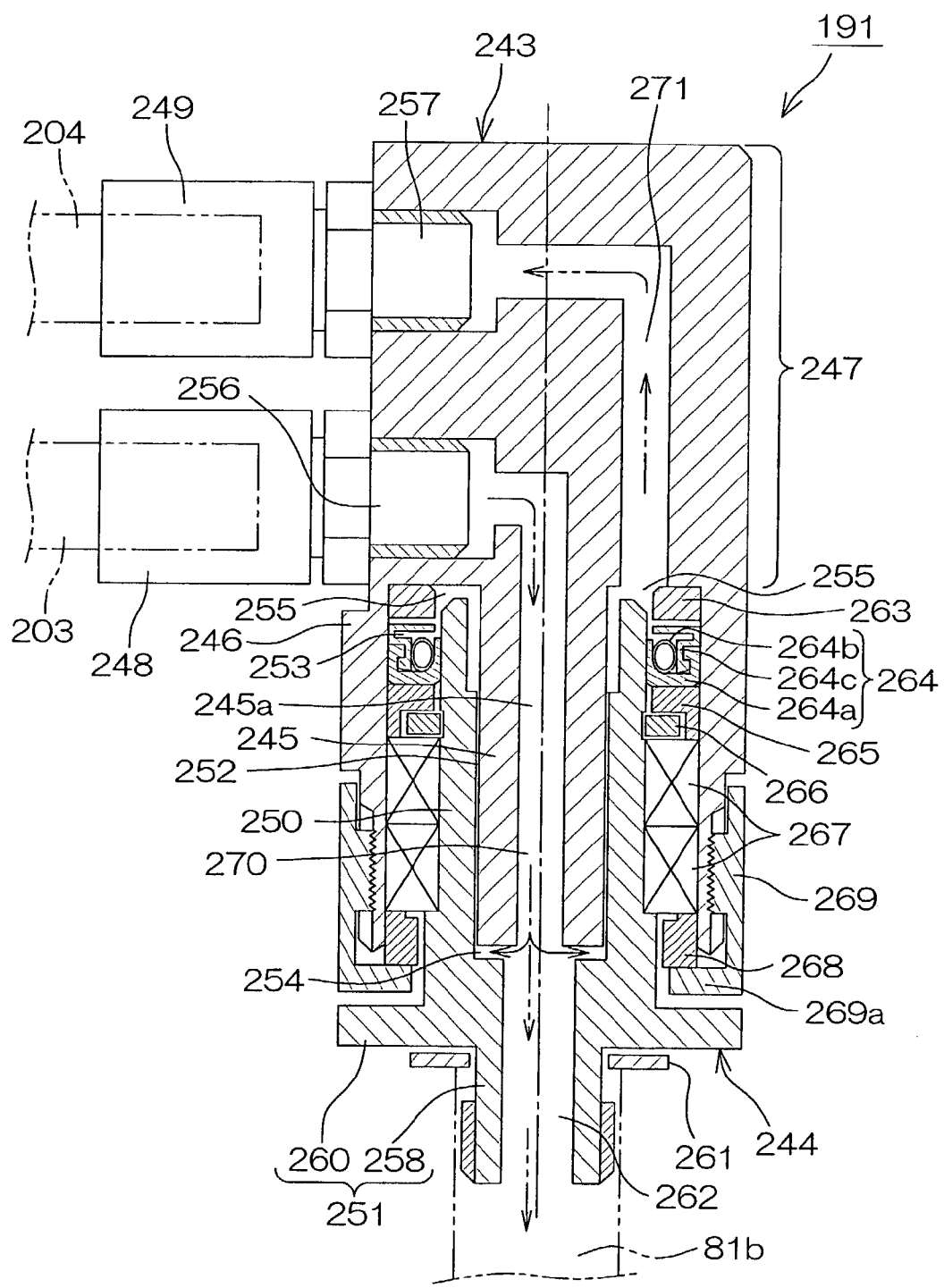
FIG. 11 is a schematic sectional view of a rotary joint.

FIG. 11 is a schematic sectional view of the rotary joint 191. The rotary joint 191 includes a stator 243 connected to the supply pipe 203 and the leak pipe 204, and a rotor 244 connected to the support shaft 81*b* of the susceptor 81.

The stator 243 includes a body 247, an inner cylinder 245 projecting from the body 247, and an outer cylinder 246 provided around the inner cylinder 245 coaxially with the inner cylinder 245 and projecting from the body 247. The body 247, the inner cylinder 245 and the outer cylinder 246 are integrally formed. A joint 248 connected to the supply pipe 203 and a joint 249 connected to the leak pipe 204 are attached to the body 247 as extending perpendicularly to the lengths of the inner cylinder 245 and the outer cylinder 246. A treatment fluid supply port 256 and a leak port 257 extend from the joint 248 and the joint 249, respectively, inwardly of the body 247.

The rotor 244 includes a joint 251 for connection to the support shaft 81*b*, and a cylindrical member 250 as extending coaxially with the support shaft 81*b* connected to the joint 251. The rotor 244 has a through-hole 262 extending along the center axis thereof. The joint 251 includes a connection pipe 258 having an outer thread portion and a flange 260. The support shaft 81*b* has an inner thread portion provided on an end interior surface thereof and engaged with the outer thread portion of the connection pipe 258. The end of the support shaft 81*b* engaged with the connection pipe 258 is restricted in position by the flange 260. A fluororesin packing 261 is provided between the support shaft 81*b* and the flange 260.

The cylindrical member 250 is fitted in an annular space defined between the inner cylinder 245 and the outer cylinder 246 of the body 247 coaxially with the inner cylinder 245 and the outer cylinder 246. The treatment fluid supply port 256, an inner space 245*a* of the inner cylinder 245 and the through-hole 262 of the rotor 244 communicate with each other, and constitute a main channel 270 for introducing the treatment fluid (the cathode cleaning liquid or nitrogen gas) supplied from the supply pipe 203 into the fluid channel 81*c* provided in the support shaft 81*b*.

A first gap 252 is defined between the inner cylinder 245 and the cylindrical member 250, while a second gap 253 is defined between the outer cylinder 246 and the cylindrical member 250. The width of the first gap 252 (a distance between the inner cylinder 245 and the cylindrical potion 250) is, for example, 0.1 mm, but is increased in the vicinity of a distal end of the cylindrical member 250. The width of the second gap 253 (a distance between the outer cylinder 246 and the cylindrical member 250) is several millimeters.

The main channel 270 and the first gap 252 communicate with each other through a first communication portion 254 provided in the vicinity of a distal end of the inner cylinder 245, while the first gap 252 and the second gap 253 communicate with each other through a second communication portion 255 provided in the vicinity of the distal end of the cylindrical member 250. The leak port 257 communicates with a part of the second communication portion 255. The first gap 252, the part of the second gap 253 and the leak port 257 constitute a leak channel 271, and the main channel 270 and the leak pipe 204 communicate with each other through the leak channel 271.

A first spacer 263, a sealing ring 264, a second spacer 265, a C-ring 266, two bearings 267 and a third spacer 268 are disposed in the second gap 253 in this order from the side of the second communication portion 255. These components except the C-ring 266 each have a closed ring shape and surround the cylindrical member 250. The sealing ring 264 is held between the first spacer 263 and the second spacer 265 thereby to be located at a fixed position axially of the outer cylinder 246.

The first spacer 263 and the second spacer 265 contact the outer cylinder 246, but do not contact the cylindrical member 250. The bearings 267 are located at fixed positions axially of the cylindrical member 250, and support the cylindrical member 250 and the outer cylinder 246 in a rotatable manner. The C-ring 266 is fitted in a shallow groove provided in a predetermined position of the cylindrical member 250.

The sealing ring 264 includes a fluororesin press-fit member (lip portion) 264a having a U-shaped cross section opening toward the second communication potion 255, a coil spring (helical spring) 264b provided in the press-fit member 264a, and a press member 264c partly covering an open portion of the press-fit member 264a. The press-fit member 264a is urged outward from the center of the coil spring 264b by the resilient force of the coil spring 264b, and kept in contact with the outer cylinder 246 and the cylindrical member 250. The coil spring 264b is composed of a material resistant to the cathode cleaning liquid to be used. The press member 264c presses the coil spring 264b to prevent the coil spring 264b from disengaging from the press-fit member 264a.

The outer cylinder 246 has an outer thread portion provided on an outer surface portion adjacent to the distal end thereof. A fixture ring 269 having an inner thread portion in association with the outer thread portion is fitted around the outer cylinder 246. The fixture ring 269 includes a flange 269a provided at an end thereof adjacent to the rotor 244 as projecting inwardly thereof. The flange 269a extends between the third spacer 268 and the flange 260.

When the rotary joint 191 is assembled by combining the stator 243 with the rotor 244, the fixture ring 269 is threadingly engaged around the outer cylinder 246, whereby the third spacer 268 can be squeezed toward the second gap 253 (toward the second communication portion 255) by the flange 269a. Thus, the C-ring 266, the bearings 267 and the third spacer 268 can be introduced into the predetermined axial positions.

An end of the leak pipe 204 opposite from the rotary joint 191 usually opens at the atmospheric pressure, while the treatment fluid flowing through the main channel 270 is generally pressurized. Therefore, the treatment fluid flowing through the main channel 270 partly flows into the leak channel 271 which has a lower internal pressure. The treatment fluid (particularly, the cathode cleaning liquid) flowing through the leak channel 271 partly flows through the second communication portion 255 to reach the second gap 253, but the flow thereof is prevented by the sealing ring 264. Therefore, there is no possibility that the treatment fluid leaks toward the bearings 267.

When the support shaft 81b is rotated, the rotor 244 is also rotated. The rotor 244 is supported with respect to the stator 243 via the sealing ring 264 and the bearings 267 and, hence, can freely be rotated with respect to the stator 243. By the rotation of the rotor 244, the press-fit member 264a is brought into friction with either or both of the outer cylinder 246 and the cylindrical member 250. Although the fluororesin press-fit member 264a has a sufficient wear resistance, a small amount of particles are generated.

Since the treatment fluid flows from the first gap 252 toward the leak port 257 in the leak channel 271, the particles generated around the sealing ring 264 are drained together with the treatment fluid (particularly, the cathode cleaning liquid) into the leak pipe 204 through the leak channel 271. Therefore, there is no possibility that the treatment fluid flowing through the main channel 270 is contaminated with the particles.

An ejector may be attached to the end of the leak pipe 204 opposite from the rotary joint 191. In this case, when the flow rate of the treatment fluid flowing into the leak channel 271 from the main channel 270 is low, a pressure on the side of the leak port 257 is reduced to a negative level by the ejector for forcibly increasing the flow rate of the treatment fluid. Even if the internal pressure of the main channel 270 is close to the atmospheric pressure, the flow rate of the treatment fluid flowing through the leak channel 271 can be increased.

Thus, the flow rate of the treatment fluid flowing through the leak channel 271 can be adjusted by adjusting the pressure on the side of the leak port 257, suppressing the movement of the particles generated around the sealing ring 264 toward the main channel 270. The flow of the particles toward the main channel 270 can further be suppressed by reducing the width of the first gap 252 to 50 μm.

Where the first gap 252 has a reduced width, the treatment fluid present in the first gap 252 experiences a great pressure loss. Therefore, even if the treatment fluid flowing through the main channel 270 is highly pressurized to increase the flow rate of the treatment fluid in the main channel 270, a great pressure (or load) is not exerted on the sealing ring 264. Therefore, the service life of the sealing ring 264 is prolonged. Where the treatment fluid is the cathode cleaning liquid, the cathode cleaning liquid present in the second gap 253 serves to lubricate and cool the sealing ring 264. This also prolongs the service life of the sealing ring 264.

The particles can be washed away by a small amount of the treatment fluid flowing through the leak channel 271. By reducing the width of the first gap 252, the amount of the treatment fluid flowing through the first gap 252 can be reduced, thereby reducing the consumption of the treatment fluid such as the cathode cleaning liquid.

Since the inner cylinder 245 and the outer cylinder 246 are formed integrally with the body 247, the inner cylinder 245 and the outer cylinder 246 are spaced exactly the predetermined distance. Further, the cylindrical member 250 is supported with respect to the outer cylinder 246 at three positions by the sealing ring 264 and the two bearings 267, so that the distance between the cylindrical member 250 and the outer cylinder 246, i.e., the width of the second gap 253, can be kept exactly at the predetermined level. Therefore, the distance between the cylindrical member 250 and the inner cylinder 245, i.e., the width of the first gap 252, is also kept at the predetermined level. Hence, there is no possibility that the cylindrical member 250 is brought into contact with the inner cylinder 245.

A plurality of leak channels 271 and a plurality of leak ports 257 may be provided.

Figure 12:
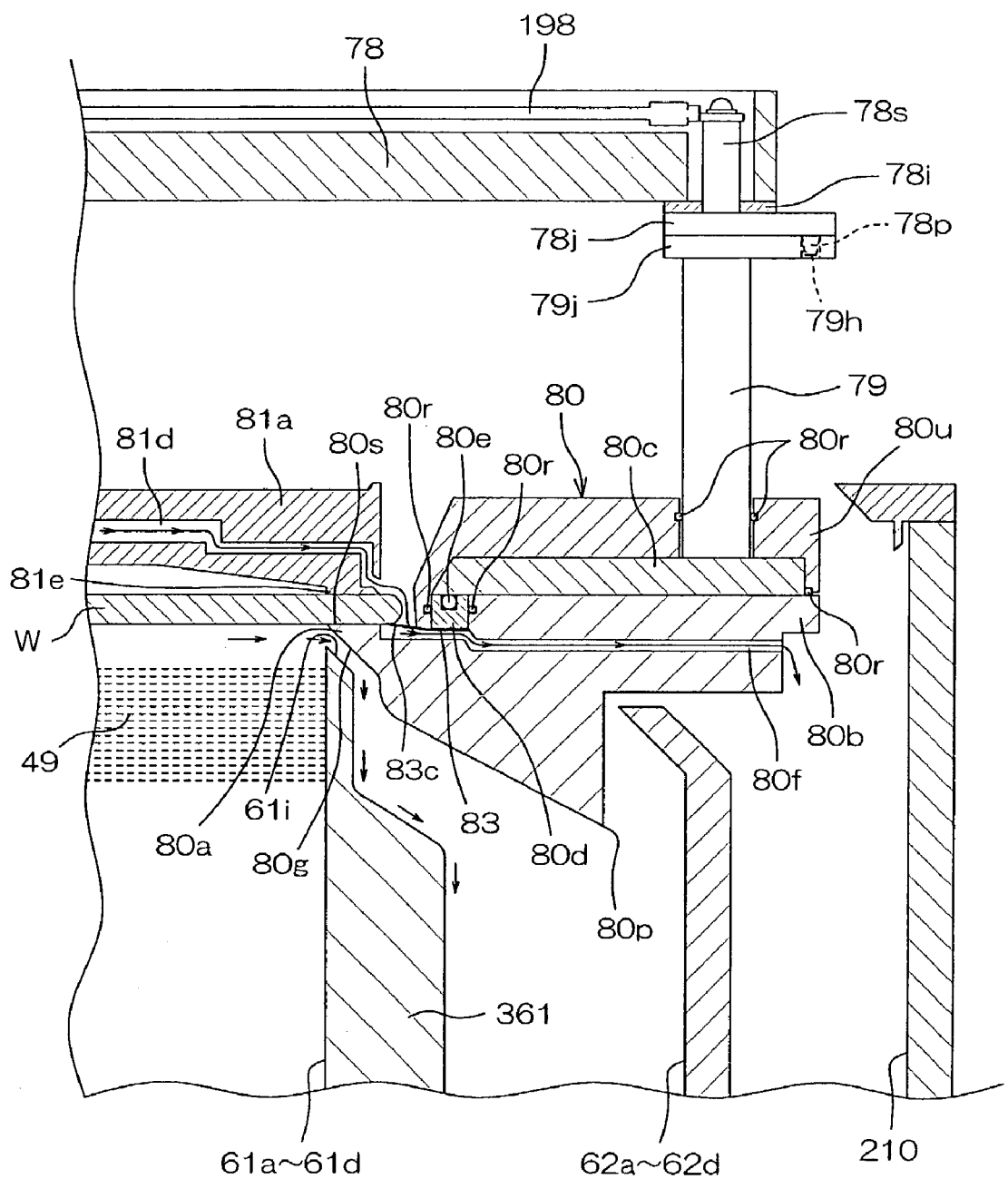
FIG. 12 is a schematic sectional view illustrating a portion around a wafer as observed in a plating process.
Figure 13A:
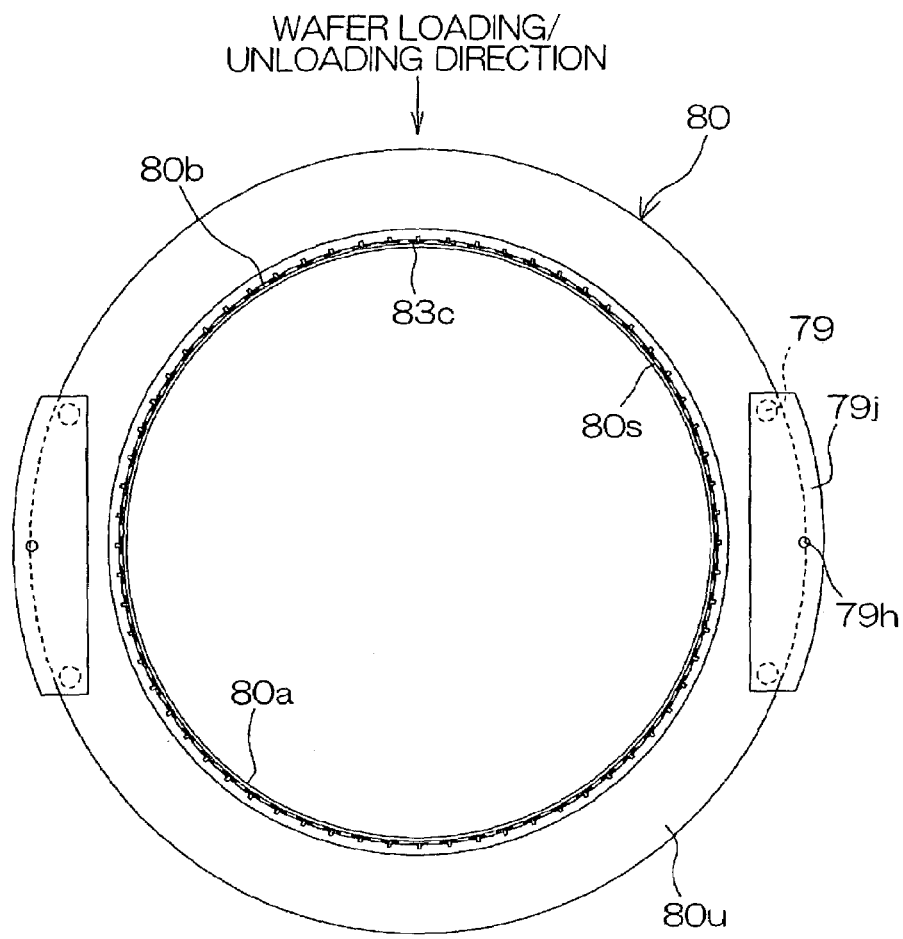
FIG. 13(a) is a schematic plan view illustrating the entire cathode ring (as viewed from the side of a spin base)
Figure 13B:
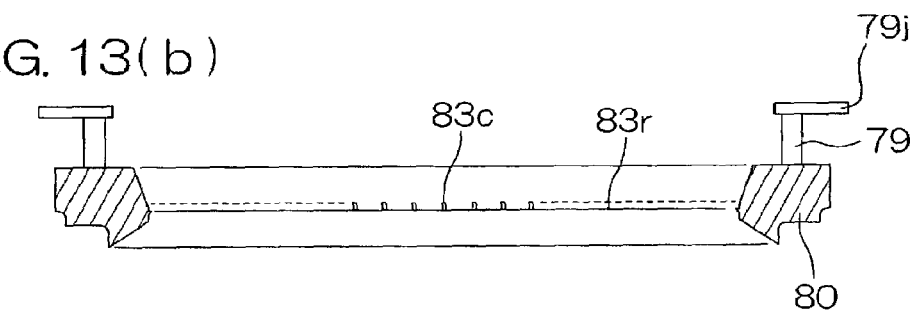
FIG. 13(b) is a schematic sectional view illustrating the entire cathode ring.
Figure 13C:
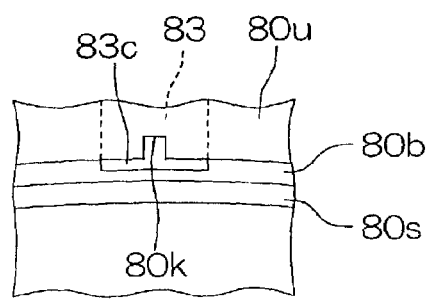
FIG. 13(c) is a schematic plan view illustrating an inner peripheral portion of the cathode ring on a greater scale.

FIG. 12 is a schematic sectional view illustrating a portion around the wafer as observed in the plating process. FIG. 13(a) is a schematic plan view illustrating the entire cathode ring 80 (as viewed from the side of the spin base 78), and FIG. 13(b) is a schematic sectional view of the cathode ring 80. FIG. 13(c) is a schematic plan view illustrating an inner peripheral portion of the cathode ring 80 on a greater scale.

With reference to FIGS. 12 and 13(a) to 13(c), an explanation will be given to the construction of the cathode ring 80. The cathode ring 80 includes an upper ring 80u, a conduction plate 80c and a base ring 80b arranged in this order from the side of the spin base 78. The upper ring 80u, the conduction plate 80c and the base ring 80b each have an annular shape. The base ring 80b is composed of a rigid material. The conduction plate 80c is covered with the upper ring 80u and the base ring 80b. The upper ring 80u and the base ring 80b are opposed (adjacent) to each other along the outer periphery of the conduction plate 80c and along the inner periphery of the conduction plate 80c opposite from the spin base 78.

The conduction plate 80c is electrically conductive. The conduction plate 80c has a higher strength than the upper ring 80u and the base ring 80b to impart the entire cathode ring 80 with a sufficient strength.

The base ring 80b is provided with the abutment portion 80a which is composed of a rigid material. Examples of the rigid material include rigid vinyl chloride resins, rigid fluororesins and polyimide resins. The abutment portion 80a has a sealing surface 80s to be brought into contact with the wafer W in opposed relation to the wafer back side press plate 81a. The sealing surface 80s is a polished surface. Since the base ring 80b is provided with the abutment portion 80a, the base ring 80b has a slightly smaller inner diameter than the upper ring 80u.

An annular projection 81e slightly projecting toward the abutment portion 80a is provided on a peripheral portion of the wafer back side press plate 81a opposed to the abutment portion 80a. The projection 81e is composed of a soft material. For example, the projection 81e may be an O-ring of a silicone rubber or a coil spring coated with a fluororesin. In the plating process, the wafer W is generally horizontally held between the projection 81e and the abutment portion 80a as shown in FIG. 12.

In this state, a surface 80g of the abutment portion 80a opposed to the plating vessel 61a to 61d (opposite from the sealing surface 80s) is inclined downward outwardly from the center of the cathode ring 80. That is, the abutment portion 80a projects as tapered inwardly from the body of the cathode ring 80, so that a force can be exerted on the wafer W toward the center axis of the cathode ring 80 which is perpendicular to the projecting direction of the abutment portion 80a. Since the base ring 80b including the abutment portion 80a is composed of the rigid material, this structure can be realized.

Thus, the total size of the abutment portion 80a and its periphery can be reduced, whereby the inner diameter of the abutment portion 80a can correspondingly be increased. Therefore, the effective plating area, i.e., the area of the wafer W in contact with the plating liquid, can be increased.

The base ring 80b has a plurality of through-holes extending radially therethrough. These through-holes communicate with a gap defined between the upper ring 80u and the base ring 80b along the inner periphery of the cathode ring 80, and constitute fluid channels 80f which extend in generally coplanar relation. The fluid channels 80f open toward the center of the cathode ring 80.

Where the wafer back side press plate 81a and the cathode ring 80 are located in position in the plating process, the fluid channels 80f are located at a lower position than the fluid channels 81d. A multiplicity of notches 80k (see FIG. 13(c)) are provided in an inner peripheral portion of the upper ring 80u, whereby the cathode cleaning liquid flowing out of the fluid channels 81d opening in the periphery of the wafer back side press plate 81a can be introduced into the fluid channels 80f in the plating process.

A cathode 83 is disposed in the fluid channels 80f (in the gap between the upper ring 80u and the base ring 80b). Therefore, the cathode 83 can be cleaned with the cathode cleaning liquid in the plating process. The cathode 83 is disposed within substantially the same plane as the sealing surface 80s outwardly of the abutment portion 80a with respect to the center of the cathode ring 80.

Figure 14A:
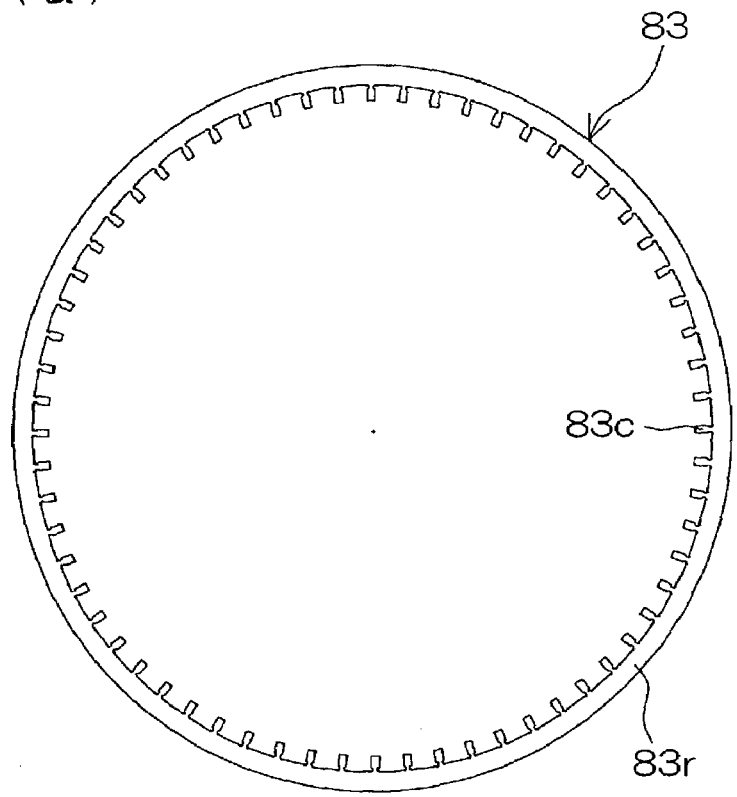
FIG. 14(a) is a schematic plan view illustrating the entire cathode.
Figure 14B:
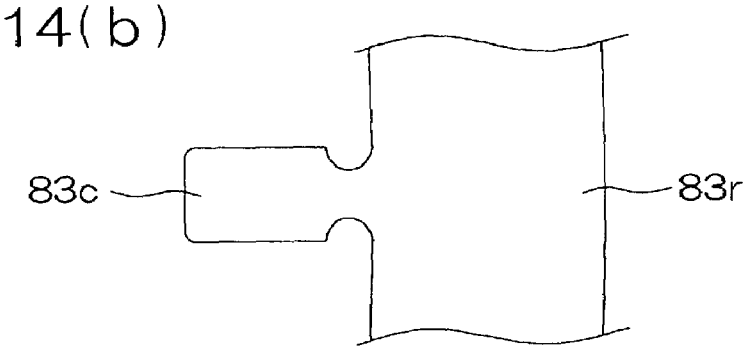
FIG. 14(b) is a schematic plan view illustrating a part of the cathode on a greater scale.
Figure 14C:
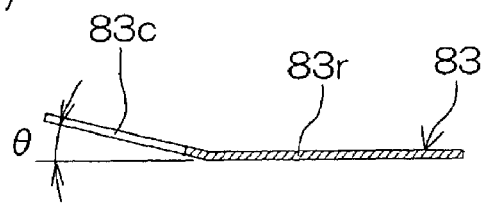
FIG. 14(c) is a schematic sectional view illustrating a part of the cathode on a greater scale.

FIG. 14(a) is a schematic plan view illustrating the shape of the cathode 83, and FIG. 14(b) is a diagram illustrating a part of the cathode 83 on a greater scale. FIG. 14(c) is a schematic sectional view of the cathode 83.

The cathode 83 is composed of a spring stainless steel having a thickness of about 0.1 mm, and has a surface plated with platinum. This prevents formation of an oxide film on the surface of the cathode 83, and prevents dissolution of the cathode 83 even if a reverse electric field is applied to the cathode 83. The platinum film of the cathode 83, if having a very small thickness, has a shorter service life. The cathode 83 behaves resiliently in contact with wafer W. However, if the platinum film of the cathode 83 is too thick, the film is liable to be cracked in the resilient behavior. In view of these, the thickness of the platinum film of the cathode 83 is preferably about 0.01 μm to about 2 μm.

The cathode 83 has a ring portion 83r having a slightly greater inner diameter than the upper ring 80u, and a multiplicity of contact portions 83c generally equidistantly arranged like a comb circumferentially of the ring portion 83r as extending from the ring portion 83r toward the center of the ring portion 83r. The contact portions 83c are each bent at an angle θ of 5 to 60 degrees with their distal ends raised from the cathode ring 80 toward the wafer back side press plate 81a (see FIG. 12).

With the cathode 83 attached to the cathode ring 80, the distal ends of the contact portions 83c project from the gap between the upper ring 80u and the base ring 80b toward the inner periphery of the upper ring 80u (see FIGS. 12 and 13(c)). The angle of the bent contact portions 83c is restricted by the upper ring 80u (see FIG. 12).

Referring to FIG. 12, the abutment portion 80a is brought into contact with a portion of one surface of the wafer W slightly inward from the peripheral edge of the wafer W in the plating process. The cathode 83 is brought into resilient contact with a peripheral edge portion of the surface of the wafer W contacting the abutment portion 80a, while the wafer W is held between the abutment portion 80a and the wafer back side press plate 81a. That is, the contact portions 83c can be kept in contact with the wafer W at a predetermined contact pressure.

An electrically-conductive electrode press 80d having a ring shape coaxial with the cathode ring 80 is disposed between the base ring 80b and the upper ring 80u on a side of the conduction plate 80c opposite from the spin base 78. The electrode press 80d has a groove formed circumferentially thereof, and a coil spring 80e having a ring shape coaxial with the electrode press 80d is housed in the groove.

The cathode 83 is fixed to the electrode press 80d for electrical connection, and the electrode press 80d and the conduction plate 80c are kept in resilient contact with each other by the coil spring 80e for electrical connection. Thus, the electrical connection is maintained between the electrode press 80d and the conduction plate 80c, even if the base ring 80b is pressed by the wafer back side press plate 81a to be warped or slightly offset from the upper ring 80u. This ensures proper plating of wafer W.

The support posts 79 are electrically conductive, and extend through the upper ring 80u so as to be electrically connected to the conduction plate 80c. The support posts 79 are not provided equidistantly circumferentially of the cathode ring 80, but provided in two pairs which are spaced at about 180 degrees around the center of the cathode ring 80 (see FIG. 13(a)). Thus, the wafer W can easily be inserted between the wafer back side press plate 81a and the cathode ring 80 through a space defined between the support posts 79 arranged at a wider interval.

O-rings 80r are provided between the support posts 79 and the upper ring 80u (around the support posts 79), between the upper ring 80u and the base ring 80b around the conduction plate 80c, between the upper ring 80u and the electrode press 80d (along the inner periphery of the electrode press 80d), and between the base ring 80b and the electrode press 80d (along the outer periphery of the electrode press 80d). This prevents the plating liquid from intruding into the cathode ring 80 (the base ring 80b and the upper ring 80u). Thus, the inside of the cathode ring 80 can be kept clean.

Electrically conductive coupling members 79j are attached to ends of the support posts 79 opposite from the conduction plate 80c. The coupling members 79j each couple two adjacent support posts 79 (see FIG. 13(a)). The coupling members 79j are each formed with a positioning hole 79h.

A conduction line 198 is provided within the spin base 78 and the rotary pipe 77. The conduction line 198 may be, for example, a coated conduction cable, which is electrically isolated from the spin base 78 and the rotary pipe 77. Electrically conductive coupling members 78j are each attached to the peripheral portion of the surface of the spin base 78 facing toward the cathode ring 80 via an insulative plate 78i. The coupling members 78j each have a positioning pin 78p provided in association with the positioning hole 79h of the coupling member 79j. The conduction line 198 is electrically connected to the coupling member 78j via a conduction stud 78s extending through the insulative plate 78i. The coupling members 78j are respectively coupled to the coupling members 79j.

With the aforesaid arrangement, the cathode 83 is electrically connected to the conduction line 198. Even if the spin base 78 and the rotary pipe 77 are composed of a metal, an electric current flowing through a conduction path between a plating power source 82 and the cathode 83 is prevented from flowing through the spin base 78 and the rotary pipe 77 by the insulative plates 78i.

The coupling members 78j are respectively coupled to the coupling members 79j with the positioning pins 78p fitted in the positioning holes 79h. Thus, the cathode ring 80 is fixed to the spin base 78 in predetermined positional relation. In this state, the center axis of the cathode ring 80 and the center axis (rotation axis) of the spin base 78 are generally aligned with each other, so that the cathode ring 80 can properly be rotated together with the spin base 78. Even when the cathode ring 80 and the spin base 78 are rotated at a high speed, there is no possibility that the cathode ring 80 is offset from the spin base 78.

The cathode ring 80 can be detached from the spin base 78 for cleaning thereof by decoupling the coupling members 78j and 79j from each other. At this time, the cathode ring 80 can be cleaned by immersing the cathode ring 80 in the cleaning liquid without the need for disassembling the cathode ring 80, because the O-rings 80r prevents the cleaning liquid from intruding into the cathode ring 80. When the cathode ring 80 is detached from the spin base 78, the support posts 79 serve as handles of the cathode ring 80.

When the cathode ring 80 is attached to the spin base 78, the coupling members 78j and 79j are coupled to each other with the positioning pins 78p inserted into the positioning holes 79h, whereby the cathode ring 80 can easily be fixed to the spin base 78 in predetermined positional relation.

Referring to FIGS. 9 and 10, an electrical connection mechanism 192 is provided between the plating power source 82 and the conduction line 198, so that electrical connection can be established between the conduction line 198 rotated together with the cathode ring 80 and the plating power source 82 on the side of the stationary system.

The electrical connection mechanism 192 includes an electrically conductive pulley 193 fitted around an end portion of the rotary pipe 77 opposite from the spin base 78, an electrically conductive rotary shaft 194 rotatably attached to the inversion base 181 in parallel relation to the rotary pipe 77, an electrically conductive pulley 195 fitted around the rotary shaft 194, an electrically conductive belt 196 stretched between the pulley 193 and the pulley 195, and a rotary connector 197 attached to a distal end of the rotary shaft 194.

An end of the rotary shaft 194 opposite from the rotary connector 197 is rotatably supported by a bearing box 200 attached onto the inversion base 181. The end of the rotary shaft 194 adjacent to the bearing box 200 is isolated from the surroundings by the bearing box 200.

The pulley 193 is isolated from the rotary pipe 77. The pulleys 193, 195 each have a surface plated with gold, for example, which is kept in contact with the belt 196. The belt 196 may be a steel belt having a surface plated with gold, for example. In this case, the electrical resistance between the pulley 193 and the pulley 195 can be reduced.

The pulley 193 and the pulley 195 are mechanically connected to each other by the belt 196. When the rotary pipe 77 is rotated by the rotative driving mechanism 45, the rotative driving force is transmitted to the rotary shaft 194 via the pulley 193, the belt 196 and the pulley 195, whereby the rotary shaft 194 is rotated. Even during the rotation of the rotary pipe 77 and the rotary shaft 194, the electrical connection between the pulleys 193 and 195 is maintained through the belt 196.

The rotary connector 197 is capable of electrically connecting the stationary system to the rotary system, and has a stationary terminal 197a and a rotary terminal 197b. The rotary connector 197 is of a non-slidable type, which has no sliding contact between the solid components, but establishes the electrical connection between the stationary terminal 197a and the rotary terminal 197b, for example, by mercury (Hg). Therefore, the electrical connection between the terminals 197a and 197b is stable with a reduced noise. In addition, the rotary connector 197 has a longer service life.

The conduction line 198 (see FIG. 12) is electrically connected to the pulley 193. The pulley 193 is electrically isolated from the rotary pipe 77. Further, the pulley 195 is electrically connected to the rotary shaft 194. The rotary shaft 194 is electrically connected to the rotary terminal 197b of the rotary connector 197. The stationary terminal 197a of the rotary connector 197 is electrically connected to the plating power source 82 via a conduction line 199A.

With the aforesaid arrangement, a conduction path between the cathode 83 and the plating power source 82 is established via the electrode press 80d, the coil spring 80e, the conduction plate 80c, the support posts 79, the coupling members 79j, 78j, the conduction studs 78s, the conduction line 198, the pulley 193, the belt 196, the pulley 195, the rotary shaft 194, the rotary connector 197 and the conduction line 199A. Thus, the to-be-treated surface of the wafer W held between the cathode ring 80 and the wafer back side press plate 81a can electrically be energized.

Even when the wafer W is rotated by the rotative driving mechanism 45, the electrical connection between the cathode 83 and the plating power source 82 is maintained by the electrical connection mechanism 192. Where the belt 196 is stretched between the pulleys 193 and 195 with a sufficiently great tensile force, the belt 196 can be brought into non-sliding contact with the pulleys 193 and 195. Since the rotary connector 197 is of a non-slidable type, there is no sliding contact in the conduction path between the plating power source 82 and the cathode 83. Therefore, the electrical connection can properly be established between the plating power source 82 and the cathode 83, while a noise attributable to the sliding contact such as a so-called brush noise is suppressed.

Since the rotary joint 191 and the rotary connector 197 are respectively attached to the ends of the support shaft 81*b* and the rotary shaft 194, the replacement thereof is easy. That is, when either of the rotary joint 191 and the rotary connector 197 is detached or attached, interference between the rotary joint 191 and the rotary connector 197 can be avoided, which may otherwise occur where the rotary joint 191 and the rotary connector 197 are both attached to the support shaft 81*b* or the rotary pipe 77.

Since the rotary joint 191 and the rotary connector 197 are respectively attached to the ends of the support shaft 81*b* and the rotary shaft 194, the lengths of the support shaft 81*b* (rotary pipe 77) and the rotary shaft 194 can be reduced. Therefore, the size of the wafer holding/rotating mechanism 74*a* to 74*d* as measured axially of the support shaft 81*b* can be reduced, so that the wafer holding/rotating mechanism 74*a* to 74*d* can be inverted with a reduced turning radius.

By properly setting the ratio of the diameter of the pulley 193 to the diameter of pulley 195, the rotary shaft 194 can be rotated at a sufficiently low rotation speed even if the rotary pipe 77 is rotated at a high speed. Thus, a load exerted on the rotary connector 197 can be reduced to extend the service life of the rotary connector 197.

Where the pulleys 193 and 195 are directly engaged with each other without the belt 196, the same effects can be provided. Further, where electrically conductive gears are employed instead of the pulleys 193, 195 and meshed with each other, the same effects can be provided.

The components which constitute the conduction path extending from the cathode 83 to the plating power source 82 are isolated from the other metal components, the metal screws and the metal bearings, and assuredly isolated from the ground. This prevents the electric current from flowing through unintended portions, and prevents a noise from interfering with the electric current flowing between the cathode 83 and the plating power source 82.

The operations of the plating power source 82, the inversion driving section 43 (rotary actuator 183), the lift mechanism 44 (first motor 44*c*), the rotative driving mechanism 45 (second motor 45*a*) and the susceptor movement mechanism 46 (air cylinder 46*a*), and the opening and closing of the valves 201V, 202V are controlled by the system controller 155.

Next, an explanation will be given to the construction of the plating cup 56*a* to 56*d*. Referring to FIGS. 9 and 12, the plating vessel 61*a* to 61*d* includes a cylindrical side wall 361 having an inner diameter virtually equal to the outer diameter of the wafer W. The upper edge of the plating vessel 61*a* to 61*d* is present within substantially the same plane. A plating liquid introduction port 54 is provided in a bottom center portion of the plating vessel 61*a* to 61*d*. The branch liquid supply pipe 58*a* to 58*d* is connected to the plating liquid introduction port 54 as slightly projecting into the plating vessel 61*a* to 61*d*. A hemispherical shower head 75 having a multiplicity of holes is attached to an end of the branch liquid supply pipe 58*a* to 58*d* located in the plating vessel 61*a* to 61*d*. The plating liquid is diffusively introduced in various directions (at various angles) into the plating vessel 61*a* to 61*d* through the shower head 75.

A plating liquid outlet port 53 is provided in the bottom of the plating liquid recovery vessel 62*a* to 62*d*. The branch return pipe 63*a* to 63*d* is connected in communication with the plating liquid recovery vessel 62*a* to 62*d* via the plating liquid outlet port 53.

A cathode cleaning liquid collection vessel 210 is provided around the plating liquid recovery vessel 62*a* to 62*d* for collecting the cathode cleaning liquid used for the cleaning of the cathode 83. That is, the plating cup 56*a* to 56*d* has a triple structure having the plating vessel 61*a* to 61*d*, the plating liquid recovery vessel 62*a* to 62*d* and the cathode cleaning liquid collection vessel 210 arranged in this order from the inside to the outside. Thus, the cathode cleaning liquid and the plating liquid can separately be collected.

A three-dimensional filter including a plurality of mesh members 49 (about 3 to about 300 mesh members) of a fluororesin (e.g., a tetrafluoroethylene polymer (TEFLON®)) stacked one on another is provided in an upper portion of the plating vessel 61*a* to 61*d*. For example, the mesh members 49 each have an open mesh size of about 0.5 mm to about 5 mm. Contaminants in the plating liquid can be removed by the mesh member 49.

The mesh members 49 each have a round plan shape having an outer diameter virtually equal to the inner diameter of the plating vessel 61*a* to 61*d*. The plurality of stacked mesh members 49 generally entirely cover the plating vessel 61*a* to 61*d* as viewed in plan. The plating liquid supplied upward from the lower side of the plating vessel 61*a* to 61*d* is rectified into a generally uniform upward flow by the mesh members 49.

By stacking the mesh members 49, the effect of removing the contaminants from the plating liquid and the effect of rectifying the plating liquid can be enhanced.

A mesh anode 76 is provided at a level about one fourth the depth of the plating vessel 61*a* to 61*d* from the bottom in the plating vessel 61*a* to 61*d* (between the shower head 75 and the mesh members 49). The anode 76 is a titanium mesh member coated with iridium oxide, and is insoluble in the plating liquid. Since the anode 76 is mesh-shaped, the flow of the plating liquid is not hindered by the anode 76.

The anode 76 has a round plan shape having an outer diameter virtually equal to the inner diameter of the plating vessel 61*a* to 61*d*, and generally entirely covers the plating vessel 61*a* to 61*d* as viewed in plan. The anode 76 is connected to the plating power source 82 via a conduction line 199B.

Components which constitute a conduction path extending from the anode 76 to the plating power source 82 are isolated from the other metal components, and assuredly isolated from the ground. This prevents an electric current from flowing through unintended portions, and prevents a noise from interfering with the electric current flowing between the anode 76 and the plating power source 82.

FIG. 15 is a schematic diagram illustrating an electric equivalent circuit in the plating vessel 61*a* to 61*d*. With reference to FIG. 15, an explanation will be given to how the mesh members 49 influence the uniformity of the plating.

It is herein assumed that: the plating liquid has an electrical resistance $R_L$ in a region of the plating vessel between the anode 76 and the mesh members 49; the plating liquid has an electrical resistance $R_P$ in a region of the plating vessel where the vertically stacked mesh members 49*a* are disposed; the seed layer formed on the to-be-treated surface of the wafer W has an electrical resistance $r_s$ between the center and the periphery thereof; and a voltage V is applied between the cathode 83 and the anode 76.

Provided that the amperage of the electric current flowing vertically from the center of the anode 76 to the center of the wafer W is $i_c$ and the amperage of the electric current flowing vertically from the peripheral portion of the anode 76 to the peripheral portion of the wafer W is $i_E$, the voltage V is represented by an expression $V=i_E(R_L+R_P)=i_c(R_L+R_P+r_s)$ That is, the amperage $i_E$ of the electric current flowing vertically from the peripheral portion of the anode 76 to the peripheral portion of the wafer W is smaller than the amperage $i_c$ of the electric current flowing vertically from the center of the anode 76 to the center of the wafer W.

In the region where the mesh members 49 are disposed, the electric current flows only through the plating liquid which fills voids of the mesh members 49, because the mesh members 49 are composed of an insulative material. Therefore, the plating liquid in the region where the mesh members 49 are present has a higher electrical resistance than the plating liquid in the region where the mesh members 49 are absent. Where the volume ratio of the solid component (mesh members 49) in the region where the mesh members 49 are present is 50%, for example, the electrical resistance $R_P$ is about twice greater. Accordingly, the electrical resistance $r_s$ of the seed layer between the center and the periphery of the seed layer is smaller than the electrical resistance $R_L+R_P$ of the plating liquid in the entire plating vessel including the region where the mesh members 49 are present ($r_s \ll R_L+R_P$).

Therefore, there is only a small difference between the amperage $i_c$ of the electric current flowing vertically from the center of the anode 76 to the center of the wafer W and the amperage $i_E$ of the electric current flowing vertically from the peripheral portion of the anode 76 to the peripheral portion of the wafer W ($i_E \approx i_c$). Since a film growth rate in the plating process is proportional to the amperage of the electric current flowing across the interface between the plating liquid and the wafer W, a difference in the thickness of the film formed by the plating between the center and the peripheral portion of the wafer W is reduced. That is, the uniformity of the thickness of the film formed by the plating is improved by providing the mesh members 49 in the plating liquid. The uniformity of the film thickness is improved as the electrical resistance of the conduction path is increased by the provision of the mesh members 49.

Referring to FIG. 12, an upper edge portion of the plating vessel 61a to 61d has a reduced wall thickness with its outer circumferential portion cut away. The upper edge of the plating vessel 61a to 61d has a surface 60i inclined downward outwardly from the center of the plating vessel 61a to 61d. The inclined surface 61i is brought into opposed parallel relation to the inclined surface 80g of the abutment portion 80a of the cathode ring 80. The outer circumferential portion of the plating vessel 61a to 61d adjacent to the upper edge is concavely curved for prevention of interference with the projection 80p of the cathode ring 80.

Thus, the upper edge portion of the plating vessel 61a to 61d is complementary in configuration to the portion of the cathode ring 80 (base ring 80b) to be brought into opposed relation to the plating vessel 61a to 61d. This prevents the interference between the plating vessel 61a to 61d and the cathode ring 80 in the plating process, while permitting the wafer W to approach the plating vessel 61a to 61d until the lower surface of the wafer W and the upper edge of the plating vessel 61a to 61d are located at substantially the same level. That is, a distance between the upper edge of the plating vessel 61a to 61d and the wafer W can arbitrarily be adjusted within a predetermined range from 0 mm.

Since the abutment portion 80a is tapered inwardly of the cathode ring 80, an angle formed between the lower surface of the wafer W and the inclined surface 80g is obtuse. Thus, the plating liquid can flow out of the plating vessel 61a to 61d without stagnation around the abutment portion 80a. This permits the plating liquid to flow from the center to the periphery of the wafer W over the entire lower surface of the wafer W, thereby improving the uniformity of the plating.

Where the abutment portion 80a is not composed of a rigid material, it is necessary to provide a member (hereinafter referred to as "abutment portion support member") for supporting the abutment portion 80a from a lower side (opposite from the sealing surface 80s). In this case, the abutment portion support member interferes with the upper edge of the plating vessel 61a to 61d, so that the wafer W is merely permitted to reach a predetermined distance short of the upper edge of the plating vessel 61a to 61d. Therefore, the plating liquid cannot flow in the aforesaid manner, making the uniform plating impossible.

Further, the plating liquid stagnates around the abutment portion support member in the plating process. The plating liquid is liable to remain around the abutment portion support member to contaminate the wafer W after the completion of the plating process. In this embodiment, however, these problems are eliminated because the abutment portion 80a and the base ring 80b are composed of the rigid material.

The projection 80p of the cathode ring 80 is inserted in an upper portion of the recovery vessel 62a to 62d in the plating process.

With the wafer W in contact with the plating liquid, the distance between the wafer W and the mesh members 49 is adjusted within a range between 0.5 mm and 30 mm (preferably, 0.5 mm and 20 mm) in consideration of the flow of the plating liquid. More specifically, where the distance between the wafer W and the mesh members 49 is reduced as described above, the plating liquid is drawn by the rotating wafer W only in a limited region. This suppresses the eddy flow of the plating liquid which is unwanted for the plating. Thus, the film formed by the plating has a uniform thickness.

Figure 16:
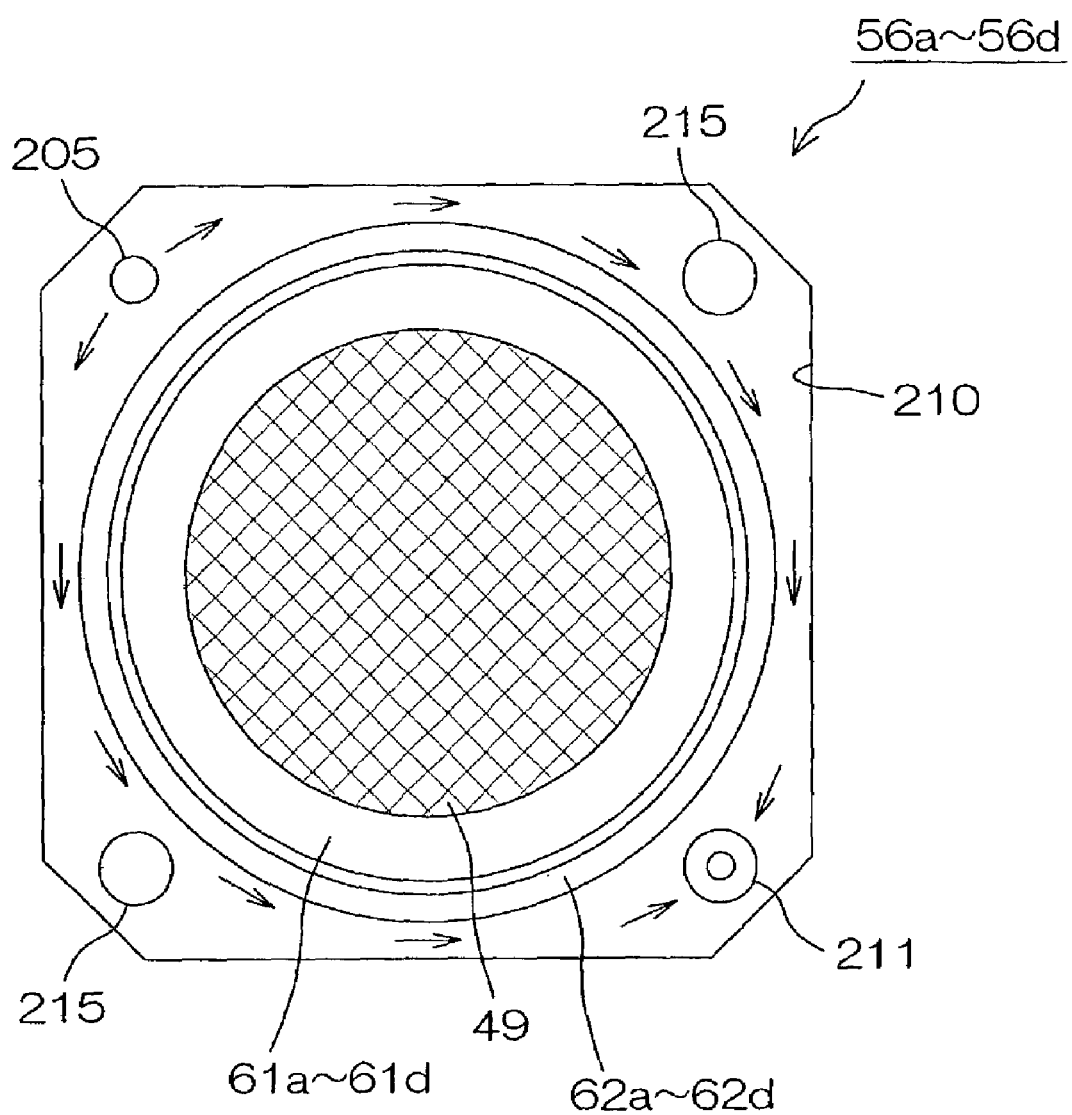
FIG. 16 is a schematic plan view of a plating cup.

FIG. 16 is a schematic plan view of the plating cup 56a to 56d. Referring to FIGS. 9 and 16, the cathode cleaning liquid collection vessel 210 has a generally square shape as seen in plan. A deionized water supply nozzle 205 for supplying deionized water to the cathode cleaning liquid collection vessel 210 and a liquid trap 211 for trapping the liquid in the cathode cleaning liquid collection vessel 210 are provided in one pair of opposed corner portions in the cathode cleaning liquid collection vessel 210. The cathode cleaning liquid collected in the cathode cleaning liquid collection vessel 210 through the fluid channels 80f formed in the cathode ring 80 (see FIG. 12) is washed away into the liquid trap 211 by the deionized water supplied from the deionized water supply nozzle 205.

The deionized water supply nozzle 205 may be obviated, so that only the cathode cleaning liquid flows through the cathode cleaning liquid collection vessel 210 into the liquid trap 211.

Air outlet pipes 215 are provided in the other pair of opposed corner portions (provided with neither the deionized water supply nozzle 205 nor the liquid trap 211) in the cathode cleaning liquid collection vessel 210 in communication with the cathode cleaning liquid collection vessel 210.

Figure 17:
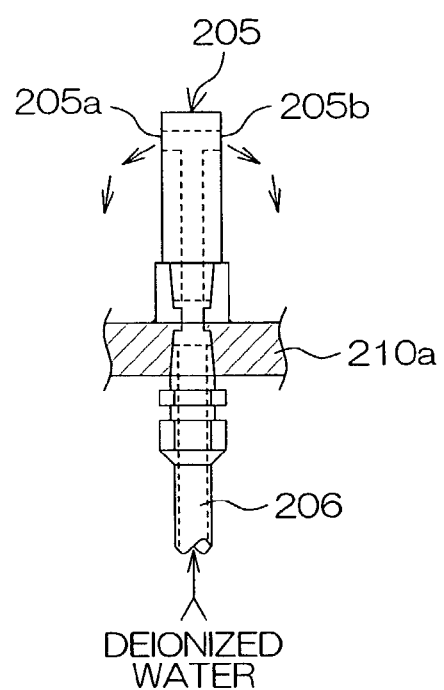
FIG. 17 is a schematic sectional view illustrating a portion around a deionized water supply nozzle.

FIG. 17 is a schematic sectional view illustrating a portion around the deionized water supply nozzle 205. The deionized water supply nozzle 205 is provided upright on the bottom 210a of the cathode cleaning liquid collection vessel 210, and has two openings 205a, 205b laterally opening at a predetermined height from the bottom 210a. The openings 205a, 205b open in opposite directions.

A deionized water pipe 206 is attached to the bottom 210a in communication with the deionized water supply nozzle 205 so as to supply deionized water to the deionized water supply nozzle 205. The deionized water is discharged from the openings 205a, 205b of the deionized water supply nozzle 205 toward the two air outlet pipes 215 (see FIG. 16).

Figure 18:
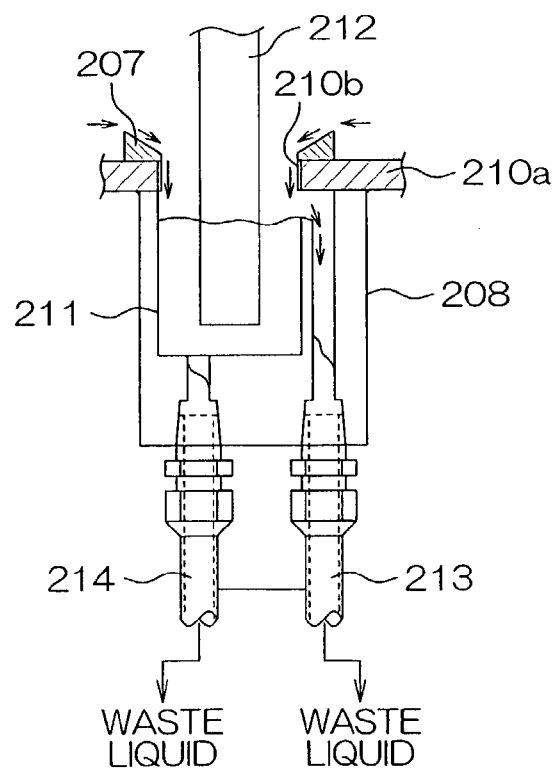
FIG. 18 is a schematic sectional view illustrating a portion around a liquid trap.

FIG. 18 is a schematic sectional view illustrating a portion around the liquid trap 211. The liquid trap 211 is attached to a lower side of the bottom 210a. A liquid drain port 210b is provided in the bottom 210a, and an annular projection 207 having a small height is provided around the liquid drain port 210b on an upper side of the bottom 210a. The liquid in the cathode cleaning liquid collection vessel 210 flows into the liquid trap 211 through the liquid drain port 210b when the liquid surface is higher than the annular projection 207.

A conductivity meter 212 is inserted in the liquid trap 211. Thus, the electrical conductivity of the liquid trapped in the liquid trap 211 can be measured. An output signal of the conductivity meter 212 is inputted to the system controller 155 (see FIG. 9).

An overflow pipe 213 extends from an upper edge portion of a side wall of the liquid trap 211, and a drain pipe 214 extends from the bottom of the liquid trap 211. During the plating process, the flow channel of the drain pipe 214 is closed, so that the liquid (the cathode cleaning liquid and the like) flowing into the cathode cleaning liquid collection vessel 210 fills the liquid trap 211 and overflows through the overflow pipe 213. When the plating unit 20a to 20d is not in use, the flow channel of the drain pipe 214 is opened to drain the liquid from the liquid trap 211.

An outer vessel 208 is attached to the lower side of the bottom 210a. The liquid trap 211 and parts of the overflow pipe 213 and the drain pipe 214 adjacent to junctions with the liquid trap 211 are accommodated in the outer vessel 208.

Figure 19:
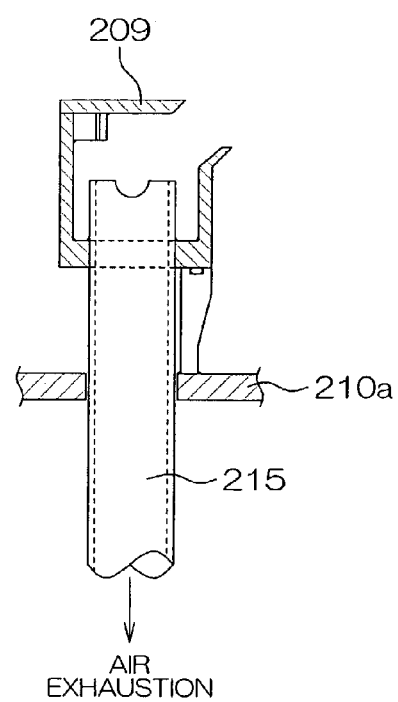
FIG. 19 is a schematic sectional view illustrating a portion around a junction between an air outlet pipe and a cathode cleaning liquid collection vessel.

FIG. 19 is a schematic sectional view illustrating a portion around a junction between the air outlet pipe 215 and the cathode cleaning liquid collection vessel 210. The air outlet pipe 215 is introduced into the cathode cleaning liquid collection vessel 210 through the bottom 210a. A hood 209 is attached to an end of the air outlet pipe 215. The hood 209 has an opening formed in an upper portion of a side wall thereof, but covers an upper side of an open end of the air outlet pipe 215. Thus, the liquid such as the cathode cleaning liquid is less liable to enter the air outlet pipe 215.

Gas can be exhausted from the plating cup 56a to 56d through the air outlet pipes 215. Thus, air possibly exposed to the plating liquid in the plating cup 56a to 56d can be exhausted to the outside through the cathode cleaning liquid collection vessel 210 and the air outlet pipes 215.

Figure 20:
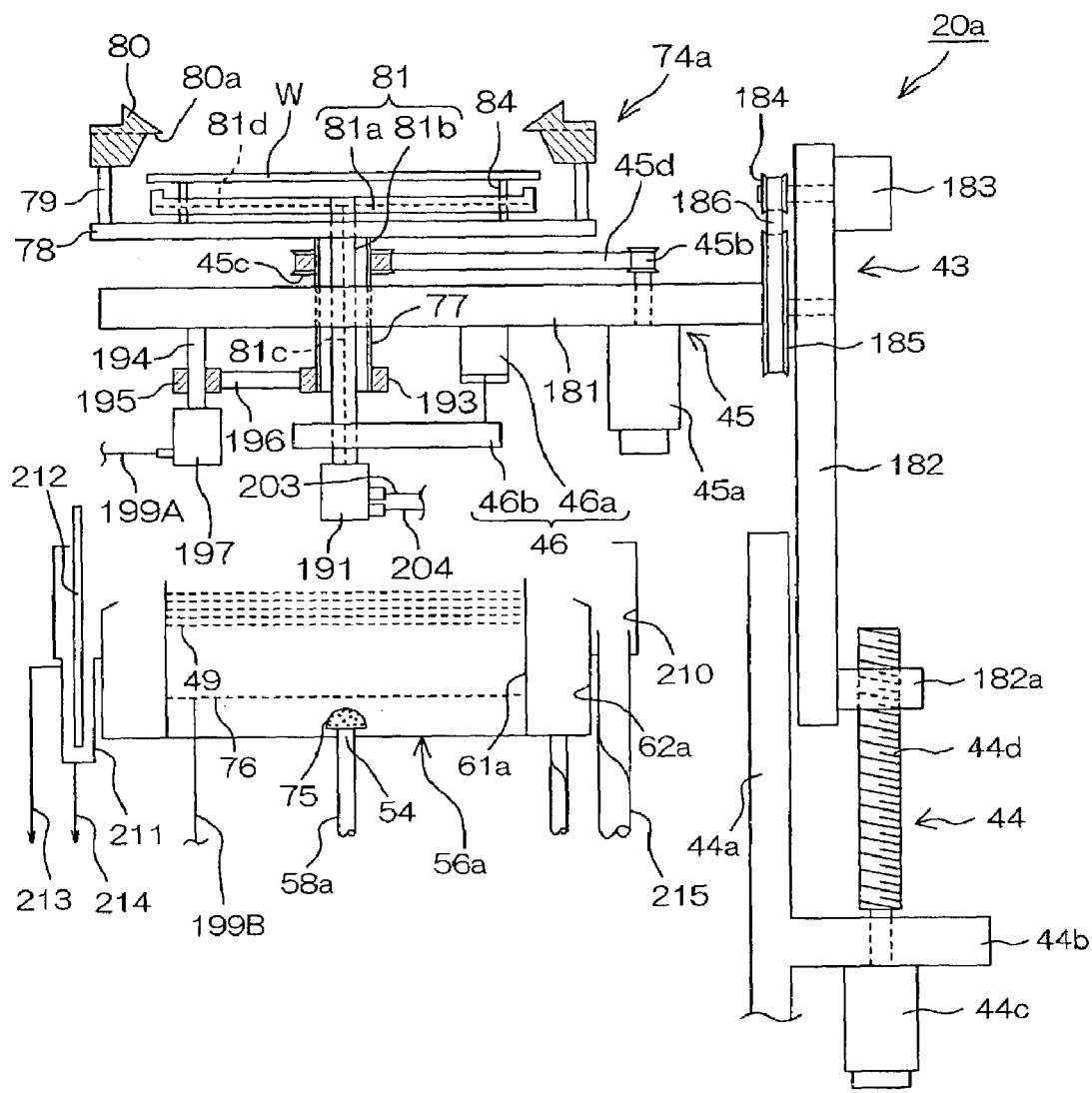
FIG. 20 is a schematic sectional view illustrating the plating unit with the spin base facing upward.

Next, an explanation will be given to the plating process to be performed by the plating section 12. Referring to FIG. 9, the system controller 155 first controls the inversion driving section 43 to invert any of the wafer holding/rotating mechanisms 74a to 74d (herein assumed to be the wafer holding/rotating mechanism 74a) with the wafer back side press plate 81a thereof facing upward. Further, the system controller 155 controls the susceptor movement mechanism 46 to move the wafer back side press plate 81a toward the rotary pipe 77, so that the wafer transfer pins 84 project out through the wafer back side press plate 81a. This state is shown in FIG. 20.

The rotation angular position of the spin base 78 is adjusted so that a circumferential portion of the spin base 78 having a wider support post interval (see FIG. 13(a)) is positioned in opposed relation to the second transport path 15. The spin base 78 is kept at the rotation angular position by a retention torque of the second motor 45a.

On the other hand, an untreated wafer W is taken out of the cassette C by means of the retractable arm 41 or the retractable arm 42 of the transport robot TR (see FIGS. 5(a) to 5(c)). The wafer W is loaded onto the wafer transfer pins 84 through the space between the support posts 79 by the transport robot TR with the center of the wafer W coinciding with the center axis of the rotary pipe 77 (see FIG. 13(a)). In this state, the to-be-treated surface of the wafer W faces upward.

Then, the system controller 155 controls the susceptor movement mechanism 46 to move the wafer back side press plate 81a upward apart from the rotary pipe 77. Thus, the projection 81e of the wafer back side press plate 81a presses the peripheral edge portion of the lower (back) surface of the wafer W, and the peripheral edge portion of the upper surface of the wafer W is pressed against the abutment portion 80a of the cathode ring 80. That is, the wafer W is held between the wafer back side press plate 81a and the abutment portion 80a.

At this time, the projection 81e of the soft material is resiliently deformed, and the abutment portion 80a is brought into intimate contact with the entire peripheral edge portion of the wafer W. That is, the peripheral edge portion of the upper surface of the wafer W is sealed by the sealing surface 80s of the abutment portion 80a. Thus, the areas of the wafer W and the cathode ring 80 to be brought into contact with the plating liquid are limited. At the same time, the cathode 83 is biased into contact with the peripheral edge portion of the upper surface (to-be-treated surface) of the wafer W.

The system controller 155 controls the inversion driving section 43 to invert the wafer holding/rotating mechanism 74a so that the wafer W faces downward. Then, the pump P1 is actuated under the control of the system controller 155 to supply the plating liquid into the plating vessel 61a at a flow rate of about 10 l/min (see FIG. 7). Thus, the plating vessel 61a is filled with the plating liquid, which is slightly raised from the edge of the plating vessel 61a to overflow into the recovery vessel 62a.

In turn, the system controller 155 controls the lift mechanism 44 to lower the wafer holding/rotating mechanism 74a. When the distance between the lower surface of the wafer W and the surface of the plating liquid is reduced to several millimeters, the system controller 155 controls the plating power source 82 to apply a first voltage between the anode 76 and the cathode 83, and the lowering rate of the wafer holding/rotating mechanism 74a is reduced (e.g., to about 50 mm/sec to about 0.1 mm/sec).

Thus, the lower surface of the wafer W is slowly brought into contact with the surface of the plating liquid filled in the plating vessel 61a. Thus, a portion of the lower surface of the wafer W inward of the sealing surface 80s of the abutment portion 80a is entirely kept in contact with the plating liquid. That is, air present between the wafer W and the plating liquid is allowed to easily escape by slowly bringing the lower surface of the wafer W into contact with the plating liquid.

Thus, the contact of the wafer W with the plating liquid is completed. Then, the system controller 155 controls the lift mechanism 44 to stop lowering the wafer holding/rotating mechanism 74a. In the aforesaid process, a period from the start of the contact of the wafer W with the plating liquid to the completion of the contact should be such that the seed layer formed on the lower surface of the wafer W is hardly dissolved in the plating liquid. With the wafer W in contact with the plating liquid, the distance between the upper edge of the plating vessel 61*a* and the to-be-treated surface of the wafer W is, for example, about 0.3 mm to about 1 mm, and the cathode ring 80 is loosely fitted around the upper edge of the plating vessel 61*a*.

Since the upper edge of the plating vessel 61*a* is located adjacent the to-be-treated surface of the wafer W as described above, the plating liquid can be kept in contact with the to-be-treated surface of the wafer W ranging from the center to the peripheral portion abutting against the abutment portion 80*a*. Thus, the uniformity in the thickness of the film formed by the plating is improved. The plating liquid flows in the form of a laminar flow from the center to the periphery of the wafer W in the vicinity of the interface of the wafer W, and then flows into the plating liquid recovery vessel 62*a* through a gap between the upper edge of the plating vessel 61*a* and the wafer W.

Even if air bubbles are trapped between the wafer W and the plating liquid, the air bubbles flow out of the plating vessel 61*a* together with the plating liquid. Since the angle formed between the lower surface of the wafer W and the inclined surface 80*g* is obtuse (see FIG. 12), the air bubbles can easily be expelled out of the plating vessel 61*a*. The laminar flow of the plating liquid occurring in the vicinity of the lower surface of the wafer W and the absence of the air bubbles under the lower surface of the wafer W make it possible to form a uniform film by the plating.

Subsequently, the system controller 155 controls the rotative driving mechanism 45 to rotate the wafer W at a relatively low rotation speed (e.g., 10 rpm to 100 rpm), and then controls the plating power source 82 to apply a second voltage (plating voltage) between the anode 76 and the cathode 83 for several minutes. The second voltage is set for electrical energization of the anode 76 and the cathode 83 according to a predetermined electric current pattern. Further, the valve 201V is opened under the control of the system controller 155 to introduce the cathode cleaning liquid into the fluid channels 81*c*, 81*d*.

Electrons are donated to copper ions in the plating liquid in the interface between the plating liquid and the lower surface of the wafer W connected to the cathode 83 by the application of the second voltage between the anode 76 and the cathode 83, so that copper atoms are deposited on the lower surface of the wafer W. That is, the lower surface of the wafer W is plated with copper. The plating liquid and the wafer W are moved relative to each other by the rotation of the wafer W, whereby the uniformity of the plating of the wafer W is improved.

Since the wafer W has an outer diameter virtually equal to the inner diameter of the plating vessel 61*a* and the anode 76 virtually covers the entire plating vessel 61*a* as seen in plan, a generally uniform electric field is formed between the anode 76 and the seed layer formed on the lower surface of the wafer W. Thus, the copper film formed by the plating has a uniform thickness.

Iron ions as an oxidizing/reducing agent are present in the form of divalent and trivalent iron ions in the plating liquid. The copper supply source (copper tube) housed in the major constituent managing section 2 (see FIG. 1) is deprived of electrons by the trivalent iron ions to release copper ions, while the trivalent iron ions are turned into divalent iron ions. On the other hand, the divalent iron ions donate electrons to the anode 76 thereby to be turned into trivalent iron ions.

In this embodiment, the mesh anode 76 has a sufficiently great surface area (e.g., a surface area two to ten times the area to be plated). Further, the plating liquid can be applied to the entire anode 76 at a sufficiently high flow rate by the shower head 75. Thus, a sufficient amount of divalent iron ions can be supplied to the anode 76 to promote the reaction in which the divalent iron ions donate electrons to the anode 76 thereby to be turned into trivalent iron ions.

Thus, the iron ions cyclically experience the oxidization and the reduction, so that the amount of electrons transferred between the plating liquid and the anode 76 is virtually balanced with the amount of electrons transferred between the cathode 83 (the lower surface of the wafer W) and the plating liquid.

Therefore, the plating process is free from bubbles of active oxygen, which may otherwise be generated when the oxidizing/reducing agent is not used. Thus, oxidative decomposition of the additives contained in the plating liquid can be retarded. Further, it is possible to eliminate the possibility that the oxygen bubbles adhere on the lower surface of the wafer W and fill the fine holes or grooves formed in the surface (lower surface) of the wafer W to hinder the plating.

The plating liquid is drawn by the rotating wafer W in the vicinity of the interface between the plating liquid and the wafer W, and subjected to a centrifugal force. However, the plating liquid can assuredly be introduced into the recovery vessel 62*a* by the projection 80*p* of the cathode ring 80.

The cathode cleaning liquid introduced into the fluid channels 81*c*, 81*d* flows out of the peripheral openings of the wafer back side press plate 81*a*, and is introduced into the cathode cleaning liquid collection vessel 210 through the fluid channels 80*f* (see FIG. 12). Thus, the cathode 83 is cleaned with the cathode cleaning liquid. At this time, the cathode cleaning liquid flows over the peripheral edge portion of the wafer W, but the particles generated by the sliding components of the rotary joint 191 are not introduced into the fluid channels 81*c*, 81*d*. Hence, there is no possibility that the particles adhere on the wafer W.

The plating liquid is present opposite from the cathode 83 with respect to the wafer W and the abutment portion 80*a*. That is, the cathode 83 contacts the portion of the wafer W which is limited in contact with the plating liquid by the abutment portion 80*a*. Therefore, the plating liquid does not flow to the cathode 83 if the peripheral edge portion of the wafer W is sufficiently sealed by the sealing surface 80*s* of the abutment portion 80*a*. On the other hand, if the sealing between the wafer W and the abutment portion 80*a* is insufficient, the plating liquid flows into a gap between the wafer W and the abutment portion 80*a* to reach the cathode 83.

If the plating process is continued with the plating liquid left leaking through the gap between the wafer W and the abutment portion 80*a*, an unintended portion of the lower surface of the wafer W is plated. This influences the thickness of the film formed on the predetermined portion of the lower surface of the wafer W by the plating so that the film formed by the plating has a smaller thickness in the vicinity of the abutment portion 80*a* than in the other region. Therefore, the wafer W is non-uniformly plated. If the electrically energized cathode 83 is kept in contact with the plating liquid, the cathode 83 is plated, making it impossible to properly electrically energize the wafer W.

However, the plating liquid reaching the cathode 83 is washed away by the cathode cleaning liquid, so that the cathode 83 is kept clean. Then, the cathode cleaning liquid containing the plating liquid flows into the liquid trap 211 from the cathode cleaning liquid collection vessel 210.

The cathode cleaning liquid and the mixture of the cathode cleaning liquid and the plating liquid differ in electrical conductivity. Where the cathode cleaning liquid is deionized water, for example, the electrical conductivity of the cathode cleaning liquid is drastically increased by the plating liquid slightly mixed in the cathode cleaning liquid. Therefore, a threshold is properly set for the electrical conductivity measured by the conductivity meter 212, so that the system controller 155 can detect the leakage of the plating liquid from the gap between the wafer W and the abutment portion 80a on the basis of the output signal of the conductivity meter 212.

Upon detection of the leakage of the plating liquid, the operation of the plating unit 20a is automatically interrupted under the control of the system controller 155, and the operator is informed of the leakage of the plating liquid. This prevents continuation of uneven plating of the wafer W to avoid continuous production of defective products, and prevents the cathode 83 from being continuously plated.

The cathode cleaning liquid (liquid) maybe supplied to a region other than the cathode 83 where the intrusion of the plating liquid is prevented (restricted). Even in this case, the leakage of the plating liquid can be detected on the basis of the output signal of the conductivity meter 212 if the plating liquid is leaked from the gap between the wafer W and the abutment portion 80a and enters the fluid channel.

After the plating process is performed on the wafer W for a predetermined period, the system controller 155 controls the plating power source 82 to stop the energization between the anode 76 and the cathode 83, and controls the lift mechanism 44 to lift the wafer W so that the lower surface of the wafer W is spaced several millimeters apart from the surface of the plating liquid filled in the plating vessel 61a.

Further, the system controller 155 controls the rotative driving mechanism 45 to rotate the wafer W at a relatively high speed (e.g., 200 rpm to 1000 rpm) for several tens seconds. Thus, the plating liquid is laterally spun off from the lower surface of the wafer W. At this time, the plating liquid spun off from the lower surface of the wafer W is also introduced into the recovery vessel 62a to 62d. In this process, the plated surface of the wafer W is kept covered with a film of the plating liquid rather than completely dried. Thus, the plated surface of the wafer W is prevented from being corroded during transportation of the wafer W.

Upon completion of the energization by the plating power source 82, the valve 201V is closed and the valve 202V is opened under the control of the system controller 155. Thus, the cathode cleaning liquid remaining in the fluid channels 81c, 81d is purged by nitrogen gas, and the cathode cleaning liquid in the fluid channels 80f is laterally drained by a centrifugal force. The cathode cleaning liquid remaining in the leak pipe 204 maybe sucked to be drained by the ejector not shown.

In turn, the system controller 155 controls the rotative driving mechanism 45 to stop the rotation of the wafer W, and controls the lift mechanism 44 to lift the wafer holding/rotating mechanism 74a to a predetermined position. Then, the system controller 155 controls the inversion driving section 43 to invert the wafer holding/rotating mechanism 74a so that the wafer W faces upward. The rotation angular position of the spin base 78 is adjusted so that the circumferential portion of the spin base 78 having a wider support post interval is positioned in opposed relation to the second transport path 15. The spin base 78 is kept at the rotation angular position by a retention torque of the second motor 45a.

Thereafter, the system controller 155 controls the susceptor movement mechanism 46 to move the wafer back side press plate 81a down toward the rotary pipe 77, whereby the wafer W is disengaged from the wafer back side press plate 81a. At this time, the wafer W is smoothly released from the sealing surface 80s by the resilience of the cathode 83, so that the wafer W is supported on the wafer transfer pins 84 as shown in FIG. 20. Since the cathode cleaning liquid is not present in the fluid channels 80f, the cathode cleaning liquid does not drip on the upper surface (plated surface) of the wafer W.

After the wafer W is moved apart from the abutment portion 80a, the plating liquid remaining on the plated surface of the wafer W is sucked through a gap between the sealing surface 80s and the wafer W, so that the contact portions 83c of the cathode 83 are contaminated with the plating liquid. However, the plating liquid adhering to the contact portions 83c is rinsed off with the cathode cleaning liquid before and during the plating process to be performed on the next wafer W. Thus, the next plating process can be performed with the contact portions 83c kept clean.

The treated wafer W is unloaded through the space between the support posts 79 by the retractable arm 42 or the retractable arm 41 of the transport robot TR. Thus, the plating process on the single wafer W is completed.

The plating process may be performed simultaneously in the plating cups 56a to 56d by simultaneously actuating the four pumps P1 to P4, or in some of the plating cups 56a to 56d by actuating corresponding ones of the pumps P1 to P4.

Figure 21:
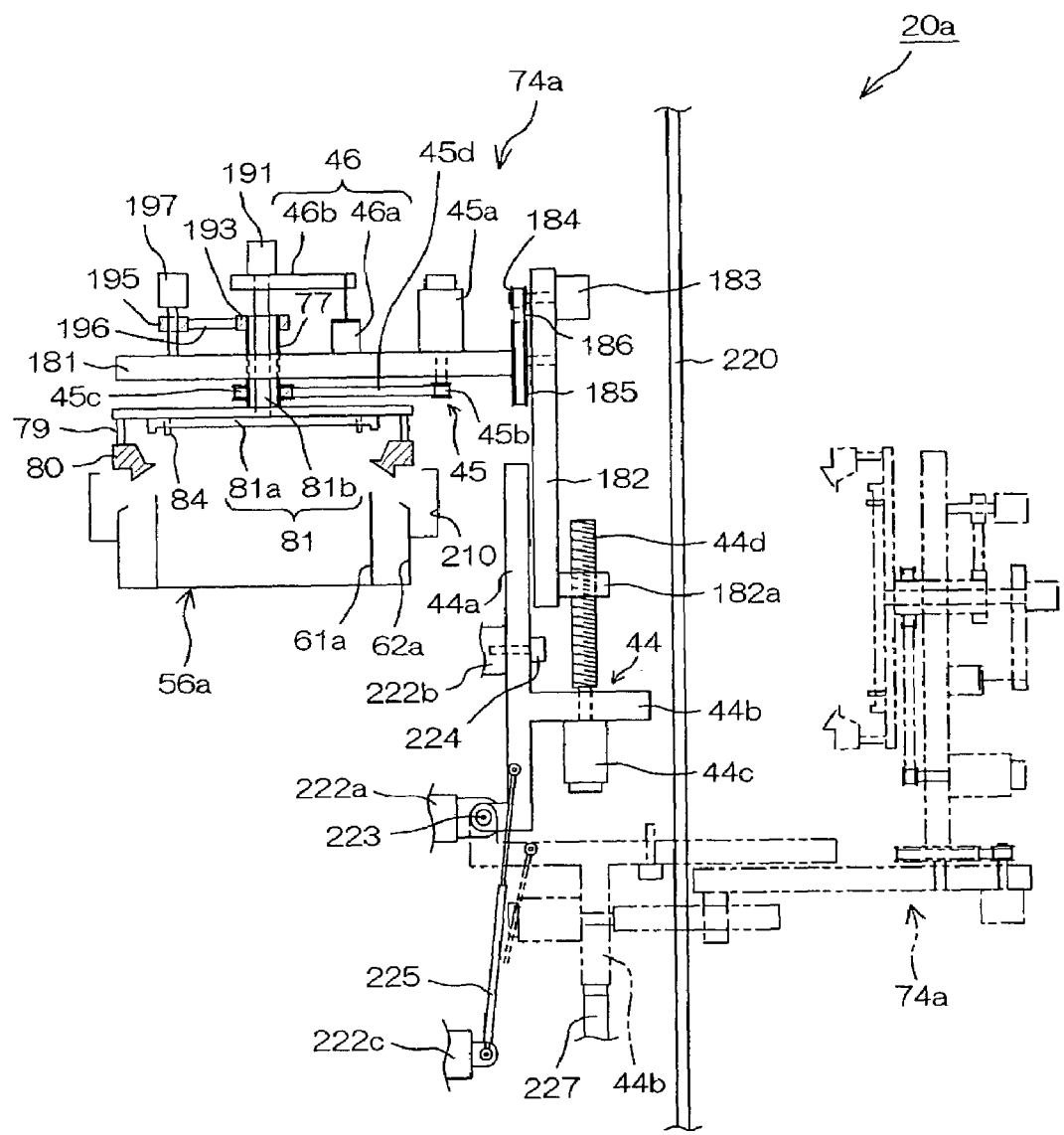
FIG. 21 is a schematic side view of the plating unit.

FIG. 21 is a schematic side view of the plating unit 20a. With reference to FIG. 21, an explanation will be given to an operation to be performed for the maintenance of the plating unit 20a. Since the plating units 20b to 20d have the same construction as the plating unit 20a, the maintenance operation can be performed in the same manner.

An outer cover 220 is provided as a part of the barrier wall of the enclosure 30 on a side of the plating unit 20a opposite from the second transport path 15 (see FIG. 2). The outer cover 220 is removable from the enclosure 30. When the maintenance operation of the plating unit 20a is performed, the outer cover 220 is removed.

One end of the guide 44a of the lift mechanism 44 (a lower end of the guide 44a when located vertically) is hinged to a first frame 222a of the wafer treating section 1. Thus, the guide 44a is pivotal about a pivot axis 223 which extends generally horizontally and parallel to the length of the second transport path 15. The pivot shaft 223 is located closer to the outer cover 220 than the plating cup 56a at a lower position than the plating cup 56a.

The guide 44a can be fixed to a frame 222b of the wafer treating section 1 by a fixture screw 224. The position at which the guide 44a is fixed by the fixture screw 224 is higher than the position of the pivot axis 223. With the guide 44a fixed to the frame 222b by the fixture screw 224, the vertical base 182 is located vertically, and the wafer holding/rotating mechanism 74a is located above the plating cup 56a. In this state, the plating process is performed.

The pivoting of the guide 44a is restricted by the frame 222b so as not to be inclined toward the plating cup 56a. That is, the guide 44a is only permitted to pivot apart from the plating cup 56a from a vertical position.

A gas damper 225 is pivotally coupled at one end thereof to a part of the guide 44a adjacent to the pivot shaft 223. The gas damper 225 is pivotally coupled at the other end thereof to a frame 222c of the wafer treating section 1. The coupling between the frame 222c and the gas damper 225 is located at a lower position than the coupling between the frame 222a and the gas damper 225 and the pivot shaft 223. The gas damper 225 includes a cylinder and a piston, and is designed so that the piston resists a force exerted thereon inwardly of the cylinder by the pressure of gas charged in the cylinder. A piston end of the gas damper 225 is attached to the guide 44a, while a cylinder end of the gas damper 225 is attached to the frame 222c.

In the lift mechanism 44, a support member 44b projects from the guide 44a toward the outer cover 220 when the guide 44a is located vertically. When the wafer holding/rotating mechanism 74a and the lift mechanism 44 are pivoted about 90 degrees around the pivot shaft 223 from the vertical position of the guide 44a, an end of he support member 44b abuts against a stopper 227 provided on the frame of the wafer treating section 1 for prevention of further pivoting of the guide 44a. In this state, the guide 44a is kept generally horizontally. A portion of the stopper 227 to be brought into abutment against the support member 44b is covered with a rubber, so that a shock exerted thereon can be alleviated when the support member 44b abuts against the stopper 227.

When the maintenance operation of the plating unit 20a is performed, the outer cover 220 is removed with the plating process stopped. Thus, the operator can perform the maintenance operation on the side of the apparatus where the outer cover has been attached. Subsequently, the fixture screw 224 is removed, and the wafer holding/rotating mechanism 74a is gradually inclined toward the operator by pivoting the guide 44a about the pivot shaft 223.

At this time, the gas damper 225 is operative so that the piston is forced into the cylinder. Therefore, only a small force is required for the operator to incline the wafer holding/rotating mechanism 74a with the aid of the resilient force of the gas damper 225. Even if the operator inadvertently lets his hands off from the wafer holding/rotating mechanism 74a, the resilient force of the gas damper 225 prevents the wafer holding/rotating mechanism 74a from abruptly falling down.

With the guide 44a kept generally horizontally, the support member 44b abuts against the stopper 227, so that the wafer holding/rotating mechanism 74a cannot be moved further more. In this state, the wafer holding/rotating mechanism 74a projects laterally from the wafer treating section 1, so that the top of the plating cup 56a is open. This state is illustrated by a two-dot-and-dash line in FIG. 21. Thus, the operator can easily access an intended portion, and easily perform the maintenance operation.

Next, an explanation will be given to the maintenance of the plating cup 56a to 56d. The plating process should be performed with the rotation axis (center axis) of the cathode ring 80 coinciding with the center axis of the plating vessel 61a to 61d. This is because the cathode ring 80 is spaced a very small distance from the upper edge of the plating vessel 61a to 61d in the plating process and, hence, the plating vessel 61a to 61d interferes with the cathode ring 80 if the rotation axis (center axis) of the cathode ring 80 is offset from the center axis of the plating vessel 61a to 61d (see FIG. 12). The position and attitude of the plating cup 56a to 56d is properly adjusted so that the rotation axis (center axis) of the cathode ring 80 coincides with the center axis of the plating vessel 61a to 61d.

Unless the upper edge of the plating vessel 61a to 61d is present within a generally horizontal plane, the plating liquid cannot be raised from the entire edge of the plating vessel 61a to 61d so as to be brought into contact with the wafer W. In this case, the wafer W held generally horizontally and the upper edge of the plating vessel 61a to 61d cannot be spaced a generally constant distance from each other in adjacent relation by the wafer holding/rotating mechanism 74a to 74d.

Therefore, the upper edge of the plating vessel 61a to 61d, if not kept horizontal, should be leveled horizontally.

Figure 22:
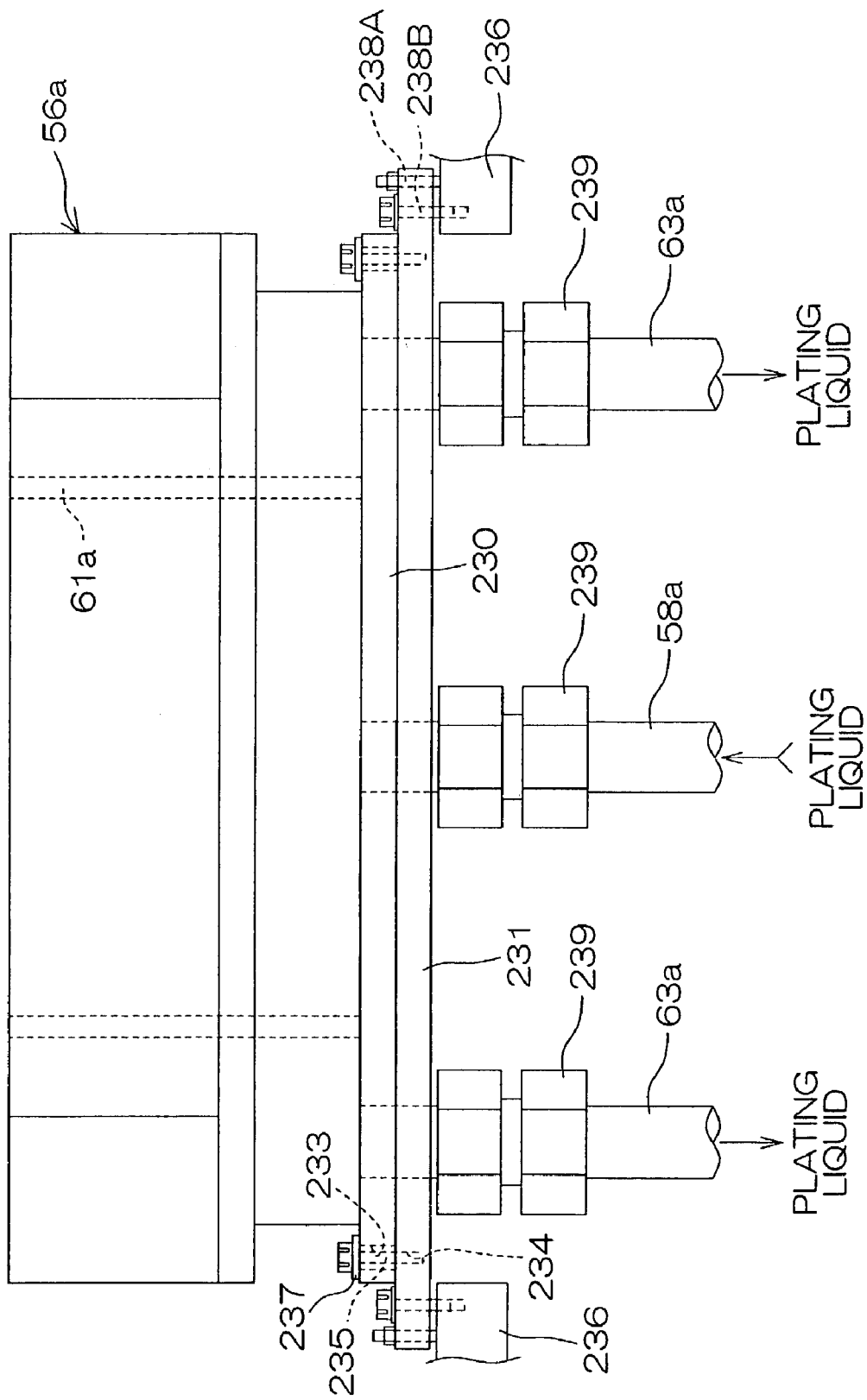
FIG. 22 is a schematic side view of the plating cup.

FIG. 22 is a schematic side view of the plating cup 56a. With reference to FIG. 22, an explanation will be given to how to adjust the position and attitude of the plating cup 56a and how to level the upper edge of the plating cup 56a within a generally horizontal plane. Since the plating cups 56b to 56d have the same construction as the plating cup 56a, the adjustment can be achieved in the same manner.

A first planar base plate 230 is unitarily fixed to the lower portion (bottom) of the plating cup 56a. The first base plate 230 is slightly greater in size than the bottom face of the plating cup 56a as viewed in plan, and laterally projects from the bottom of the plating cup 56a. A second planar base plate 231 having a slightly greater size than the first base plate 230 as viewed in plan is attached to the lower side of the first base plate 230 (opposite from the plating cup 56a). The second base plate 231 is fixed to a frame 236 of the wafer treating section 1.

The first base plate 230 and the second base plate 231 each have through-holes extending through the thickness thereof, and the branch liquid supply pipe 58a and the branch return pipes 63a extend through these through-holes. The branch liquid supply pipe 58a and the branch return pipes 63a are connected to the plating cup 56a via joints 239 of a resin (e.g., a fluororesin). The joints 239 facilitate the attachment and detachment of the branch liquid supply pipe 58a and the branch return pipes 63a with respect to the plating cup 56a.

The first base plate 230 has at least three fixture holes 233 formed in a peripheral edge portion thereof as extending through the thickness thereof. The second base plate 231 has inner thread portions provided therein in association with the fixture holes 233. Fixture screws 235 having outer thread portions are respectively inserted through the fixture holes 233 and tightened into the inner thread portions 234 formed in the second base plate 231. Thus, the first base plate 230 is fixed to the second base plate 231.

The inner diameter of the fixture holes 233 is greater than the outer diameter of the fixture screws 235. For example, the fixture holes 233 each have an inner diameter of about 10 mm, while the fixture screws 235 each have an outer diameter of about 6 mm. In this case, the first base plate 230 is movable by about 4 mm in any directions within the plane of the first base plate 230. In this case, washers 237 each having an outer diameter of 18 mm, for example, are provided between screw heads of the fixture screws 235 and the first base plate 230 to prevent the screw heads of the fixture screws 235 from falling into the fixture holes 233.

With the fixture screws loosened, the first base plate 230 can be moved in any directions within the plane of the first base plate 230 to adjust the horizontal position of the plating vessel 61a.

The second base plate 231 is fixed to the frame 236 by at least three pairs of push screws 238A and pull screws 238B arranged in circumferentially spaced relation. The heights of the second base plate 231 from the frame 236 at the positions of the respective pairs of the push screws 238A and the pull screws 238B can be adjusted by properly adjusting the push screws 238A and the pull screws 238B. Thus, the inclination of the second base plate 231 can be adjusted. Therefore, the attitude of the plating cup 56a can be adjusted.

In general, the upper edge of the plating vessel 61a is leveled within a generally horizontal plane by attaching the first base plate 230 to the horizontally leveled second base plate 231 in intimate contact with the second base plate 231. For the leveling of the upper edge of the plating vessel 61a, a leveler is first placed on the second base plate 231 with the plating vessel 61a removed, and then the second base plate 231 is leveled horizontally. Thereafter, the first base plate 230 is attached to the second base plate 231 in intimate contact with the second base plate 231. Thus, the upper edge of the plating vessel 61a is leveled within a generally horizontal plane.

At this time, the fixture screws 235 are loosened. In turn, the wafer holding/rotating mechanism 74a is lowered, and the first base plate 230 is moved with respect to the second base plate 231 so that the cathode ring 80 is fitted around the upper edge of the plating vessel 61a. Thus, the horizontal position of the plating vessel 61a is adjusted.

In general, the rotation axis (center axis) of the cathode ring 80 and the center axis of the plating vessel 61a are adjusted generally parallel to each other with the wafer holding/rotating mechanism 74a and the plating cup 56a kept in opposed relation. Therefore, the plating vessel 61a is properly positioned in the aforesaid manner so that the center axis of the plating vessel 61a and the rotation axis (center axis) of the cathode ring 80 can virtually coincide with each other. With the plating vessel 61a thus properly positioned, the fixture screws 235 are tightened to fix the position of the plating vessel 61a.

In use of the plating cup 56a (plating vessel 61a) adjusted in the aforesaid manner, the upper edge of the plating vessel 61a and the wafer W held between the cathode ring 80 and the wafer holding/rotating mechanism 74a can be spaced a very small distance from each other in adjacent relation without interference. Since the plating liquid can be raised from the entire edge of the plating vessel 61a, the lower surface of the wafer W held by the wafer holding/rotating mechanism 74a can easily and generally entirely be brought into contact with the plating liquid.

Figure 23:
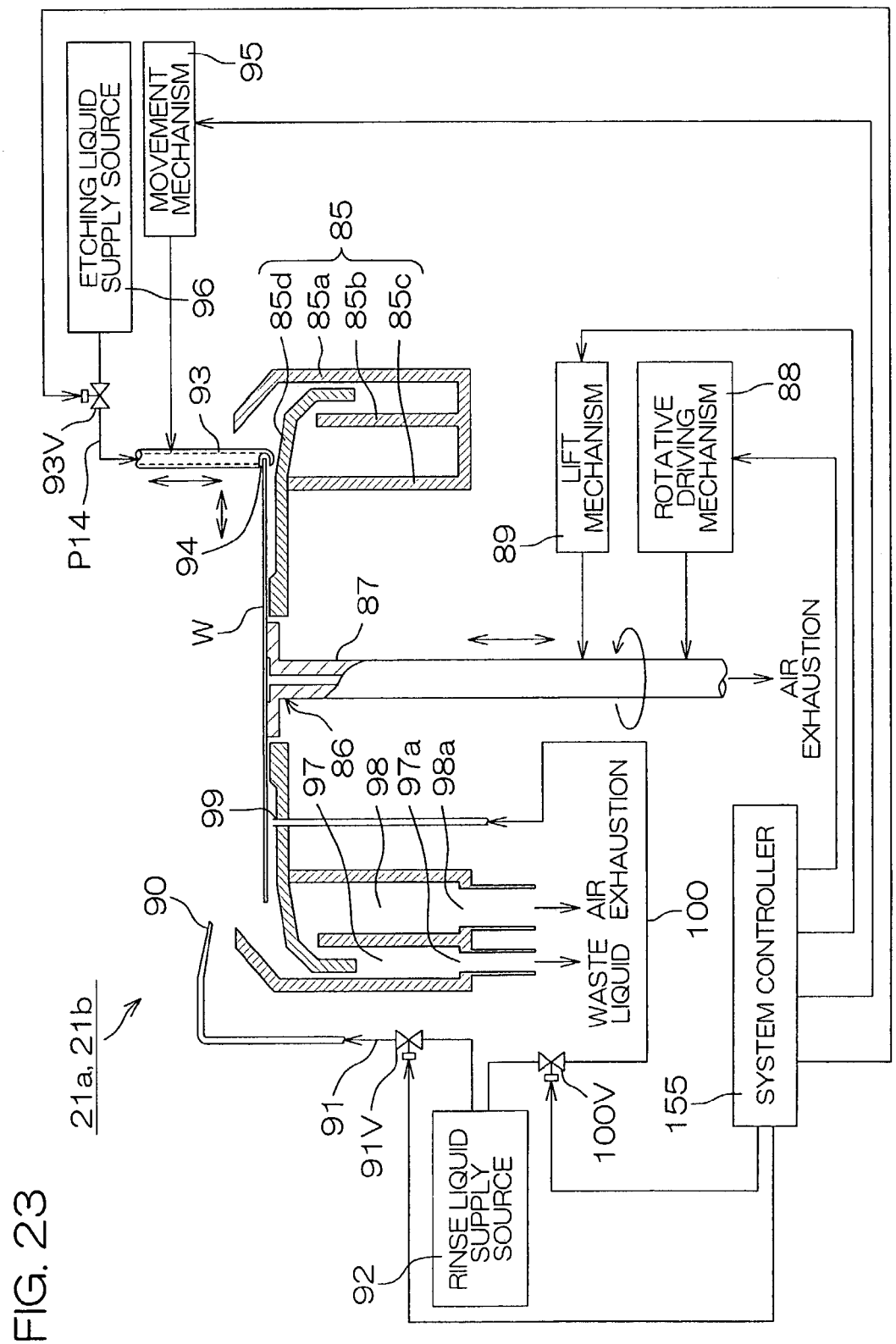
FIG. 23 is a schematic sectional view illustrating the construction of a bevel etching unit.

FIG. 23 is a schematic sectional view illustrating the common construction of the bevel etching units 21a, 21b.

A spin chuck 86 for generally horizontally holding and rotating the wafer W is provided in a generally cylindrical cup 85. The spin chuck 86 is adapted to hold the wafer W by sucking a center portion of the lower surface of the wafer W without contacting the peripheral edge of the wafer W. The spin chuck 86 has a vertical rotation shaft 87, and a rotative driving force is transmitted from a rotative driving mechanism 88 to the rotation shaft 87. A lift mechanism 89 for moving up and down the spin chuck 86 is coupled to the spin chuck 86, so that the spin chuck 86 can be brought into a state where its upper portion is accommodated in the cup 85 and into a state where its upper portion is located above an upper edge of the cup 85.

The cup 85 includes three cups 85a to 85c coaxially arranged. The outermost one of the cups 85a to 85c has an upper edge located at the highest position, and the middle cup 85b has an upper edge located at the lowest position. An annular treatment liquid guide plate 85d as seen in plan is coupled to an upper edge of the innermost cup 85c. An outer edge of the treatment liquid guide plate 85d is bent to be inserted into a space between the cup 85a and the cup 85b.

A treatment liquid collection vessel 97 having an open top is defined between the cup 85a and the cup 85b, and an air outlet vessel 98 is defined between the cup 85b and the cup 85c. A liquid drain port 97a is provided in the bottom of the treatment liquid collection vessel 97, and an air outlet port 98a is provided in the bottom of the air outlet vessel 98.

A rinse nozzle 90 is provided above the cup 85. A rinse liquid pipe 91 is connected in communication with the rinse nozzle 90, and a rinse liquid supply source 92 is connected to the rinse liquid pipe 91. A valve 91V is provided in the rinse liquid pipe 91. With the valve 91V being open, the rinse liquid can be discharged through the rinse nozzle 90 to be supplied to the upper surface of the wafer W held by the spin chuck 86.

Another rinse nozzle 99 extends through the treatment liquid guide plate 85d from the lower side. A rinse liquid pipe 100 is connected in communication with the rinse nozzle 99, and the rinse liquid supply source 92 is connected to the rinse liquid pipe 100. A valve 100V is provided in the rinse liquid pipe 100. With the valve 100V being open, the rinse liquid can be discharged through the rinse nozzle 99 to be supplied to the lower surface of the wafer W held by the spin chuck 86.

The rinse liquid may be, for example, deionized water. In this case, the rinse liquid (deionized water) can be supplied into the rinse liquid pipes 91, 100 through the deionized water pipe 32 (see FIG. 3) extending through the deionized water pipe introduction port 32h formed in the enclosure 30.

An etching pipe 93 is provided generally vertically above the cup 85. The etching pipe 93 has a groove 94 provided in a lower end portion thereof as opening horizontally toward the center of the cup 85 in association with the surface of the wafer W held by the spin chuck 86. The peripheral edge of the wafer W can be inserted in the groove 94. The inner space of the groove 94 and the inner space of the etching pipe 93 communicate with each other.

A movement mechanism 95 is coupled to the etching pipe 93. The etching pipe 93 can be moved vertically and radially of the cup 85 by the movement mechanism 95. Thus, the etching pipe 93 can be moved between a treatment position at which the peripheral edge of the wafer W is inserted in the groove 94 and a retracted position at which the etching pipe 93 is retracted from the treatment position apart from the wafer W. The etching pipe 93 can also be retracted laterally beyond the cup 85.

The etching pipe 93 is connected via the post-treatment agent pipe P14 to an etching liquid supply source 96 disposed in the post-treatment agent supplying section 4 (see FIG. 1) and containing the etching liquid. A valve 93V is provided in the post-treatment agent pipe P14 between the etching pipe 93 and the etching liquid supply source 96. With the valve 93V being open, the etching liquid can be supplied to the inner space of the groove 94. The flow rate of the etching liquid can also be adjusted by the valve 93V. The etching liquid may be, for example, a mixture of sulfuric acid, hydrogen peroxide aqueous solution and water.

The operations of the rotative driving mechanism 88, the lift mechanism 89 and the movement mechanism 95, and the opening and closing of the valves 91V, 100V, 93V are controlled by the system controller 155.

When the peripheral edge of the wafer W is to be etched by the bevel etching unit 21a, 21b, the system controller 155 first controls the movement mechanism 95 to retract the etching pipe 93 at the retracted position.

In turn, the system controller 155 controls the lift mechanism 89 to move up the spin chuck 86 so that the upper portion of the spin chuck 86 is located above the upper edge of the cup 85. The wafer W subjected to the plating process in the plating section 12 is loaded into the bevel etching unit 21a or 21b by the retractable arm 41 or the retractable arm 42 of the transport robot TR (see FIGS. 5(a) to 5(c)), and held by the spin chuck 86 by suction with the center of the wafer W coinciding with the center axis of the rotation shaft 87. The surface of the wafer W subjected to the plating process faces upward.

Thereafter, the system controller 155 controls the lift mechanism 89 to move down the spin chuck 86. Thus, the wafer W held by the spin chuck 86 is surrounded by the cup 85a. Then, the system controller 155 controls the rotative driving mechanism 88 to rotate the wafer W held by the spin chuck 86. The rotation speed of the wafer W is, for example, about 500 rpm.

In this state, the valves 91V and 100V are opened under the control of the system controller 155. Thus, the rinse liquid is supplied to the upper and lower surfaces of the wafer W from the rinse nozzles 90 and 99. The rinse liquid spreads toward the peripheral edge of the wafer W by a centrifugal force, and flows over the entire upper surface of the wafer W and the lower surface of the wafer W except a portion thereof in contact with the spin chuck 86. Thus, the wafer W is cleaned.

The rinse liquid is spun off laterally of the wafer W by the centrifugal force, and flows over the interior of the cup 85a and the upper surface of the treatment liquid guide plate 85d down into the treatment liquid collection vessel 97. The rinse liquid is introduced into a collection tank not shown through the liquid drain port 97a. Further, gas is exhausted from the cup 85 through the air outlet port 98a by an air exhauster system not shown. Thus, mist of the rinse liquid and the like are prevented from scattering out of the cup 85.

After the rinsing process is performed for a predetermined period, the valves 91V, 100V are closed under the control of the system controller 155. The wafer W is continuously rotated, whereby the rinse liquid remaining on the wafer W is mostly spun off.

Subsequently, the system controller 155 controls the movement mechanism 95 to move the etching pipe 93 to the treatment position. Thus, the peripheral edge of the wafer W is inserted in the groove 94 as shown in FIG. 23. At this time, the rotation speed of the wafer W may be, for example, about 500 rpm. Then, the valve 93V is opened under the control of the system controller 155. The flow rate of the etching liquid may be, for example, 20 ml/min. Thus, the etching liquid is supplied into the groove 94 from the etching liquid supply source 96. The etching liquid flows out of the groove 94, so that the groove 94 is virtually filled with the etching liquid.

Since the peripheral edge of the wafer W is inserted in the groove 94, a part of the thin copper film formed on the peripheral edge of the wafer W is dissolved by the etching liquid. With the wafer W being rotated, the peripheral edge of the wafer W is moved relative to the etching pipe 93 located at the treatment position. As a result, the entire peripheral edge of the wafer W is etched. An etching width is determined by an insertion depth of the wafer W in the groove 94, so that the etching process can accurately be performed with a desired etching width.

Like the rinse liquid, the etching liquid spun off laterally of the wafer W by a centrifugal force is once collected in the collection vessel 97, and then introduced into the collection tank not shown through the liquid drain port 97a. During this period, gas is continuously exhausted through the air outlet port 98a, so that mist of the etching liquid is prevented from scattering out of the cup 85.

After the etching liquid is continuously supplied for a predetermined period (e.g., several tens seconds) for the etching of the thin copper film on the peripheral edge of the wafer W, the valve 93V is closed under the control of the system controller 155 to stop the supply of the etching liquid to the groove 94. Thus, the etching process for etching the peripheral edge of the wafer W is completed in the absence of the etching liquid in the groove 94.

Thereafter, the valves 91V, 100V are opened again under the control of the system controller 155 to supply the rinse liquid to the surfaces of the wafer W. Thus, the etching liquid remaining on the peripheral edge portion of the wafer W is rinsed away with the rinse liquid. During this period, the system controller 155 controls the movement mechanism 95 to move the etching pipe 93 to the retracted position.

After the rinse liquid is continuously supplied for a predetermined period (e.g., about one minute), the valves 91V, 100V are closed under the control of the system controller 155 to stop the supply of the rinse liquid. The system controller 155 controls the rotative driving mechanism 88 to rotate the spin chuck 86 at a high rotation speed (e.g., about 1000 rpm) for a predetermined period (e.g., several tens seconds) for spinning off the rinse liquid from the wafer W for drying. Then, the rotation of the spin chuck 86 is stopped.

Subsequently, the system controller 155 controls the lift mechanism 89 to move up the spin chuck 86 so that the wafer W held by the spin chuck 86 is located above the upper edge of the cup 85. Then, the wafer W is released out of the suction-held state.

In turn, the treated wafer W is unloaded by the retractable arm 42 or the retractable arm 41 of the transport robot TR. Thus, the etching process for the etching of the peripheral edge of the single wafer W is completed. Since no thin copper film is present on the peripheral edge of the treated wafer W, there is no possibility that copper adheres on the substrate holder hand 41c, 42c (see FIG. 5(a)) when the peripheral edge of the wafer is held by the substrate holder hand 41c, 42c in the subsequent steps.

In this embodiment, the cup 85 is fixed, and the spin chuck 86 is adapted to be moved up and down by the lift mechanism 89. However, it is merely necessary to vertically move the spin chuck 86 and the cup 85 relative to each other. For example, the spin chuck 86 may vertically be fixed, and the cup 85 may be adapted to be moved up and down. Even in this case, the upper portion of the spin chuck 86 can be located above the upper edge of the cup 85, so that the wafer W can be loaded and unloaded by the retractable arm 41 or the retractable arm 42.

Figure 24:
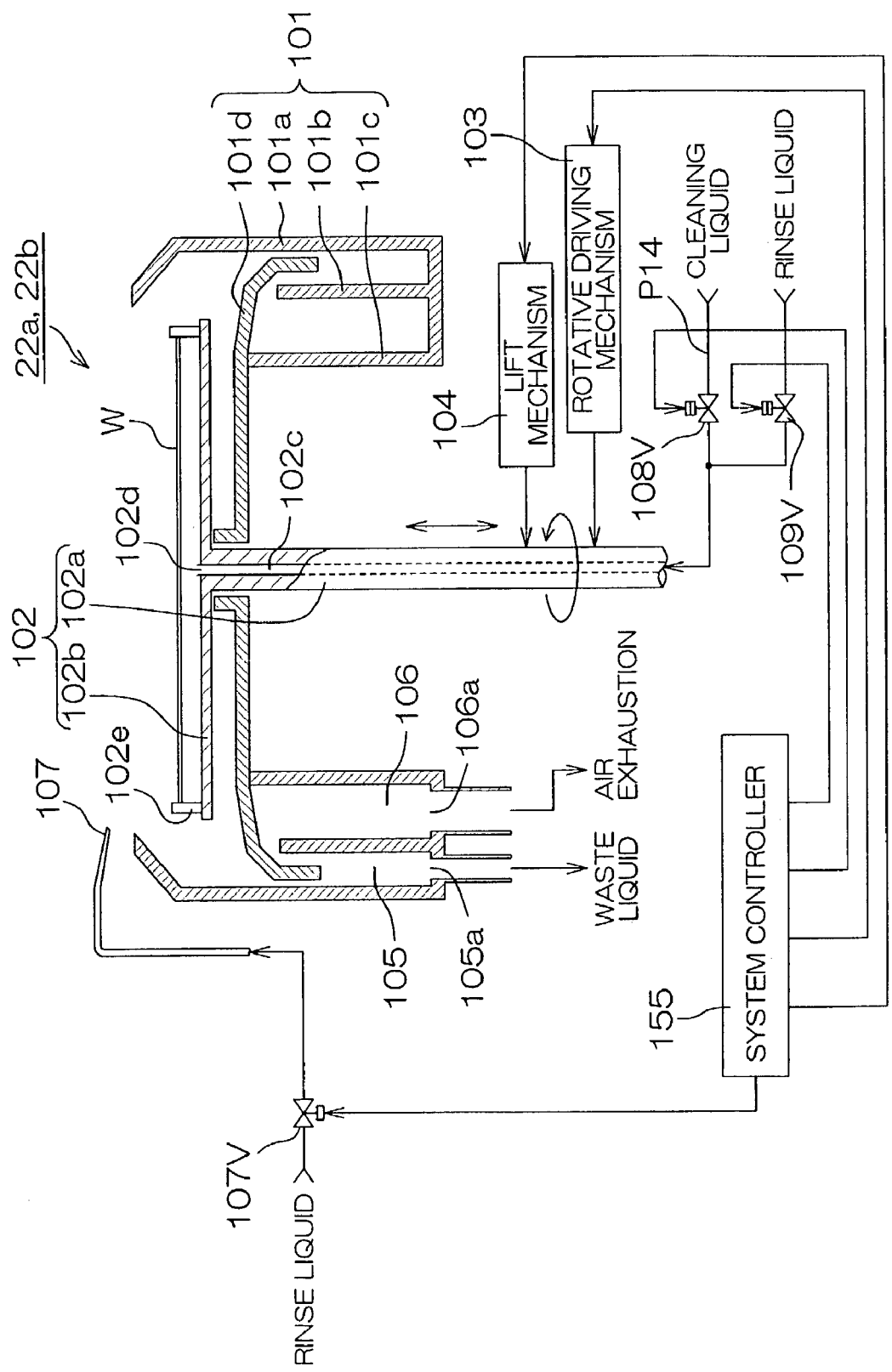
FIG. 24 is a schematic sectional view illustrating the construction of a cleaning unit.

FIG. 24 is a schematic sectional view illustrating the common construction of the cleaning units 22a, 22b.

A spin chuck 102 for generally horizontally holding and rotating the wafer W is provided in a generally cylindrical cup 101. The spin chuck 102 includes a vertical rotation shaft 102a and a disk spin base 102b provided at an upper end of the rotation shaft 102a perpendicularly to the rotation shaft 102a. A plurality of chuck pins 102e are provided upright on a peripheral edge portion of an upper surface of the spin base 102b in circumferentially spaced relation. The chuck pins 102e cooperatively support a peripheral edge portion of the lower surface of the wafer W in abutment against the peripheral surface (circumferential surface) of the wafer for holding the wafer W.

A rotative driving force is transmitted to the rotation shaft 102a of the spin chuck 102 from a rotative driving mechanism 103. A lift mechanism 104 for moving up and down the spin chuck 102 is coupled to the spin chuck 102, so that the spin chuck 102 can be brought into a state where its upper portion is accommodated in the cup 101 and into a state where its upper portion is located above an upper edge of the cup 101.

The cup 101 includes three cups 101a to 101c coaxially arranged. The outermost one of the cups 101a to 101c has an upper edge located at the highest position, and the middle cup 101b has an upper edge located at the lowest position. An annular treatment liquid guide plate 101d as seen in plan is coupled to an upper edge of the innermost cup 101c. An outer edge of the treatment liquid guide plate 101d is bent to be inserted into a space between the cup 101a and the cup 101b.

A treatment liquid collection vessel 105 having an open top is defined between the cup 101a and the cup 101b, and an air outlet vessel 106 is defined between the cup 101b and the cup 101c. A liquid drain port 105a is provided in the bottom of the treatment liquid collection vessel 105, and an air outlet port 106a is provided in the bottom of the air outlet vessel 106.

A nozzle 107 is provided above the cup 101. The nozzle 107 is connected in communication with the rinse liquid supply source via a valve 107V. By opening the valve 107V, the rinse liquid can be discharged toward the wafer W held by the spin chuck 102 from the nozzle 107.

The rotation shaft 102a has a treatment liquid supply channel 102c extending there through axially thereof, and an open upper end serving as a treatment liquid outlet port 102d. The cleaning liquid can be supplied into the treatment liquid supply channel 102c through the post-treatment agent pipe P14 from a cleaning liquid supply source provided in the post-treatment agent supplying section 4 (see FIG. 1). The rinse liquid can also be supplied into the treatment liquid supply channel 102c from the rinse liquid supply source.

The cleaning liquid may be, for example, a mixture of sulfuric acid, a hydrogen peroxide aqueous solution and water. The rinse liquid may be, for example, deionized water. In this case, the rinse liquid (deionized water) can be supplied into the treatment liquid supply channel 102c and the nozzle 107 via the deionized water pipe 32 (see FIG. 3) extending through the deionized water pipe introduction port 32h formed in the enclosure 30.

A valve 108V is provided between the treatment liquid supply channel 102c and the cleaning liquid supply source. A valve 109V is provided between the treatment liquid supply channel 102c and the rinse liquid supply source. By closing the valve 109V and opening the valve 108V, the cleaning liquid can be discharged from the treatment liquid outlet port 102d. By closing the valve 108V and opening the valve 109V, the rinse liquid can be discharged from the treatment liquid outlet port 102d. Thus, the cleaning liquid or the rinse liquid can be supplied to the center of the lower surface of the wafer W held by the spin chuck 102.

The operations of the rotative driving mechanism 103 and the lift mechanism 104, and the opening and closing of the valves 107V, 108V, 109V are controlled by the system controller 155.

When the wafer W is to be cleaned in the cleaning unit 22a or 22b, the system controller 155 controls the lift mechanism 104 to move up the spin chuck 102 so that the upper portion of the spin chuck 102 is located above the upper edge of the cup 101. The wafer W subjected to the bevel etching process in the bevel etching unit 21a or 21b is loaded into the cleaning unit 22a or 22b by the retractable arm 41 or the retractable arm 42 of the transport robot TR (see FIGS. 5(a) to 5(c)), and mechanically held by the chuck pins 102e with the center of the wafer W coinciding with the center axis of the rotation shaft 102a.

Thereafter, the system controller 155 controls the lift mechanism 104 to move down the spin chuck 102. Thus, the wafer W held by the spin chuck 102 is surrounded by the cup 101a. Then, the system controller 155 controls the rotative driving mechanism 103 to rotate the wafer W held by the spin chuck 102. The rotation speed of the wafer W is, for example, about 500 rpm. Gas is exhausted from the cup 101 through the air outlet port 106a by the exhauster system not shown.

In this state, the valves 107V, 108V are opened under the control of the system controller 155. Thus, the rinse liquid and the cleaning liquid are discharged toward the wafer W from the nozzle 107 and the treatment liquid outlet port 102d, respectively. The rinse liquid and the cleaning liquid supplied to the surfaces of the wafer W spread toward the peripheral edge of the wafer W by a centrifugal force. Thus, the entire lower surface of the wafer W is cleaned.

The rinse liquid and the cleaning liquid are spun off laterally of the wafer W by the centrifugal force, and flows over the interior of the cup 101a and the upper surface of the treatment liquid guide plate 101d down into he treatment liquid collection vessel 105. The rinse liquid and the cleaning liquid are introduced into the collection tank not shown through the liquid drain port 105a. Further, gas is exhausted from the cup 101. Thus, mist of the cleaning liquid can be exhausted through the air outlet port 106a so as to be prevented from scattering out of the cup 101.

After this process is performed for a predetermined period, the valve 108V is closed and the valve 109V is opened under the control of the system controller 155. Thus, the rinse liquid is discharged toward the lower surface of the wafer W from the treatment liquid outlet port 102d. The supply of the rinse liquid to the upper surface of the wafer W from the nozzle 107 is continued. Thus, the cleaning liquid is rinsed away from the lower surface of the wafer W. After this process is continued for a predetermined period (e.g., about one minute), the valves 107V and 109V are closed under the control of the system controller 155 to stop the supply of the rinse liquid to the wafer W.

Subsequently, the system controller 155 controls the rotative driving mechanism 103 to rotate the wafer W held by the spin chuck 102 at a high speed, for example, at about 2000 rpm. Thus, the rinse liquid remaining on the wafer W is mostly spun off for drying the wafer W. After the high-speed rotation of the wafer W is continued for a predetermined period (e.g., several tens seconds), the system controller 155 controls the rotative driving mechanism 103 to stop the rotation of the wafer W.

In turn, the system controller 155 controls the lift mechanism 104 to move up the spin chuck 102 so that the wafer W held by the spin chuck 102 is located above the upper edge of the cup 101. Thus, the wafer W is released from the chuck pins 102e.

Then, the treated wafer W is unloaded by the retractable arm 42 or the retractable arm 41 of the transport robot TR. Thus, the cleaning process for the cleaning of the single wafer W is completed.

In this embodiment, the cup 101 is fixed, and the spin chuck 102 is adapted to be moved up and down by the lift mechanism 104. However, it is merely necessary to vertically move the spin chuck 102 and the cup 101 relative to each other. For example, the spin chuck 102 may vertically be fixed, and the cup 101 may be adapted to be moved up and down. Even in this case, the spin base 102b can be located above the upper edge of the cup 101, so that the wafer W can be loaded and unloaded by the retractable arm 41 or the retractable arm 42.

Figure 25:
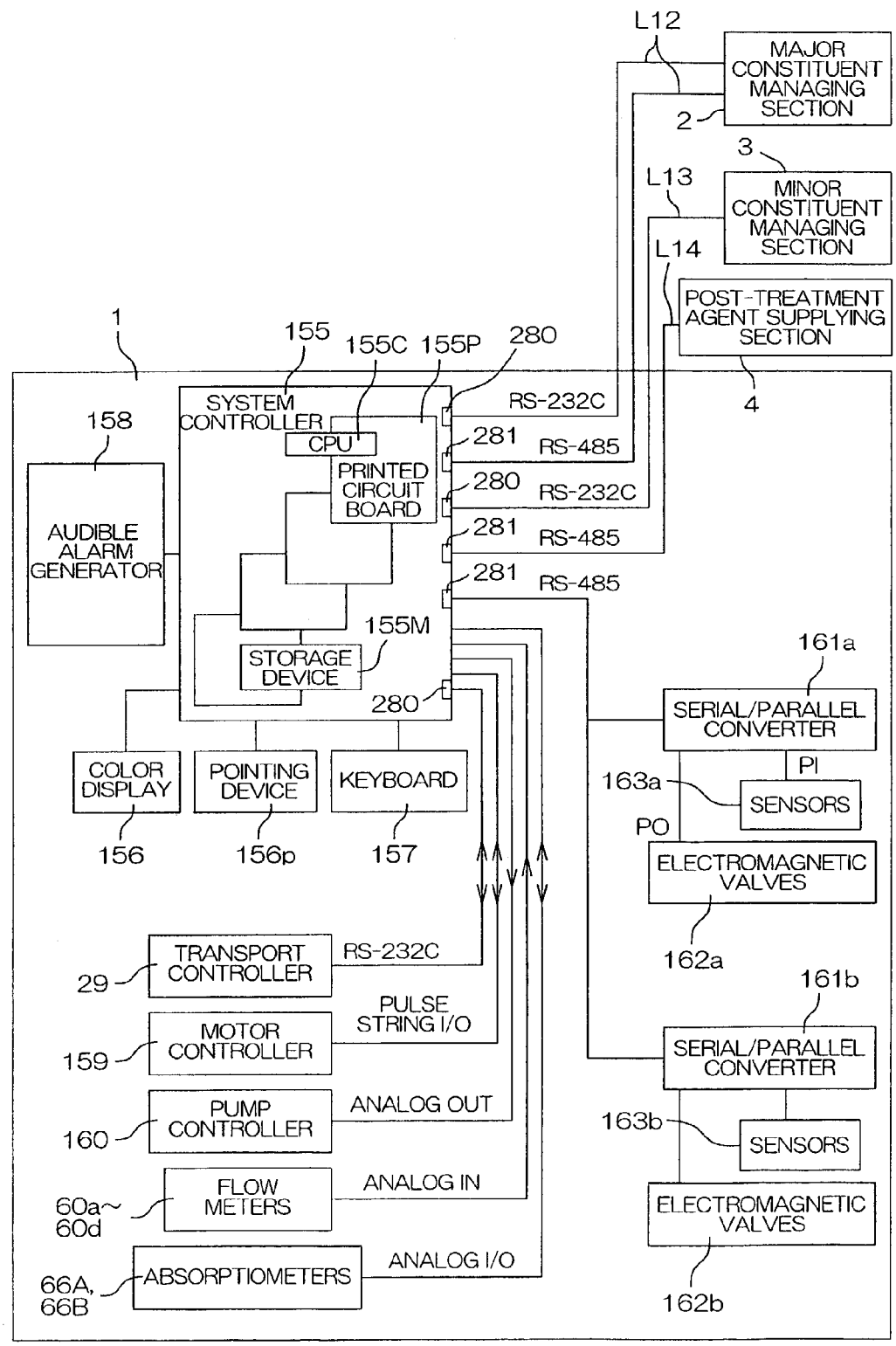
FIG. 25 is a block diagram illustrating the construction of a control system for the wafer treating section.

FIG. 25 is a block diagram illustrating the construction of a control system for the wafer treating section 1.

The system controller 155 is provided in the wafer treating section 1, and controls the wafer treating section 1, the major constituent managing section 2, the minor constituent managing section 3 and the post-treatment agent supplying section 4 to comprehensively manage the entire plating apparatus 10. More specifically, the system controller 155 monitors the states of the respective sections, sends proper control commands and data to the respective sections, and takes in data from the respective sections.

Hardware of the system controller 155 includes a central processing unit (CPU) 155C having a processing capability of 10 MIPS (million instructions per second) or more, a storage device 155M including a semiconductor memory having a storage capacity of 10 Mbytes or more and a magnetic memory having a storage capacity of 1 Mbyte or more, RS-232C compatible serial ports 280, RS-485 compatible serial ports 281, and a plurality of printed circuit boards 155P. The magnetic memory may be, for example, a hard disk (HD) incorporated in a hard disk drive (HDD), or a flexible disk (FD) to be inserted in a flexible disk drive (FDD).

Software employed in the system controller 155 includes an operating system, and application programs which are at least partly described in a high-level language. These programs are stored in the storage device 155M. The application programs include recipes for performing the plating process, the bevel etching process, the cleaning process and the like.

The system controller 155 is connected to a color display 156, a keyboard 157 and a pointing device (e.g., a mouse) 156p, so that the operator can interact with the system controller 155 for inputting and outputting information. The system controller 155 is further connected to an audible alarm generator 158. When a certain event occurs, e.g., when the leakage of the plating liquid occurs which is judged on the basis of the output signal of the conductivity meter 212 (see FIG. 9) or when the residual amount of the copper supply source (copper tube) for supplying copper ions to the plating liquid is reduced below a predetermined level, an audible alarm is given, and information on the alarm is displayed on the color display 156.

The system controller 155 is connected to the transport controller 29 (see FIG. 2), the major constituent managing section 2 and the minor constituent managing section 3 via the RS-232C compatible serial ports 280 by cables. The system controller 155 is further connected to a motor controller 159 by a pulse-string input/output cable, and connected to a pump controller 160, the flow meters 60a to 60d and the absorptiometers 66A and 66B by analog signal cables.

Thus, the system controller 155 is capable of controlling motors provided in the rotative driving mechanisms 45, 88, 103 (see FIGS. 9, 23 and 24), for example, via the motor controller 159, and controlling the operations of the pumps P1 to P4 (see FIG. 7) in the plating section 12, for example, via the pump controller 160.

Signals indicative of the flow rates from the flow meters 60a to 60d (see FIG. 7) are inputted as analog signals to the system controller 155. Further, the system controller 155 controls the operations of the absorptiometers 66A, 66B (e.g., light emission of the light emitting sections 68A, 68B) on an analog signal basis, and receives analog signals outputted from the light receiving sections 69A, 69B.

The system controller 155 is further connected to the major constituent managing section 2, the post-treatment agent supplying section 4 and serial/parallel converters 161a, 161b via the RS-485 compatible serial ports 281 by cables. In FIG. 25, only two serial/parallel converters 161a, 161b are shown, but the system controller 155 may be connected to a greater number of serial/parallel converters.

The serial/parallel converters 161a and 161b are respectively connected to electromagnetic valves 162a and 162b, and sensors 163a and 163b (e.g., the temperature sensor 70, the electromagnetic conductivity meter 71, the ultrasonic level meter 72 (see FIG. 7)) via parallel cables. The electromagnetic valves 162a, 162b are capable of controlling air valves (e.g., the valves 91V, 100V (see FIG. 23) and the valve 107V (see FIG. 24)).

Figure 26:
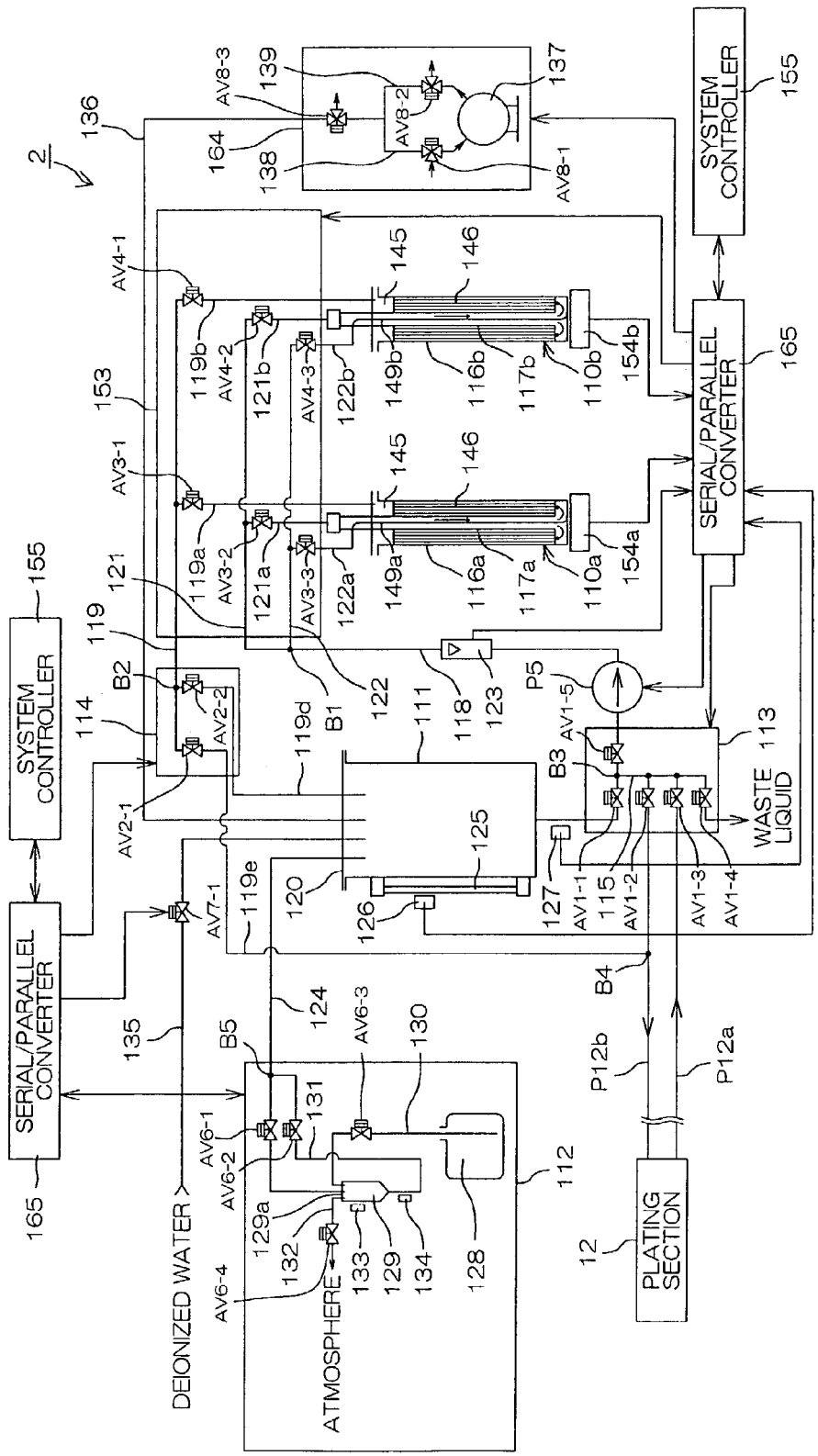
FIG. 26 is a schematic diagram illustrating the construction of a major constituent managing section.

FIG. 26 is a schematic diagram illustrating the construction of the major constituent managing section 2.

The major constituent managing section 2 includes at least one copper dissolution tank (two copper dissolution tanks 110a, 110b in this embodiment) for supplying copper ions to the plating liquid, a buffer container 111 for supplying a replacement liquid to one of the copper dissolution tanks 110a, 110b not in use, and an undiluted replacement liquid supplying section 112 for supplying an undiluted replacement liquid as a source of the replacement liquid to the buffer container 111.

Copper tubes 146 are provided as the copper supply source in each of the copper dissolution tanks 110a, 110b. The plating liquid is circulated through the plating liquid container 55 of the wafer treating section 1 and the copper dissolution tank 110a, 110b, whereby copper ions consumed by the plating are replenished in the plating liquid. In the copper dissolution tank 110a (110b) through which the plating liquid is not circulated in communication with the plating liquid container 55, the surface of the copper tubes 146 can be maintained in a proper state by filling the replacement liquid in the copper dissolution tank 110a (110b). This ensures proper leach-out of copper ions from the copper tubes 146 when the circulation of the plating liquid through the plating liquid container 55 and the copper dissolution tank 110a (110b) is started.

The copper dissolution tanks 110a, 110b each have a cylindrical sealed structure having a closed bottom and a generally vertical axis. The copper dissolution tank 110a, 110b is placed on a weight meter 154a, 154b, which is adapted to measure the total weight of the copper dissolution tank 110a, 110b including its content.

The copper dissolution tank 110a, 110b includes an outer pipe 116a, 116b constituting a side wall thereof, and an inner pipe 117a, 117b provided in the outer pipe 116a, 116b. An inner space of the inner pipe 117a, 117b communicates with a space (hereinafter referred to as "annular space 145") defined between the outer pipe 116a, 116b and the inner pipe 117a, 117b in a lower portion of the copper dissolution tank 110a, 110b. The copper tubes 146 are accommodated in the annular space 145.

The buffer container 111 has a cover 120 having a plurality of piping ports for piping, and is virtually sealed. Upper and lower portions of the buffer container 111 are connected in communication with each other by a bypass pipe 125 vertically extending along the exterior of the buffer container 111. A constant volume check sensor 126 is provided at a predetermined height on a lateral side of the bypass pipe 125 for detecting the presence or absence of liquid at this predetermined height within the bypass pipe 125.

The liquid (e.g., the replacement liquid) is allowed to freely flow between the buffer container 111 and the bypass pipe 125, so that a liquid surface level in the buffer container 111 is virtually equal to a liquid surface level in the bypass pipe 125. Thus, the presence or absence of the liquid at the predetermined height in the buffer container 111 can be detected by the constant volume check sensor 126.

One end of a circulation pipe 118 is connected to the bottom of the buffer container 111 via a piping port for communication between the circulation pipe 118 and the buffer container 111. The other end of the circulation pipe 118 is branched into branch circulation pipes 121, 122 at a branch point B1. The branch circulation pipe 121 is further branched into branch circulation pipes 121a, 121b, while the branch circulation pipe 122 is further branched into branch circulation pipes 122a, 122b.

The branch circulation pipes 121a and 121b are respectively connected to upper portions of the inner pipes 117a and 117b of the copper dissolution tanks 110a and 110b. The branch circulation pipes 122a and 122b are respectively connected to liquid outlet pipes 149a and 149b provided in the copper dissolution tanks 110a and 110b. Valves AV3-2 and AV4-2 are provided in the branch circulation pipes 121a and 121b, respectively. Valves AV3-3 and AV4-3 are provided in the branch circulation pipes 122a and 122b, respectively.

Branch circulation pipes 119a and 119b are connected in communication with the annular spaces 145 of the copper dissolution tanks 110a and 110b, respectively. Valves AV3-1 and AV4-1 are provided in the branch circulation pipes 119a and 119b, respectively. The branch circulation pipes 119a, 119b are connected to one end of a circulation pipe 119. The other end of the circulation pipe 119 is branched into branch circulation pipes 119d and 119e at a branch point B2.

The valves AV3-1, AV3-2, AV3-3, AV4-1, AV4-2, AV4-3 are collectively disposed in a copper dissolution tank channel switching section 153.

The branch circulation pipe 119d extends into the buffer container 111 through the piping port formed in the cover 120 (through the cover 120). A valve AV2-2 is provided in the branch circulation pipe 119d.

One end of a channel switching pipe 115 is connected to the circulation pipe 118 at a branch point B3. A valve AV1-4 is provided at the other end of the channel switching pipe 115. By opening the valve AV1-4, the liquid can be drained from the other end of the channel switching pipe 115. The plating liquid transport pipes P12a and P12b are connected to the channel switching pipe 115 via valves AV1-3 and AV1-2, respectively.

A valve AV1-1 is provided in the circulation pipe 118 between the buffer container 111 and the branch point B3. A valve AV1-5, a pump P5 and a flow meter 123 are provided in the circulation pipe 118 between the branch point B3 and the branch point B1 in this order from the branch point B3. An emptiness check sensor 127 is provided on a lateral side of the circulation pipe 118 in the vicinity of the buffer container 111 (between the buffer container 111 and the branch point B3). The emptiness check sensor 127 is capable of detecting the presence or absence of the liquid at the height of the emptiness check sensor 127 in the circulation pipe 118. This makes it possible to determine whether or not the buffer container 111 is empty.

The valves AV1-1, AV1-2, AV1-3, AV1-4, AV1-5 are collectively disposed in an inlet-side main channel switching section 113.

The branch circulation pipe 119e is connected to the plating liquid transport pipe P12b at a branch point B4. A valve AV2-1 is provided in the branch circulation pipe 119e. The valves AV2-1, AV2-2 are collectively disposed in an outlet-side main channel switching section 114.

A plating liquid flow channel can be switched by means of the inlet-side main channel switching section 113, the copper dissolution tank channel switching section 153 and the outlet-side channel switching section 114.

The undiluted replacement liquid supplying section 112 includes an undiluted replacement liquid tank 128 containing the undiluted replacement liquid, and a measure cup 129 for dispensing a predetermined amount of the undiluted replacement liquid. The undiluted replacement liquid may be, for example, concentrated sulfuric acid. The measure cup 129 has a cover 129a, and is virtually sealed. The measure cup 129 has a bottom having an inverted cone shape. A liquid outlet port is provided in a center portion of the bottom of the measure cup 129. That is, the bottom of the measure cup 129 is inclined downward toward the liquid outlet port. An undiluted replacement liquid transport pipe 130 extends from an upper portion of the measure cup 129 into a bottom portion of the undiluted replacement liquid tank 128. A valve AV6-3 is provided in the undiluted replacement liquid transport pipe 130.

The undiluted replacement liquid supplying section 112 is connected to the buffer container 111 by an undiluted replacement liquid supply pipe 124. The undiluted replacement liquid supply pipe 124 extends to the upper portion of the measure cup 129 through the cover 129a. One end of an undiluted replacement liquid transport pipe 131 is connected to the center portion of the bottom (liquid outlet port) of the measure cup 129. The other end of the undiluted replacement liquid transport pipe 131 is connected to the undiluted replacement liquid supply pipe 124 at a branch point B5. A valve AV6-1 is provided in the undiluted replacement liquid supply pipe 124 between the branch point B5 and the measure cup 129. A valve AV6-2 is provided in the undiluted replacement liquid transport pipe 131.

A leak pipe 132 extends through the cover 129a to be connected in communication with the measure cup 129. A valve AV6-4 is provided in the leak pipe 132 outside the measure cup 129. By opening the valve AV6-4, the internal pressure of the measure cup is set at the atmospheric pressure.

A constant volume check sensor 133 is provided at a predetermined height on a lateral side of the measure cup 129 for detecting the presence or absence of liquid at this predetermined height in the measure cup 129. An emptiness check sensor 134 is provided on a lateral side of the undiluted replacement liquid transport pipe 131 in the vicinity of the measure cup 129. The emptiness check sensor 134 is capable of detecting the presence or absence of liquid at the height of the emptiness check sensor 134 in the undiluted replacement liquid transport pipe 131. This makes it possible to determine whether or not the measure cup 129 is empty.

A deionized water supply pipe 135 extends through the cover 120 to be connected in communication with the buffer container 111. Thus, deionized water can be supplied to the buffer container 111 from a deionized water supply source not shown. A valve AV7-1 is provided in the deionized water supply pipe 135.

An air inlet/outlet pipe 136 is introduced into the buffer container 111 through the cover 120. An air pump 137 is connected to an end of the air inlet/outlet pipe 136 opposite from the buffer container 111. A three-way valve AV8-3 is provided in the air inlet/outlet pipe 136. The three-way valve AV8-3 is adapted to selectively establish air communication between the buffer container 111 and the air pump 137 and between the buffer container 111 and the atmosphere.

The air pump 137 has an air exhaustion pipe 138 and an air supply pipe 139. The air inlet/outlet pipe 136 is connected in communication with the air exhaustion pipe 138 and the air supply pipe 139. A three-way valve AV8-1 is provided in the air exhaustion pipe 138, while a three-way valve AV8-2 is provided in the air supply pipe 139. The three-way valves AV8-1, AV8-2, AV8-3, which may be air valves, are collectively disposed in a pressure increasing/reducing section 164.

Air can be supplied into the buffer container 111 by establishing communication between the atmosphere and the air pump 137 by the three-way valve AV8-1 and between the air pump 137 and the air inlet/outlet pipe 136 by the three-way valve AV8-2, and actuating the air pump 137. Gas can be exhausted from the buffer container 111 by establishing communication between the air inlet/outlet pipe 136 and the air pump 137 by the three-way valve AV8-1 and between the air pump 137 and the atmosphere by the three-way valve AV8-2, and actuating the air pump 137.

The opening and closing of the valve AV7-1 and the valves in the inlet-side main channel switching section 113, the outlet-side main channel switching section 114, the copper dissolution tank channel switching section 153, the undiluted replacement liquid supplying section 112 and the pressure increasing/reducing section 164, and the operations of the pump P5 and the air pump 137 are controlled by the system controller 155 of the wafer treating section 1 via the serial/parallel converter 165. Output signals of the constant volume check sensors 126, 133, the emptiness check sensors 127, 134, the flow meter 123 and the weight meters 154$a$, 154$b$ are inputted to the system controller 155 of the wafer treating section 1 via the serial/parallel converter 165.

With reference to FIG. 26, an explanation will hereinafter be given to the operation of the major constituent managing section 2 during the plating process performed in the plating section 12.

Prior to the plating process, the system controller 155 determines which of the copper dissolution tanks 110$a$, 110$b$ is to be used. One of the copper dissolution tanks 110$a$, 110$b$ which contains the copper tubes 146 whose total weight is lightest is used. The other copper dissolution tank is not used, but reserved as a spare.

The storage device 155M of the system controller 155 stores data of the net weights of the respective copper dissolution tanks 110$a$, 110$b$ and the weights of the respective copper dissolution tanks 110$a$, 110$b$ measured when the plating liquid is filled therein. The system controller 155 calculates the weights of the copper tubes 146 in the copper dissolution tanks 110$a$, 110$b$ on the basis of the output signals of the weight meters 154$a$, 154$b$.

It is herein assumed that the weight of the copper tubes 146 in the copper dissolution tank 110$a$ is judged to be the lightest and sufficient to supply copper ions to the plating liquid for a predetermined period. In this case, a flow channel is established for circulating the plating liquid through the plating section 12 and the copper dissolution tank 110$a$ under the control of the system controller 155. More specifically, the valves AV1-3, AV1-5, AV3-2, AV3-1, AV2-1 are opened, and the other valves are closed.

In this state, the pump P5 is actuated under the control of the system controller 155. Thus, the plating liquid is supplied into the copper dissolution tank 110$a$ from the plating section 12, flows over the interior and exterior surfaces of the copper tubes 146 in the copper dissolution tank 110$a$, and returned into the plating section 12. In the copper dissolution tank 110$a$, the copper tubes 146 are deprived of electrons by trivalent iron ions in the plating liquid, whereby the trivalent iron ions are reduced to divalent iron ions. Copper ions are leached into the plating liquid from the copper tubes 146 deprived of the electrons.

Thus, the copper ions are supplied from the copper tubes 146, while being consumed on the lower surface of the wafer W during the plating process. On the other hand, the trivalent iron ions are reduced to the divalent iron ions in the vicinity of the copper tubes 146, while the divalent iron ions are oxidized into trivalent iron ions in the vicinity of the anode 76.

Where the concentrations of the copper ions, the divalent iron ions and the trivalent iron ions in the plating liquid are not within the predetermined concentration ranges, the plating process cannot properly be performed with a poorer capability of filling the holes or grooves formed in the surface of the wafer W with copper. Therefore, the concentrations of the copper ions and the divalent and trivalent iron ions in the plating liquid should be kept at the predetermined concentration levels (within the predetermined concentration ranges). That is, the amount of the copper ions consumed on the lower surface of the wafer W should substantially be equalized with the amount of the copper ions leaching out of the copper tubes 146, and the amount of the divalent iron ions occurring in the vicinity of the anode 76 should substantially be equalized with the amount of the trivalent iron ions occurring in the vicinity of the copper tubes 146.

The copper ion consumption rate at which the copper ions are consumed in the plating liquid by the plating is determined by the operation statuses of the respective plating units 20$a$ to 20$d$. The copper ion leaching rate at which the copper ions leach into the plating liquid from the copper tubes 146 in the copper dissolution tank 110$a$ is determined by the surface area of the copper tubes 146 in contact with the plating liquid, the flow rate of the plating liquid flowing in the vicinity of the copper tubes 146 and the concentration of the trivalent iron ions in the plating liquid.

The inner and outer peripheral surface areas of the copper tube 146 account for a major percentage of the total surface area of the copper tube 146. As the dissolution of the copper tube 146 proceeds, the thickness and length of the copper tube 146 are reduced. However, the reduction rate of the length is negligible. Therefore, the outer and inner peripheral surface areas of the copper tube 146 (the total surface area of the copper tube 146) are considered to be virtually constant before complete dissolution of the copper tube 146, even if the dissolution of the copper tube 146 proceeds. Whether or not the copper tube 146 is very close to the complete dissolution is determined on the basis of the output signal of the weight meter 154$a$. The flow rate of the plating liquid flowing into the copper dissolution tank 110$a$ may be employed as the flow rate of the plating liquid flowing in the vicinity of the copper tube 146.

Therefore, the system controller 155 determines the pumping rate of the pump P5 on the basis of the operation statuses of the plating units 20$a$ to 20$d$ and the output signal of the absorptiometer 66B indicative of the concentration of the iron ions. The pumping rate of the pump P5 is regulated at a predetermined level on the basis of the feedback of the output signal of the flow meter 123 to the system controller 155. Under such control, the amount of the copper ions supplied to the plating liquid is balanced with the amount of the copper ions consumed in the plating liquid to keep the copper ion concentration virtually constant in the plating liquid.

If the dissolution of the copper tubes 146 in the copper dissolution tank 110$a$ extremely proceeds, the total surface area of the copper tubes 146 is rapidly reduced, making it difficult to supply the copper ions to the plating liquid at a constant rate. To avoid such an event, the supply of the plating liquid to the copper dissolution tank 110*a* is stopped when the weight of the copper tubes 146 in the copper dissolution tank 110*a* is reduced below a predetermined level (e.g., 20% to 30% of the initial weight). Then, the supply of the plating liquid to the copper dissolution tank 110*b* is started.

More specifically, when the system controller 155 judges on the basis of the signal of the weight meter 154*a* that the weight of the copper tubes 146 in the copper dissolution tank 110*a* is reduced below the predetermined level, the valves AV4-1 and AV4-2 are opened and the valves AV3-1 and AV3-2 are closed under the control of the system controller 155. Thus, the plating liquid is circulated through the plating section 12 and the copper dissolution tank 110*b*. Where the copper tubes 146 contained in the copper dissolution tank 110*b* has a sufficient weight, the copper ions can stably be supplied into the plating liquid.

Since the two copper dissolution tanks 110*a*, 110*b* are provided in the major constituent managing section 2, the copper ions can constantly be supplied to the plating liquid without excess and deficiency. Thus, the surface of the wafer W can properly be copper-plated with the fine holes or grooves thereof properly filled with copper.

A copper plate or a copper mesh may be accommodated instead of the copper tube 146 as the copper supply source in the copper dissolution tank 110*a*, 110*b*.

Next, an explanation will be given to the operation of the major constituent managing section 2 after the completion of the plating process in the plating section 12. If the plating liquid is circulated through the plating liquid container 55 and the copper dissolution tank 110*a* or 110*b* when the plating process is not performed in any of the plating units 20*a* to 20*d*, the concentration of the copper ions in the plating liquid is increased beyond the proper concentration range. This is because the copper ions are continuously supplied to the plating liquid from the copper tubes 146, though the copper ions are not consumed.

If the circulation of the plating liquid is stopped, the surface of the copper tubes 146 in the copper dissolution tank 110*a*, 110*b* is irreversibly deteriorated. Therefore, the surface of the wafer W cannot properly be copper-plated with a poorer capability of filling the fine holes or grooves thereof with copper, when the plating process is performed again in any of the plating units 20*a* to 20*d* by resuming the circulation of the plating liquid.

To cope with this, the plating liquid in the copper dissolution tank 110*a*, 110*b* is replaced with the replacement liquid for prevention of the increase in the concentration of the copper ions in the plating liquid and the deterioration of the surface of the copper tubes 146 upon the completion of the plating process in the plating section 12. It is herein assumed that the plating liquid in the copper dissolution tank 110*a* is replaced with the replacement liquid.

The deterioration of the surface of the copper tubes 146 may occur within several hours. On the other hand, the plating process is often resumed immediately after the completion of the plating process in the plating section 12 due to a change in a production plan. In this case, if the plating liquid in the copper dissolution tank 110*a* is already replaced with the replacement liquid, the replacement liquid in the copper dissolution tank 110*a* should be replaced again with the plating liquid. The time required for the replacement of the plating liquid in the copper dissolution tank 110*a* is about 5 minutes to about 10 minutes, so that the productivity is reduced. Therefore, the plating liquid in the copper dissolution tank 110*a* is replaced with the replacement liquid after a lapse of a 2- to 3-hour standby period from the completion of the plating process in the plating section 12.

If the plating process is less likely to be resumed immediately after the completion of the plating process in the plating section 12, the plating liquid in the copper dissolution tank 110*a* maybe replaced with the replacement liquid immediately after the completion of the plating process.

First, the pump P5 is stopped and all the valves in the major constituent managing section 2 are closed under the control of the system controller 155. In turn, the system controller 155 controls the pressure increasing/reducing section 164 to supply air into the buffer container 111. Thus, the internal pressure of the buffer container 111 is increased.

Then, the valves AV2-2, AV3-1, AV3-2, AV1-5, AV1-2 are opened under the control of the system controller 155. Thus, air pressurized in the buffer container 111 is introduced into the annular space 145, so that the plating liquid is forced out of the copper dissolution tank 110*a* into the plating liquid container 55 in the plating section 12.

The system controller 155 calculates the weight of the plating liquid in the copper dissolution tank 110*a* on the basis of the output signal of the weight meter 154*a*, and maintains the aforesaid conditions until it is judged that almost all the plating liquid is expelled from the copper dissolution tank 110*a*. When the system controller 155 judges that almost all the plating liquid is expelled from the copper dissolution tank 110*a*, the valve AV3-3 is opened for a predetermined period under the control of the system controller 155. Thus, the plating liquid remaining in the bottom portion of the copper dissolution tank 110*a* is virtually completely discharged through the liquid outlet pipe 149*a*.

Subsequently, the valve AV7-1 is opened under the control of the system controller 155 to introduce deionized water into the buffer container 111. When it is judged on the basis of the output signal of the constant volume check sensor 126 that the surface of deionized water rises to reach the predetermined level in the buffer container 111, the valve AV7-*l* is closed under the control of the system controller 155. Thus, a predetermined amount of deionized water is contained in the buffer container 111.

In turn, the valves in the major constituent managing section 2 except the three-way valves AV8-1, AV8-2, AV8-3 are closed, and air is exhausted from the buffer container 111 by the pressure increasing/reducing section 164 under the control of the system controller 155. Thus, the internal pressure of the buffer container 111 is reduced. Then, the valves AV6-1, AV6-3 are opened under the control of the system controller 155. Thus, the internal pressure of the measure cup 129 is also reduced, so that the undiluted replacement liquid is sucked into the measure cup 129 from the undiluted replacement liquid tank 128 through the undiluted replacement liquid transport pipe 130.

During this period, the system controller 155 monitors the output signal of the constant volume check sensor 133, and judges whether the surface of the undiluted replacement liquid in the measure cup 129 reaches the predetermined level. If it is judged that the surface of the undiluted replacement liquid reaches the predetermined level, the valves AV6-3, AV6-1 are closed under the control of the system controller 155. Thus, a predetermined volume of the undiluted replacement liquid is dispensed in the measure cup 129.

Then, the valves AV6-2, AV6-4 are opened under the control of the system controller 155. Thus, the internal pressure of the measure cup 129 is set at the atmospheric pressure, so that the undiluted replacement liquid is transported from the measure cup 129 into the buffer container 111 having a lower internal pressure through the undiluted replacement liquid transport pipe 131 and the undiluted replacement liquid supply pipe 124 and mixed with the deionized water in the buffer container 111.

Since the bottom of the measure cup 129 is inclined downward toward the undiluted replacement liquid transport pipe 131 (liquid outlet port), the undiluted replacement liquid is virtually completely discharged from the measure cup 129. When it is judged on the basis of the output signal of the emptiness check sensor 134 that the measure cup 129 is empty, the valves AV6-2, AV6-4 are closed under the control of the system controller 155.

Thus, the replacement liquid which has a predetermined composition and a predetermined concentration (e.g., 10% sulfuric acid aqueous solution) is prepared in the buffer container 111.

In turn, the system controller 155 controls the three-way valve AV8-3 to establish communication between the buffer container 111 and the atmosphere. Thus, the internal pressure of the buffer container 111 is set at the atmospheric pressure. Thereafter, the valves AV1-1, AV1-5, AV3-2, AV3-1, AV2-2 are opened, and the pump P5 is actuated under the control of the system controller 155. At this time, the pump P5 is operated only for a predetermined period, or operated until it is judged on the basis of the output signal of the weight meter 154a that the copper dissolution tank 110a is filled with the replacement liquid.

Thereafter, the pump P5 is stopped, and all the valves in the major constituent managing section 2 are closed under the control of the system controller 155. Then, the valves AV1-1, AV1-4 are opened under the control of the system controller 155, whereby the replacement liquid remaining in the buffer container 111 is drained. Thus, the replacement of the plating liquid in the copper dissolution tank 110a with the replacement liquid is completed.

Thus, the increase in the copper ion concentration of the plating liquid can be prevented. Further, the deterioration of the surface of the copper tube 146 can be prevented. Therefore, when the plating process is performed again in any of the plating units 20a to 20d by circulating the plating liquid through the plating section 12 and the copper dissolution tank 110a (110b), the surface of the wafer W can properly be copper-plated with the fine holes and grooves thereof properly filled with copper. Even if a small amount of the replacement liquid of the sulfuric acid aqueous solution is mixed in the plating liquid, the replacement liquid does not adversely affect the plating liquid because sulfuric acid is a supporting electrolyte of the plating liquid.

In the replacement of the plating liquid with the replacement liquid, deionized water may be introduced into and discharged from the copper dissolution tank 110a before the introduction of the replacement liquid after the plating liquid is discharged from the copper dissolution tank 110a. Thus, the copper dissolution tank 110a is cleaned with deionized water, so that the amount of the plating liquid mixed with the replacement liquid can be reduced. The introduction of the deionized water into the copper dissolution tank 110a can be achieved in substantially the same manner as the introduction of the replacement liquid into the copper dissolution tank 110a, except that only deionized water is introduced into the buffer container 111 from the deionized water supply source (but the undiluted replacement liquid is not introduced after the introduction of the deionized water).

Where the replacement liquid filled in the copper dissolution tank 110a, 110b is replaced again with the plating liquid, the following operation is performed. First, the replacement liquid is expelled from the copper dissolution tank 110a, 110b in substantially the same manner as when the plating liquid is expelled from the copper dissolution tank 110a, 110b for the replacement of the plating liquid with the replacement liquid. In this operation, however, the expelled replacement liquid is drained by closing the valve AV1-2 and opening the valve AV1-4 under the control of the system controller 155.

Thereafter, all the valves in the major constituent managing section 2 are closed, and then the valves AV1-2, AV1-5, AV3-2, AV3-1, AV2-1, for example, are opened under the control of the system controller 155. Thus, the plating liquid is introduced into the copper dissolution tank 110a.

Figure 27:
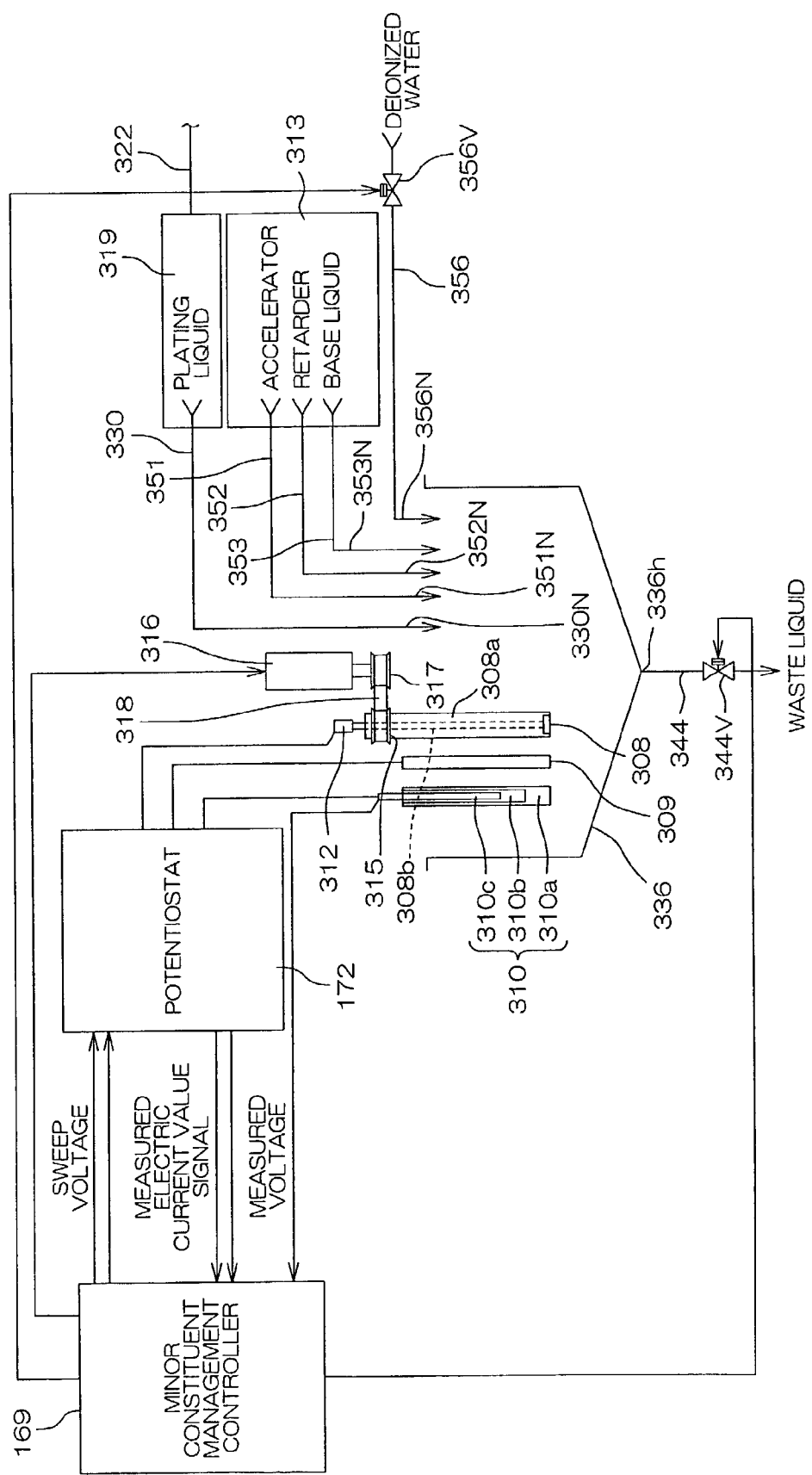
FIG. 27 is a schematic diagram illustrating the construction of an analyzing cup provided in a minor constituent managing section.

Next, an explanation will be given to the construction and function of the minor constituent managing section 3. FIG. 27 is a schematic diagram illustrating the construction of the analyzing cup provided in the minor constituent managing section 3.

The minor constituent managing section 3 includes a sampling section 319, and a plating liquid transport pipe 330 extends between the sampling section 319 and the analyzing cup 336. The plating liquid is transported from the plating liquid container 55 (see FIG. 7) provided in the wafer treating section 1 into the sampling section 319 through the sampling pipe 322, and then dispensed in a predetermined amount into the analyzing cup 336 through the plating liquid transport pipe 330. The analyzing cup 336 has a volume of about 50 ml to about 200 ml.

The analyzing cup 336 has an open top. A nozzle 330N is connected to an end of the plating liquid transport pipe 330 on the side of the analyzing cup 336. The nozzle 330N is disposed in an upper portion of the analyzing cup 336. The plating liquid transported from the sampling section 319 can be supplied into the analyzing cup 336 through the nozzle 330N.

A plating accelerating additive (hereinafter referred to as "accelerator"), a plating retarding additive (hereinafter referred to be "retarder") and a base liquid for diluting the plating liquid to be analyzed are used in the minor constituent managing section 3. The minor constituent managing section 3 includes a reagent supplying section 313 which is adapted to accommodate the accelerator, the retarder and the base liquid as analytic reagents and supply these reagents to the analyzing cup 336.

An accelerator transport pipe 351, a retarder transport pipe 352 and a base liquid transport pipe 353 extend from the reagent supplying section 313 to the analyzing cup 336. Nozzles 351N, 352N and 353N are respectively connected to ends of the accelerator transport pipe 351, the retarder transport pipe 352 and the base liquid transport pipe 353 on the side of the analyzing cup 336. The nozzles 351N, 352N and 353N are disposed in the upper portion of the analyzing cup 336. The accelerator, the retarder and the base liquid can be supplied into the analyzing cup 336 through the nozzles 351N, 352N and 353N, respectively.

A deionized water pipe 356 extends from the deionized water source to the analyzing cup 336. A valve 356V is provided in the deionized water pipe 356. A nozzle 356N provided in the upper portion of the analyzing cup 336 is connected to the deionized water pipe 356. By opening the valve 356V, deionized water can be supplied into the analyzing cup 336 through the nozzle 356N.

The nozzles 330N, 351N, 352N, 353N and 356N are each located at such a height as to be kept out of contact with liquid contained in the analyzing cup 336. The nozzles 330N, 351N, 352N, 353N and 356N each have an open diameter of 0.1 mm to 1 mm. Thus, very small amounts of the plating liquid, the accelerator, the retarder, the base liquid and deionized water can be supplied dropwise into the analyzing cup 336.

The analyzing cup 336 has a funnel-shaped bottom portion downwardly tapered. A drain port 336h is provided at the lowest portion of the analyzing cup 336. That is, the bottom portion of the analyzing cup 336 is inclined downward toward the drain port 336h. A drain pipe 344 is connected to the drain port 336h, and a valve 344V is provided in the drainpipe 344. By opening the valve 344V, the liquid in the analyzing cup 336 can be drained. Since the bottom portion of the analyzing cup 336 is inclined downward toward the drain port 336h (drain pipe 344), the liquid in the analyzing cup 336 can virtually completely be drained.

A rotary electrode 308, a counter electrode 309 and a reference electrode 310 are inserted in the analyzing cup 336. The counter electrode 309 and the reference electrode 310 each have a rod shape, and are disposed generally vertically.

The rotary electrode 308 is composed of platinum (Pt), and exposed from one end of a cylindrical rod 308a of an insulative material. The rotary electrode 308 has a mirror-finished exposed portion. The rod 308a is disposed vertically with the rotary electrode 308 facing downward. The rod 308a is held rotatably about a center axis thereof by a holder not shown.

An electrically conductive member 308b extends through the rod 308a along the center axis of the rod 308a. One end of the electrically conductive member 308b is electrically connected to the rotary electrode 308. The other end of the electrically conductive member 308b projects from the rod 308a, and a rotary connector 312 is attached to the projection. A rotary terminal of the rotary connector 312 is electrically connected to the electrically conductive member 308b, while a stationary terminal of the rotary connector 312 is electrically connected to a potentiostat 172 via a conduction line.

A pulley 315 is fitted around an end portion of the rod 308a adjacent to the rotary connector 312. A pulley 317 fitted around a rotation shaft of a motor 316 is disposed on a lateral side of the pulley 315. A belt 318 is stretched between the pulley 315 and the pulley 317. By driving the motor 316, the rotary electrode 308 can be rotated about the center axis of the rod 308a.

The counter electrode 309 is composed of copper, and electrically connected to the potentiostat 172 via a conduction line.

The reference electrode 310 includes an outer glass tube 310a, an inner glass tube 310b provided in the outer glass tube 310a, and a silver/silver chloride electrode 310c provided in the inner glass tube 310b. The inside of the inner glass tube 310b slightly communicates with the outside of the outer glass tube 310a. The silver/silver chloride electrode 310c is electrically connected to the potentiostat 172 and the minor constituent management controller 169 via conduction lines.

A sweep voltage specified by the minor constituent management controller 169 is applied to the potentiostat 172. The potentiostat 172 regulates an electric current flowing between the counter electrode 309 and the rotary electrode 308 so that a voltage between the reference electrode 310 and the rotary electrode 308 (action electrode) is equalized with the sweep voltage. A voltage (signal) indicative of an electric current level observed at this time is applied to the minor constituent management controller 169.

The opening and closing of the valves 356V, 344V and the operation of the motor 316 are controlled by the minor constituent management controller 169.

The concentrations of the accelerator and the retarder in the plating liquid can be measured in the analyzing cup 336. An explanation will be given to how to measure the concentration of the accelerator or the retarder in the plating liquid through the CVS analysis.

First, a predetermined amount of the plating liquid is transported from the sampling section 319 into the analyzing cup 336 through the plating liquid transport pipe 330. Then, the minor constituent management controller 169 controls the motor 316 to rotate the rotary electrode 308 about the axis of the rod 308a.

In turn, the minor constituent management controller 169 controls the potentiostat 172 to cause the sweep voltage to fluctuate in a predetermined cycle. Thus, the deposition and removal (stripping) of copper with respect to the rotary electrode 308 (action electrode) cyclically occur. The electric current flowing through the rotary electrode 308 when copper deposited on the rotary electrode 308 is stripped has a certain correlation with the concentration of the accelerator or the retarder in the plating liquid. Therefore, the concentration of the accelerator or the retarder can be determined by monitoring the electric current flowing through the rotary electrode 308 by the minor constituent management controller 169.

The accelerator, the retarder and the base liquid are each added in a predetermined amount to the plating liquid in the analyzing cup 336 as required during the analysis.

After completion of the CVS analysis, the minor constituent management controller 169 calculates the amount of the accelerator or the retarder to be added to the plating liquid on the basis of the calculated accelerator concentration or retarder concentration so that the concentration of the accelerator or the retarder in the plating liquid in the plating section 12 can be kept within a predetermined concentration range. The minor constituent managing section 3 includes a replenishment section not shown for additionally supplying the accelerator and the retarder into the plating liquid container 55 provided in the plating section 12. The minor constituent management controller 169 controls the replenishment section to supply the retarder or the accelerator in the calculated amount into the plating liquid in the plating liquid container 55 through the replenishment pipe 324.

The minor constituent managing section 3 is not necessarily required to include the replenishment section. In this case, the operator may manually add a replenishment liquid in a required amount to the plating liquid contained in the plating liquid container 55.

Figure 28:
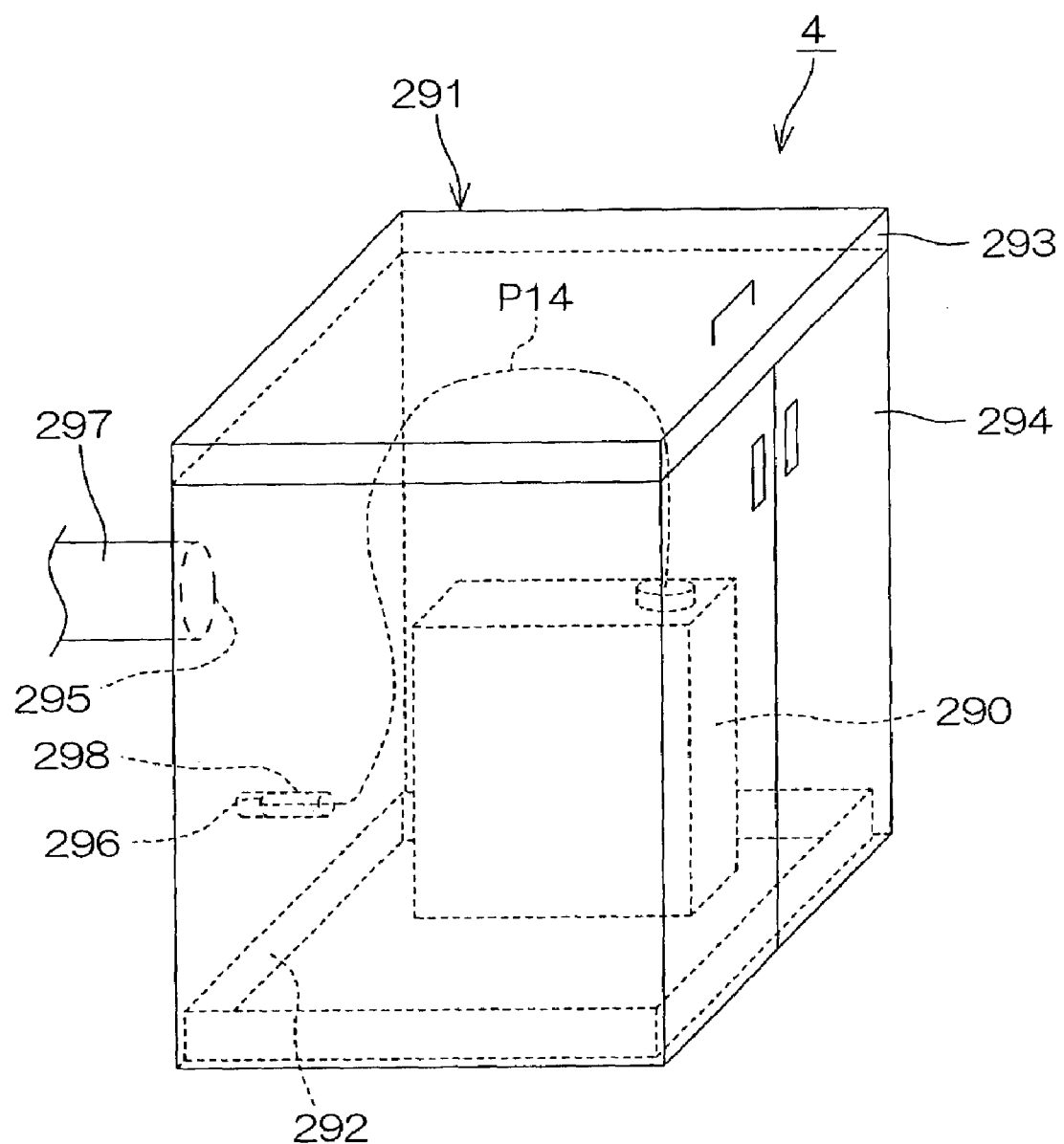
FIG. 28 is a schematic perspective view illustrating the construction of a post-treatment agent supplying section.

Next, an explanation will be given to the construction and function of the post-treatment agent supplying section 4. FIG. 28 is a schematic perspective view illustrating the construction of the post-treatment agent supplying section 4.

The post-treatment agent supplying section 4 includes a post-treatment agent tank 290 which contains the post-treatment agent (e.g., the etching liquid and the cleaning liquid) to be used in the bevel etching units 21a, 21b and the cleaning units 22a, 22b, and a tank enclosure 291 which houses the post-treatment agent tank 290. In this embodiment, only the single post-treatment agent tank 290 is shown, assuming that the same agent is employed as the etching liquid for use in the bevel etching units 21a, 21b and as the cleaning liquid for use in the cleaning units 22a, 22b. Where a plurality of post-treatment agents are used, a plurality of post-treatment agent tanks 290 may be employed.

The tank enclosure 291 has a top cover 293 and a front door 294. By opening the cover 293 or the door 294, the post-treatment agent tank 290 can be taken in and out of the tank enclosure 291. With the cover 293 and the door 294 being closed, the tank enclosure 291 is virtually sealed.

A vat 292 is provided on the bottom of the tank enclosure 291, and the post-treatment agent tank 290 is placed in the vat 292. The volume of the vat 292 is greater than the volume of the post-treatment agent tank 290 (where the plurality of post-treatment agent tanks 290 are provided, the total volume of the post-treatment agent tanks 290). Even if the post-treatment agent is entirely leaked out of the post-treatment agent tank 290, the leaked post-treatment agent can be received in the vat 292.

An air outlet port 295 and a post-treatment agent pipe introduction port 296 are provided in a rear face of the tank enclosure 291. An air outlet pipe 297 is connected to the air outlet port 295 for exhausting air from the tank enclosure 291. By exhausting air through the air outlet pipe 297 with the tank enclosure 291 being virtually sealed, the internal pressure of the tank enclosure 291 can be kept at a negative level.

A short protection pipe 298 is inserted through the post-treatment agent pipe introduction port 296, and the post-treatment agent pipe P14 is inserted through the protection pipe 298. That is, the two pipes are inserted through the post-treatment agent pipe introduction port 296.

The post-treatment agent pipe P14 extends from an inside bottom portion of the post-treatment agent tank 290 to each of the bevel etching units 21a, 21b and the cleaning units 22a, 22b. The valve 93V (see FIG. 23) and the valve 108V (see FIG. 24) provided in the post-treatment agent pipe P14 are disposed in the post-treatment agent supplying section 4 (though not shown in FIG. 28). By actuating a pump not shown with the valve 93V or 108V being open, the post-treatment agent (the etching liquid or the cleaning liquid) can be supplied into the bevel etching units 21a, 21b or the cleaning units 22a, 22b from the post-treatment agent tank 290.

Figure 29:
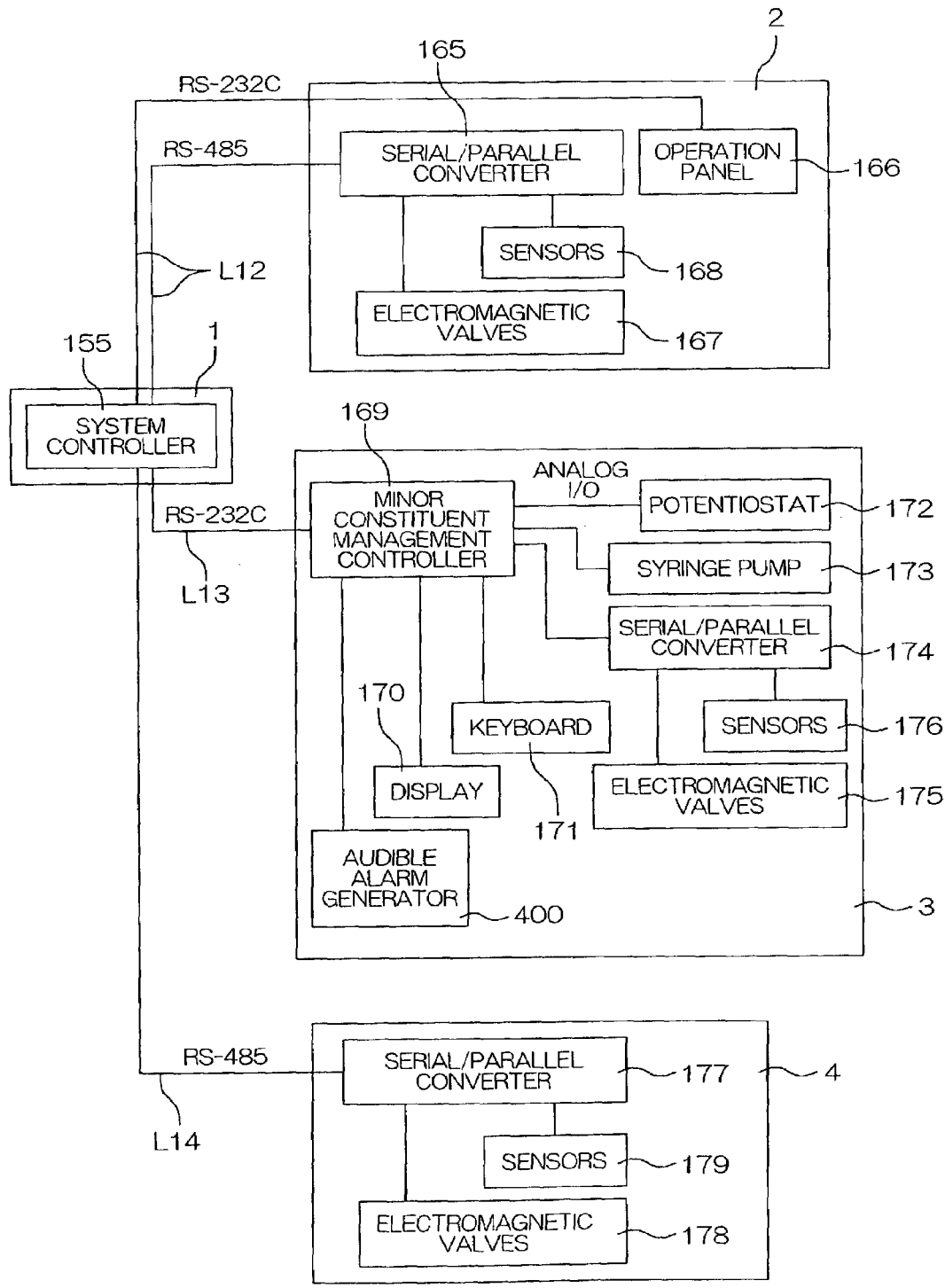
FIG. 29 is a block diagram illustrating the construction of control systems for the major constituent managing section, the minor constituent managing section and the post-treatment agent supplying section.

FIG. 29 is a block diagram illustrating the construction of control systems for the major constituent managing section 2, the minor constituent managing section 3 and the post-treatment agent supplying section 4.

The major constituent managing section 2 includes the serial/parallel converter 165 and an operation panel 166. The system controller 155 provided in the wafer treating section 1 is connected to the serial/parallel converter 165 via the RS-485 compatible serial port by a cable, and connected to the operation panel 166 via the RS-232C compatible serial port by a cable.

Electromagnetic valves 167 and sensors 168 (e.g., the constant volume check sensors 126, 133, the emptiness check sensors 127, 134 and the weight meters 154a, 154b (see FIG. 26)) are connected in parallel to the serial/parallel converter 165. The electromagnetic valves 167 are capable of controlling air valves (e.g., the valve AV1-1 and the like (see FIG. 26)). The operator can input and output information on the major constituent managing section 2 by means of the operation panel 166.

The minor constituent managing section 3 includes the minor constituent management controller 169, so that a control operation can be performed independently of the system controller 155 provided in the wafer treating section 1. The minor constituent management controller 169 is connected to the system controller 155 via the RS-232C compatible serial port by a cable.

A display 170, a keyboard 171, an audible alarm generator 400, the potentiostat (power source) 172, a syringe pump 173 and a serial/parallel converter 174 are connected to the minor constituent management controller 169. The display 170 and the keyboard 171 permit the operator to interact with the minor constituent management controller 169 for inputting and outputting information.

The syringe pump 173 is capable of adding the analytic reagents dropwise to the plating liquid contained in the analyzing cup 336 when the concentrations of the minor constituents of the plating liquid are measured. Further, the syringe pump 173 is capable of quantitatively dispensing replenishment liquids respectively containing the minor constituents in amounts to be added to the plating liquid in the plating section 12.

Electromagnetic valves 175 and sensors 176 (e.g., surface level sensors provided on containers for quantitatively dispensing the reagents and the like) are connected to the serial/parallel converter 174 by parallel cables. The electromagnetic valves 175 are capable of controlling air valves. The serial/parallel converter 174 converts serial signals from the minor constituent management controller 169 into parallel signals, which are in turn outputted to the electromagnetic valves 175 and the like. Further, the serial/parallel converter 174 converts parallel signals from the sensors 176 into serial signals, which are in turn outputted to the minor constituent management controller 169.

The post-treatment agent supplying section 4 includes a serial/parallel converter 177. The system controller 155 provided in the wafer treating section 1 is connected to the serial/parallel converter 177 via the RS-485 compatible serial port by a cable. Electromagnetic valves 178 and sensors 179 are connected to the serial/parallel converter 177 by parallel cables. The electromagnetic valves 178 are capable of controlling air valves (e.g., the valve 93V (see FIG. 23) and the valve 108V (see FIG. 24)). The sensors 179 include a liquid surface sensor attached to the post-treatment agent tank 290, an air exhaustion pressure sensor for measuring an air exhaustion pressure in the air outlet pipe 297, and a leakage detection sensor provided in the vat 292 for detecting leakage of the post-treatment agent and the like.

While the present invention has been described in detail by way of the embodiment thereof, it should be understood that the foregoing disclosure is merely illustrative of the technical principles of the present invention but not limitative of the same. The spirit and scope of the present invention are to be limited only by the appended claims.

This application corresponds to Japanese Patent Application No. 2003-12681 filed with the Japanese Patent Office on Jan. 21, 2003, the disclosure of which is incorporated herein by reference.

What is claimed is:

1. A plating apparatus comprising:
    a plating vessel having a cylindrical side wall for containing a plating liquid;
    a substrate holding mechanism for generally horizontally holding a generally round substrate to be treated;
    a cathode ring provided in the substrate holding mechanism and having substantially the same inner diameter as the plating vessel for sealing a peripheral edge portion of a lower surface of the substrate, the cathode ring having a cathode to be brought into contact with the substrate held by the substrate holding mechanism; and
    a rotative driving mechanism for rotating the substrate held by the substrate holding mechanism together with the cathode ring;

wherein the plating vessel has an upper edge portion complementary in configuration to a portion of the cathode ring opposed to the plating vessel so that the lower surface of the substrate held by the substrate holding mechanism can approach the plating vessel so as to be substantially flush with an upper edge of the plating vessel without interference between the upper edge portion of the plating vessel and the cathode ring; wherein the cathode ring includes a body and an abutment portion for abutting the lower surface of the substrate, the abutment portion being composed of a rigid material and projecting as tapered inwardly from the body of the cathode ring; and the abutment portion has a sealing surface for sealing the peripheral edge portion of the lower surface of the substrate; wherein the substrate holding mechanism further comprises a substrate back side press plate having a projection composed of a soft material, the substrate back side press plate opposing the abutment portion of the cathode ring; and the substrate holding mechanism is constructed to hold a substrate by the sealing surface of the abutment portion and the projection of the substrate back side press plate.

2. A plating apparatus as set forth in claim 1, further comprising a first adjustment mechanism for generally aligning a center axis of the plating vessel with a rotation axis of the cathode ring.

3. A plating apparatus as set forth in claim 1, wherein the upper edge of the plating vessel is present within substantially the same plane,
the apparatus further comprising a second adjustment mechanism for positioning the upper edge of the plating vessel within a generally horizontal plane.

4. A plating apparatus as set forth in claim 1, further comprising a retracting mechanism having a pivot shaft generally horizontally disposed at a lower height than a bottom of the plating vessel and coupled to the substrate holding mechanism, the retracting mechanism being capable of pivoting the substrate holding mechanism about the pivot shaft to move the substrate holding mechanism between an upper position above the plating vessel and a retracted position apart from the upper position.

5. A plating apparatus as set forth in claim 1, further comprising a cathode cleaning liquid supplying mechanism for supplying a cathode cleaning liquid to the cathode of the cathode ring for cleaning the cathode in a plating process.

6. A plating apparatus as set forth in claim 1, wherein said sealing surface is a polished surface.

7. A plating apparatus as set forth in claim 1, wherein said rigid material is selected from the group consisting of rigid vinyl chloride resin, rigid fluororesin, and polyimide resin.

8. A plating apparatus for performing a plating process on a to-be-treated surface of a generally round semiconductor wafer having a plurality of fine holes or grooves formed in the surface thereof and a barrier layer and a seed layer sequentially provided on the surface as covering the holes or grooves, the apparatus comprising:

a cassette stage for receiving thereon a cassette capable of accommodating the semiconductor wafer to be treated, the cassette stage including a cassette guide for limiting a cassette loading position on the cassette stage and a cassette detection sensor for detecting the presence or absence of the cassette at a predetermined position on the cassette stage;

a plurality of plating units each including a cathode ring having a cathode to be brought into contact with the semiconductor wafer and rotatable together with the semiconductor wafer kept in contact with the cathode, and a plating vessel capable of containing a plating liquid and having an anode disposed therein;

a plurality of cleaning units each including a cup having a drain port and adapted to clean the semiconductor wafer therein, a wafer holding member for holding the semiconductor wafer in the cup, a wafer rotating mechanism for rotating the semiconductor wafer held by the wafer holding member, and a cleaning liquid supply nozzle for supplying a cleaning liquid including a post-treatment agent to the surface of the semiconductor wafer held by the wafer holding member, the cup being connected to an air exhaustion mechanism for exhausting air from the cup;

a wafer transport mechanism for transporting the semiconductor wafer subjected to the plating process in any of the plating units to any of the cleaning units, the wafer transport mechanism including an extendible arm capable of generally horizontally holding the semiconductor wafer, a vertical movement mechanism for moving up and down the arm, and a horizontal rotating mechanism for rotating the semiconductor wafer held by the arm within a generally horizontal plane;

a post-treatment agent supplying section including a post-treatment agent tank which contains the post-treatment agent to be used in the cleaning units, a tank enclosure which houses therein the post-treatment agent tank, and a vat for receiving therein the post-treatment agent which leaks out of the post-treatment agent tank, the tank enclosure being connected to an air outlet pipe for exhausting air from the tank enclosure;

a minor constituent analyzing section including an analyzing cup for containing the plating liquid for analyzing a specific minor constituent of the plating liquid to be used in the plating units, and a rotary platinum electrode disposed in the analyzing cup;

an enclosure which houses therein a wafer treating section including the plating units, the cleaning units and the wafer transport mechanism, the enclosure including a barrier wall for isolating the inside thereof from an external environment, a frame which supports the wafer treating section, and a filter provided in an upper portion thereof, the enclosure having a loading/unloading port for loading and unloading the semiconductor wafer or the cassette capable of accommodating the semiconductor wafer, a deionized water pipe introduction port through which a deionized water pipe is introduced into the enclosure, a compressed air pipe introduction port through which a compressed air pipe is introduced into the enclosure, an air outlet opening provided in a bottom of the enclosure for exhausting air from the enclosure, and an air outlet pipe connection port connected to an air outlet pipe for exhausting air from the enclosure, the enclosure being constructed so that air introduced into the enclosure through the filter is exhausted from the enclosure through the air outlet opening and the air outlet pipe connected to the air outlet pipe connection port; and a system controller for controlling the entire plating apparatus, the system controller including a plurality of printed circuit boards, a central processing unit, a storage device having a semiconductor storage medium and a magnetic storage medium and storing therein a plating apparatus control program at least partly described in a high-level language, a serial port, a keyboard having alphabet inputting keys and numeral inputting keys, and a display; wherein the cathode ring includes a body and an abutment portion for abutting the lower surface of the substrate, the abutment portion being composed of a rigid material and projecting as tapered inwardly from the body of the cathode ring; and the abutment portion has a sealing surface for sealing the peripheral edge portion of the lower surface of the substrate; wherein the substrate holding mechanism further comprises a substrate back side press plate having a projection composed of a soft material, the substrate back side press plate opposing the abutment portion of the cathode ring; and the substrate holding mechanism is constructed to hold a substrate by the sealing surface of the abutment portion and the projection of the substrate back side press plate.

9. A plating apparatus as set forth in claim 8, wherein the plating vessel has an upper edge portion complementary in configuration to a portion of the cathode ring opposed to the plating vessel, wherein a lower surface of the to-be-treated semiconductor wafer kept in contact with the cathode can approach the plating vessel to be substantially flush with an upper edge of the plating vessel without interference between the upper edge portion of the plating vessel and the cathode ring.

10. A plating apparatus as set forth in claim 8, further comprising:

a wafer holding mechanism to be disposed above the plating vessel for holding the to-be-treated semiconductor wafer to bring the semiconductor wafer into contact with the plating liquid contained in the plating vessel; and a retracting mechanism having a pivot shaft generally horizontally disposed at a lower height than a bottom of the plating vessel and coupled to the wafer holding mechanism, the retracting mechanism being capable of pivoting the wafer holding mechanism about the pivot shaft to move the wafer holding mechanism between an upper position above the plating vessel and a retracted position apart from the upper position.

11. A plating apparatus as set forth in claim 8, further comprising:

a mesh member of a resin disposed at a higher height than the anode in the plating vessel; and a wafer holding mechanism for holding the to-be-treated semiconductor wafer to locate the semiconductor wafer at a plating position at which the semiconductor wafer is kept in contact with the plating liquid filled in the plating vessel;

wherein a distance between the semiconductor wafer located at the plating position and the mesh member is 0.5 mm to 30 mm.

12. A plating apparatus as set forth in claim 8, further comprising:

a shower head for diffusively introducing the plating liquid into the plating vessel from a plating liquid introduction port provided in a bottom of the plating vessel; and a mesh member of a resin disposed at a higher height than the shower head in the plating vessel;

wherein the anode has a mesh shape and is located at a height between the shower head and the mesh member.

13. A plating apparatus as set forth in claim 8, further comprising a cathode cleaning liquid supplying mechanism for supplying a cathode cleaning liquid to the cathode for cleaning the cathode in the plating process.

14. A plating apparatus as set forth in claim 8, further comprising:

a liquid supplying mechanism for supplying liquid to a restriction region where intrusion of the plating liquid is prevented in the plating apparatus, the restriction region having a liquid inlet and a liquid outlet; and a conductivity meter for measuring an electrical conductivity of the liquid flowing out of the outlet of the restriction region.

15. A plating apparatus as set forth in claim 8, further comprising:

a recovery vessel disposed around the plating vessel for recovering the plating liquid overflowing from the plating vessel; and a cathode cleaning liquid collection vessel disposed around the recovery vessel for collecting a cathode cleaning liquid used for cleaning the cathode kept in contact with the to-be-treated semiconductor wafer in the plating process.

16. A plating apparatus as set forth in claim 8, further comprising:

a plating power source for applying a voltage between the anode and the cathode;

wherein an electrical conduction path between the anode and the plating power source and an electrical conduction path between the cathode and the plating power source are isolated from the ground.

17. A plating apparatus as set forth in claim 8, wherein the plating units each further comprise:

a wafer holding mechanism for holding the to-be-treated semiconductor wafer;

a first rotary shaft having a first electrical conduction line electrically connected to the cathode, and coupled to the wafer holding mechanism;

a rotative driving mechanism for rotating the semiconductor wafer held by the wafer holding mechanism about the first rotary shaft;

a second rotary shaft having a second electrical conduction line;

a rotation force transmission mechanism for transmitting a rotative driving force between the first rotary shaft and the second rotary shaft and establishing an electrical conduction path between the first and second electrical conduction lines; and a rotary connector attached to one end of the second rotary shaft and electrically connected to the second electrical conduction line.

18. A plating apparatus as set forth in claim 8, wherein the plating units each further comprise:

a treatment fluid supplying member having a fluid channel formed therein for supplying a treatment fluid to the to-be-treated wafer; and a rotary joint being disposed in the treatment fluid supplying member, and including a rotor, a stator and a sliding portion defined between the rotor and the stator, the rotary joint having a main channel to constitute a part of the fluid channel and a leak channel branched from the main channel, the sliding portion being disposed in the leak channel.

19. A plating apparatus as set forth in claim 8, wherein the cathode ring comprises:

a first electrically conductive member provided in the cathode ring and electrically connected to a plating power source;

a second electrically conductive member provided in the cathode ring and electrically connected to the cathode; and a third electrically conductive member provided between the first electrically conductive member and the second electrically conductive member, the third electrically conductive member being resilient and kept in resilient contact with the first and second electrically conductive members for electrical connection between the first electrically conductive member and the second electrically conductive member.

20. A plating apparatus as set forth in claim 8, wherein the cathode is adapted to be brought into contact with a peripheral edge portion of the semiconductor wafer, wherein the cathode ring comprises:

a ring-shaped support member which supports the cathode;

an electrically conductive member provided in the support member and establishing an electrical conduction path between the cathode and a plating power source; and a seal member provided between the support member and the electrically conductive member for providing a seal for prevention of intrusion of the plating liquid into the support member.

21. A plating apparatus as set forth in claim 8, wherein the plating units each further comprise a spin base which supports the cathode ring, wherein the cathode ring further comprises a positioning member for fixing the cathode ring in a predetermined position with respect to the spin base.

22. A plating apparatus as set forth in claim 8, wherein the cathode is adapted to be brought into contact with a peripheral edge portion of the semiconductor wafer, wherein the cathode ring further comprises an abutment portion for holding the semiconductor wafer in abutment against the semiconductor wafer, the abutment portion being composed of a rigid material and having a sealing surface for sealing the peripheral edge portion of the semiconductor wafer.

23. A plating apparatus as set forth in claim 8, wherein said sealing surface is a polished surface.

24. A plating apparatus as set forth in claim 8, wherein said rigid material is selected from the group consisting of rigid vinyl chloride resin, rigid fluororesin, and polyimide resin.

* * * * *